(12) United States Patent
Iskander et al.

(10) Patent No.: US 9,898,566 B2
(45) Date of Patent: Feb. 20, 2018

(54) METHOD FOR AUTOMATED ASSISTANCE TO DESIGN NONLINEAR ANALOG CIRCUIT WITH TRANSIENT SOLVER

(71) Applicants: UNIVERSITE PIERRE ET MARIE CURIE (PARIS 6), Paris (FR); CENTRE NATIONAL DE LA RECHERCHE SCIENTIFIQUE, Paris (FR)

(72) Inventors: Ramy Iskander, Paris (FR); Marie-Minerve Louerat, Paris (FR); Andreas Kaiser, Villeneuve d'ascq (FR); Farakh Javid, Levallois-perret (FR)

(73) Assignees: UNIVERSITE PIERRE ET MARIE CURIE (PARIS 6), Paris (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 30 days.

(21) Appl. No.: 14/410,308

(22) PCT Filed: Jun. 24, 2013

(86) PCT No.: PCT/EP2013/063169
§ 371 (c)(1),
(2) Date: Dec. 22, 2014

(87) PCT Pub. No.: WO2013/190147
PCT Pub. Date: Dec. 27, 2013

(65) Prior Publication Data
US 2016/0171136 A1  Jun. 16, 2016

Related U.S. Application Data

(60) Provisional application No. 61/663,012, filed on Jun. 22, 2012.

(30) Foreign Application Priority Data

Jun. 22, 2012 (EP) .................................... 12305726

(51) Int. Cl.
*G06F 17/50* (2006.01)

(52) U.S. Cl.
CPC ...... *G06F 17/5036* (2013.01); *G06F 17/5063* (2013.01)

(58) Field of Classification Search
CPC .................. G06F 17/5036; G06F 17/5063
See application file for complete search history.

(56) References Cited

U.S. PATENT DOCUMENTS

| 7,516,423 B2 | 4/2009 | DeSmedt et al. |
| 2003/0009729 A1 | 1/2003 | Phelps et al. |
| 2008/0134109 A1* | 6/2008 | Hammouda ........ G06F 17/5063 716/113 |

OTHER PUBLICATIONS

Farakh Javid et al., "Simulation-Based Hierarchical Sizing and Biasing of Analog Firm IPs", IEEE, Sep. 17, 2009, pp. 43-48.

(Continued)

*Primary Examiner* — Vuthe Siek
(74) *Attorney, Agent, or Firm* — Greer, Burns & Crain, Ltd.

(57) ABSTRACT

A method is provided for providing an automated assistance to design an analog non linear circuit under transient conditions, and to a corresponding system. The method enables the circuit designer to consider with simulation the time reactive effects of generally nonlinear components, while keeping the significant and intuitive qualities of an analysis view design tool like the CAIRO+/CHAMS environment. The method includes at least a transient instant solving procedure producing a numerical simulation that uses a given set of sizes and biases to provide a set of local behavior parameters in at least one node at current time. This (Continued)

transient instant solving procedure includes an incremental iteration under transient conditions of an evaluation in an analysis view of a dependency graph of the functional structure of the circuit. An optional transient analysis performs a numerical simulation to provide a time dependent behavior simulation of the circuit, and a performance evaluation.

11 Claims, 17 Drawing Sheets

(56) References Cited

OTHER PUBLICATIONS

Ramy Iskander et al, "Knowledge-Aware Synthesis Using Hierarchical Graph-Based Sizing and Biasing", IEEE, Aug. 5, 2007, pp. 984-987.

Ramy Iskander, "Automatic DC Operating Point Computation and Design Plan Generation for Analog IPs", Analog Integr. Circ. Sig. Process, 2008, vol. 56, No. 1-2, pp. 93-105.

Farakh Javid et al., "Analog Circuits Sizing Using Bipartite Graphs", IEEE, Aug. 7, 2011, pp. 1-4.

Ramesh Harjani et al.,"OASYS: A Framework for Analog Circuit Synthesis", IEEE Transactions on Computer-Aided Design, vol. 8, No. 12, Dec. 1989, pp. 1247-1266.

Michael J. Krasnicki et al., "ASF: A Practical Simulation-Based Methodology for the Synthesis of Custom Analog Circuits", IEEE, 2001, pp. 350-357.

Michael Krasnicki, "MAELSTROM: Efficient Simulation-Based Synthesis for Custom Analog Cells", Jun. 1999, pp. 945-950.

Ramy Iskander, "Knowledge-aware Synthesis for Analog Integrated Circuit Design and Reuse" thesis, Jan. 2008.

European Search Report from European Application No. EP 12 30 5726, dated Oct. 29, 2012.

International Search Report from PCT/EP2013/063169, dated Aug. 26, 2013.

\* cited by examiner

Dependency Graph of the operator OPVGD(VEG), e.g. for transistor M3

Device Dependency Graph of the simple current mirror CM

Design View dependency graph for simple OTA circuit

Graph Generation

Fig.9 - Solver diagram

Analysis view graph

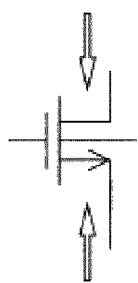

Fig.11 (a) NBND
Not Bulk-Source Connected
Not Diode-Connected

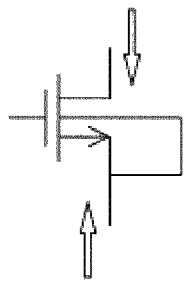

Fig.11 (b) BND
Bulk-Source Connected
Not Diode-Connected

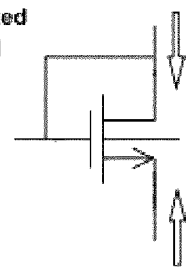

Fig.11 (c) NBD
Not Bulk-Source Connected
Diode-Connected

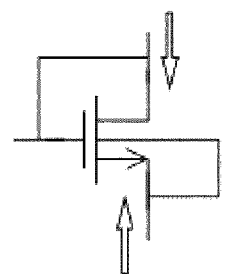

Fig.11 (d) BD
Bulk-Source Connected
Diode-Connected

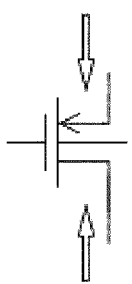

Fig.12 (a) NBND
Not Bulk-Source Connected
Not Diode-Connected

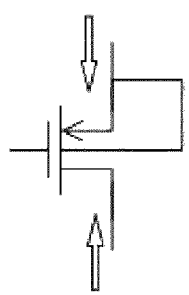

Fig.12 (b) BND
Bulk-Source Connected
Not Diode-Connected

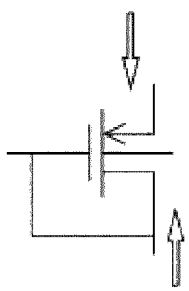

Fig.12 (c) NBD
Not Bulk-Source Connected
Diode-Connected

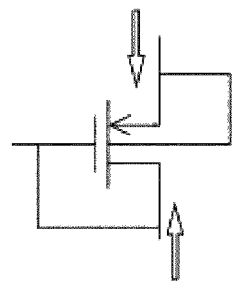

Fig.12 (d) BD
Bulk-Source Connected
Diode-Connected

Operator : OPI (NBND)

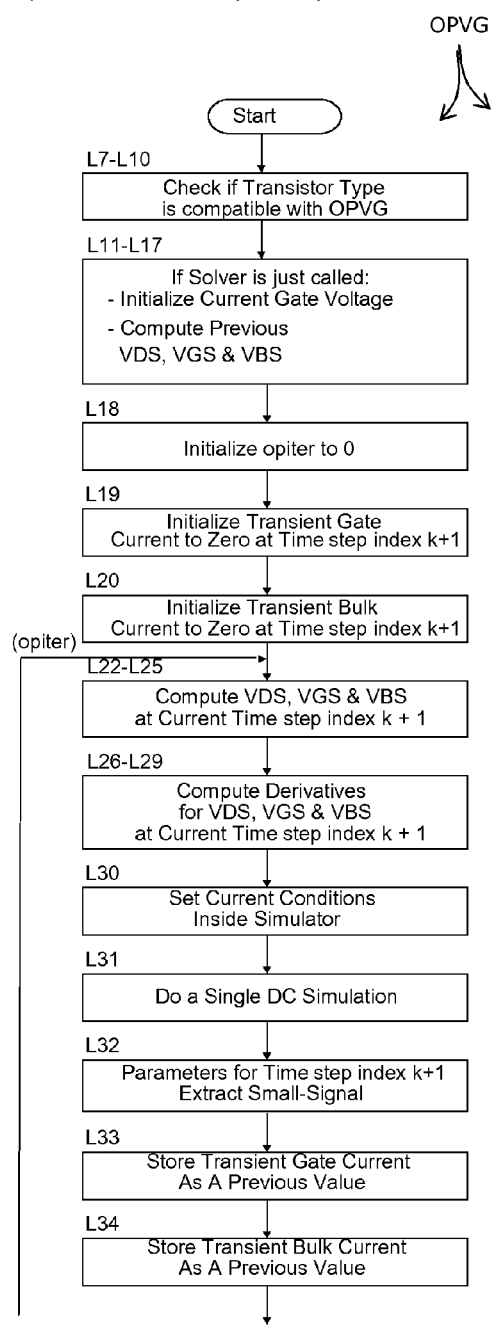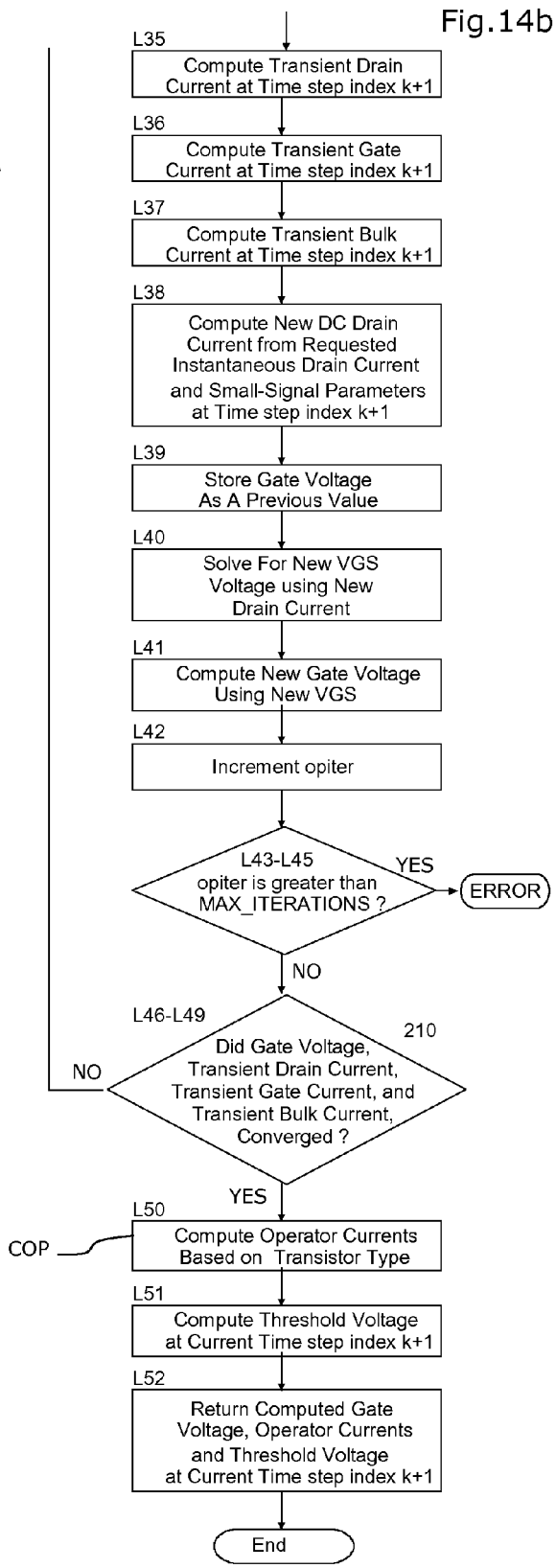
Fig.14a
Fig.14b

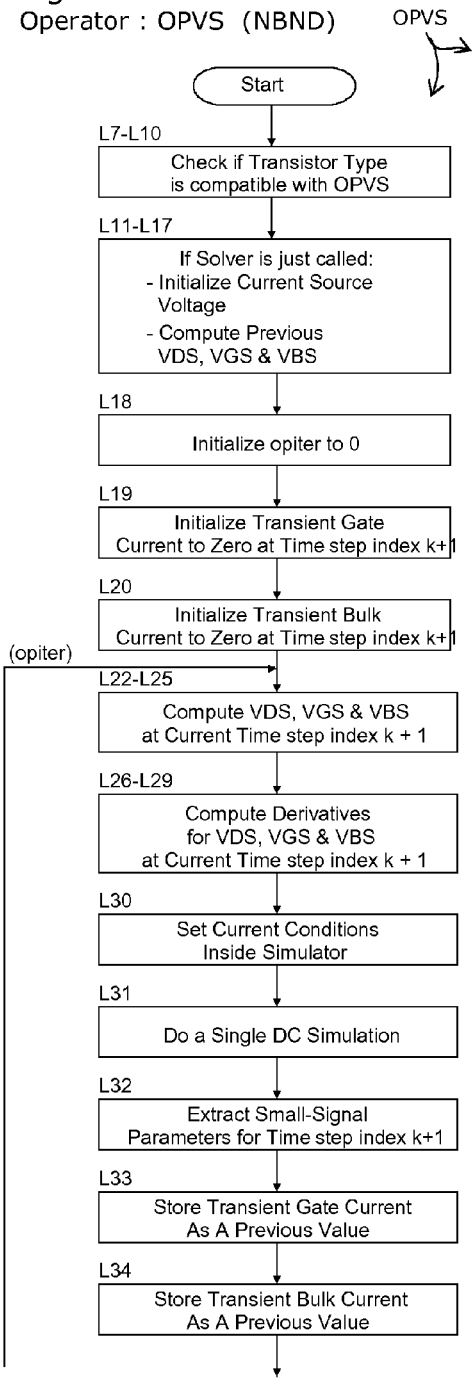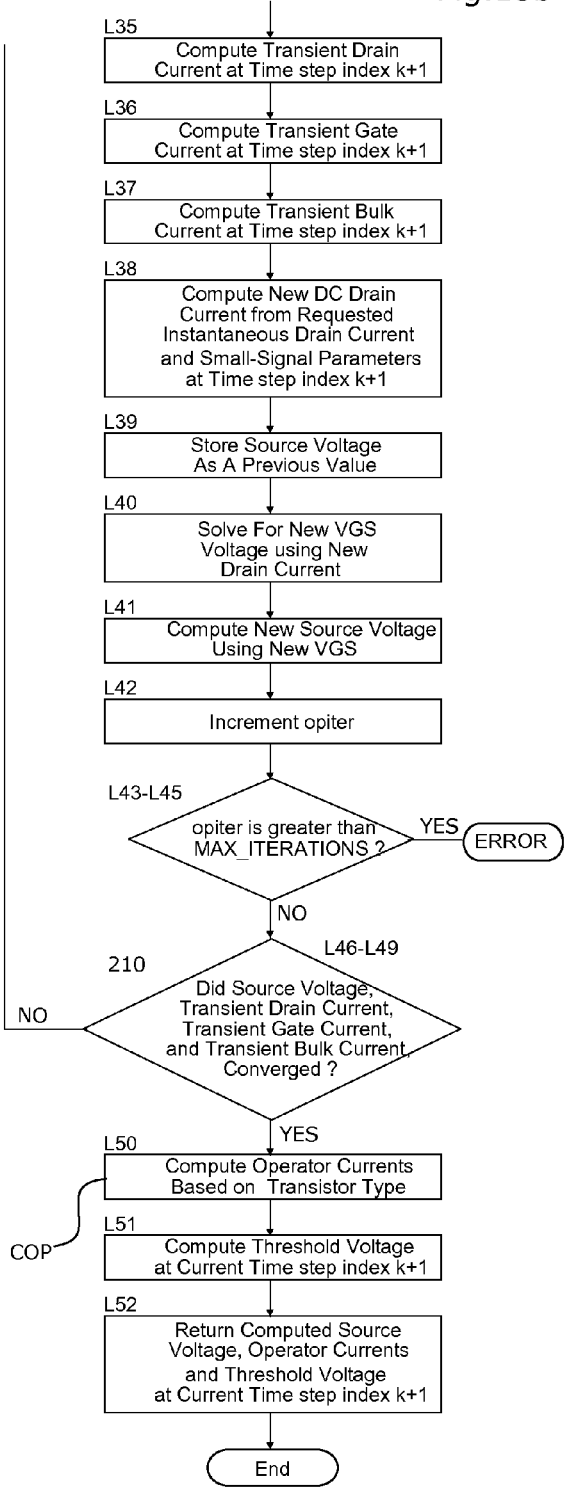

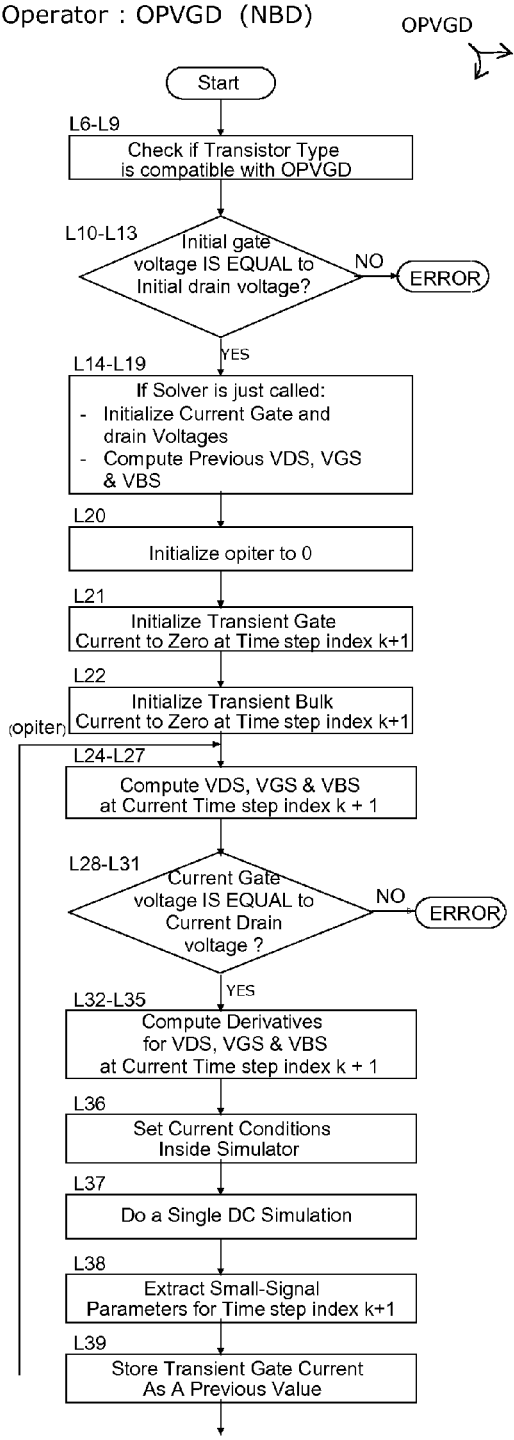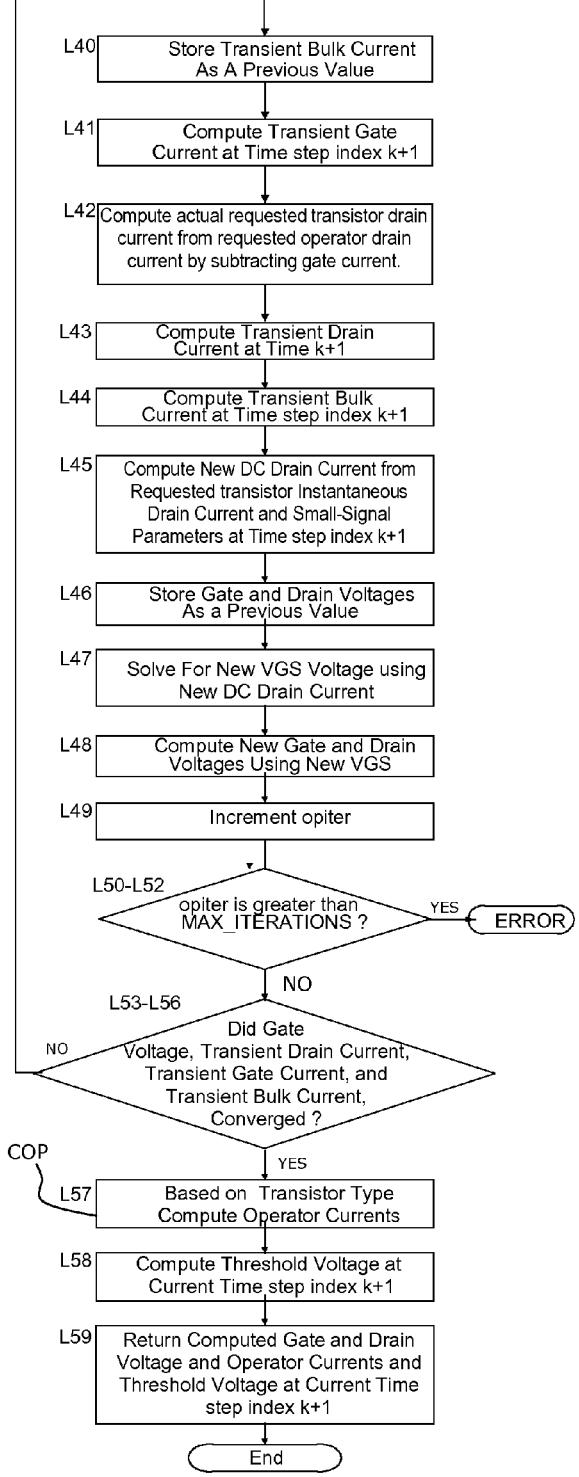
Fig.16a
Fig.16b

Fig. 17
Stimulus for the simple OTA amplifier.
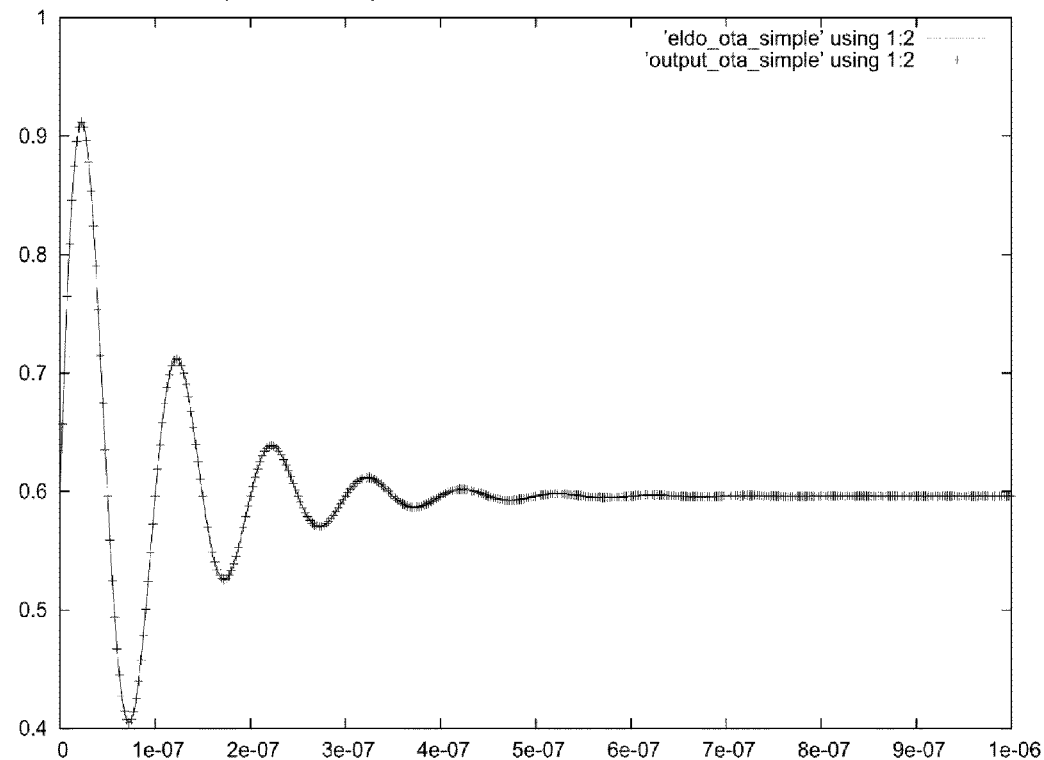
Fig. 18 Computed terminal voltage VG/D,M3 compared to simulation
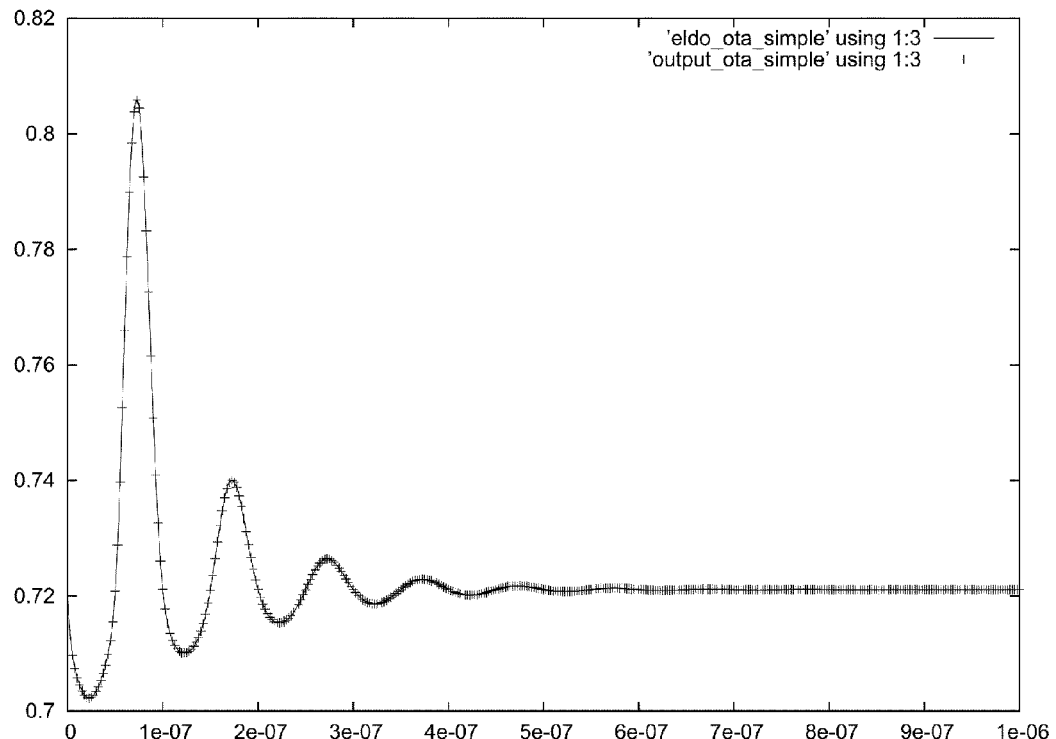

Fig. 19
Computed terminal voltage VOUT compared to simulation
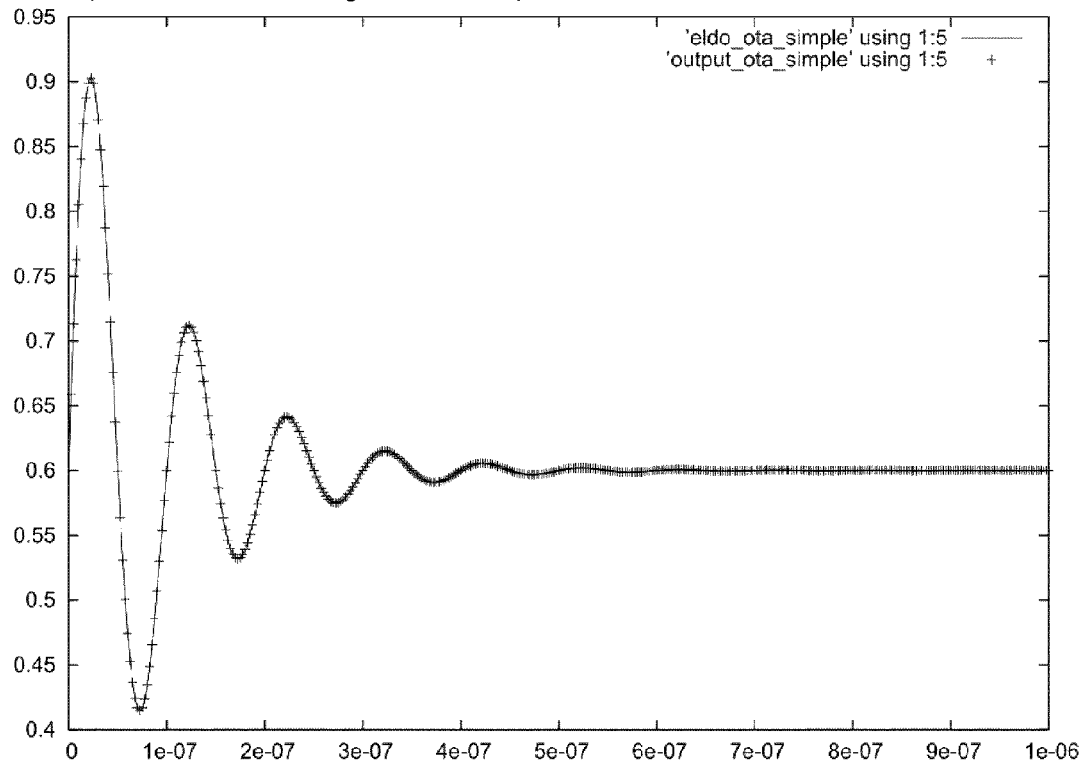
Fig. 20 Computed terminal voltage VS,M1 compared to simulation
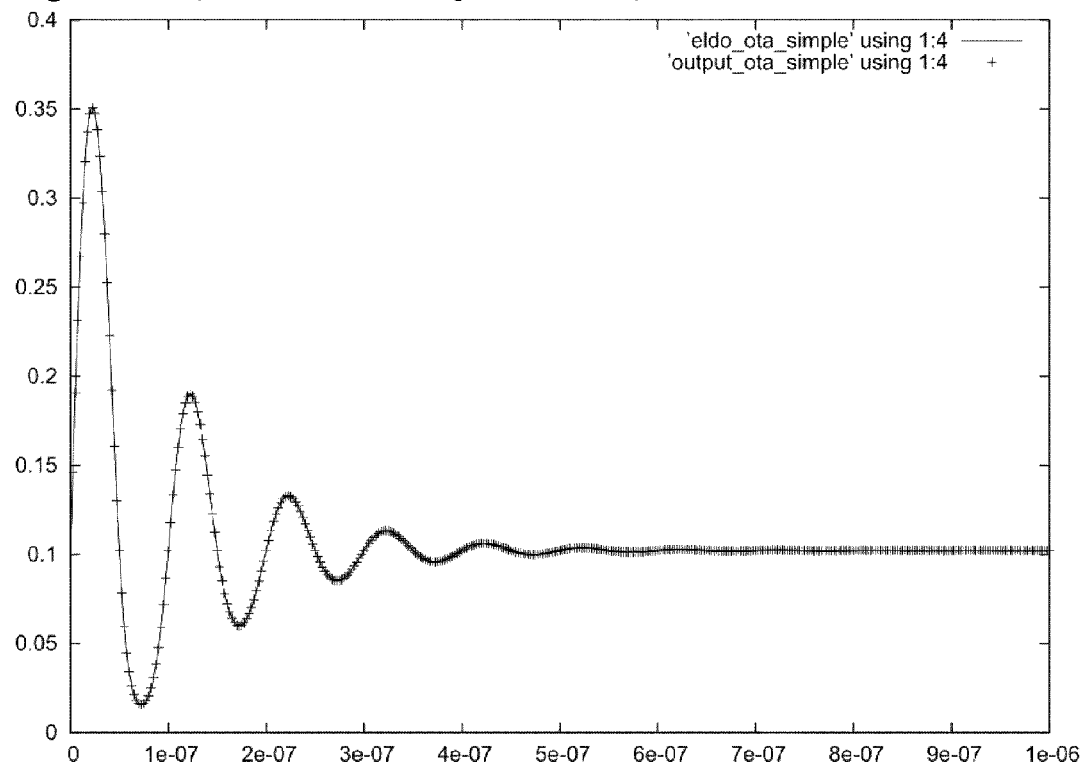

Fig. 21
Computed Drain Current ID,M1 compared to simulation
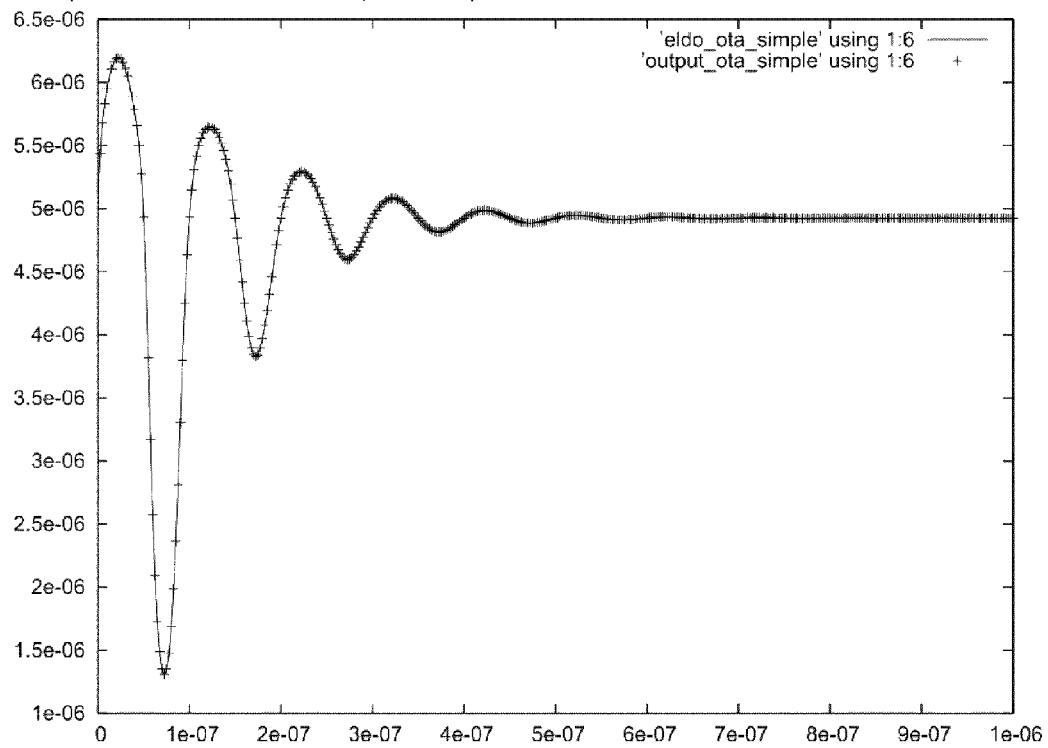
Fig. 22 Computed Gate Current IG,M1 compared to simulation
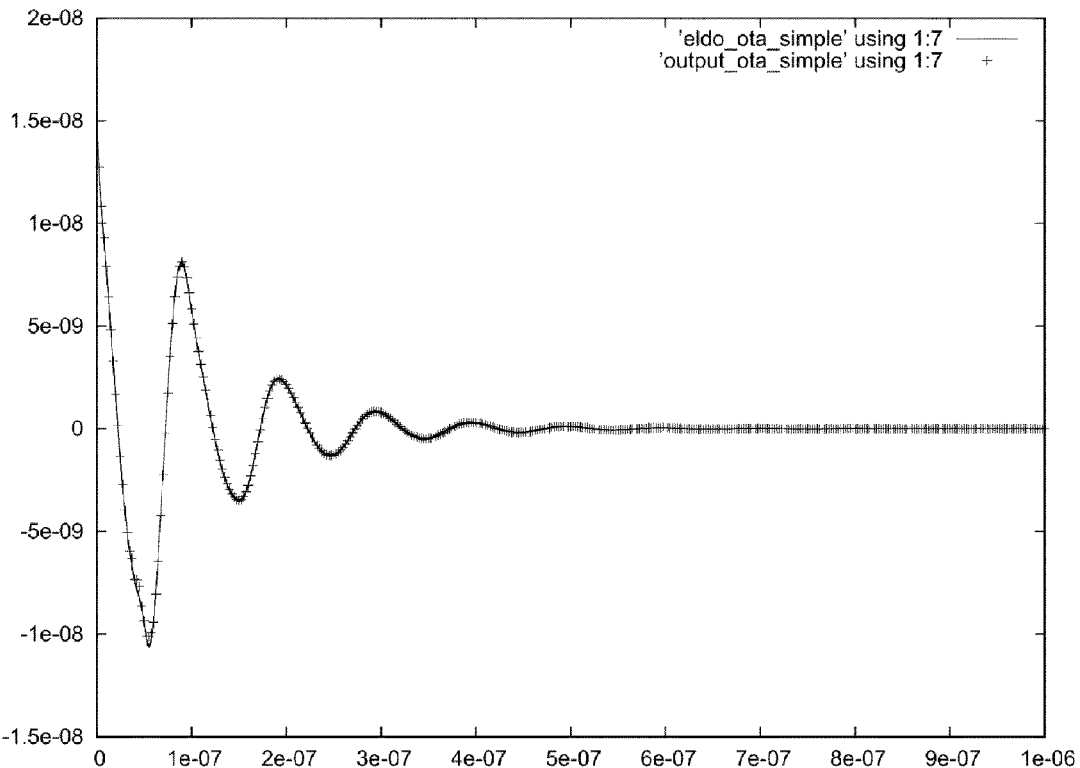

Computed Source Current IS,M1 compared to simulation

METHOD FOR AUTOMATED ASSISTANCE TO DESIGN NONLINEAR ANALOG CIRCUIT WITH TRANSIENT SOLVER

INTRODUCTION

The present invention relates to a method for providing an automated assistance to design and/or simulate an analog non linear circuit under transient conditions, and to a system implementing such a method.

With this method, the invention enables the circuit designer with more precise and/or relevant result in optimizing and designing analog circuits, for example when it comes to large/quick signal circuits and/or with unstable or long duration variations. It becomes possible to take into account with simulation the time reactive effects of generally nonlinear components, such as capacitors, inductors, diodes, MOS transistors, or other heavily time dependent circuits, while keeping the significant and intuitive qualities of an analysis view already implemented in CAIRO+/CHAMS environment, though currently only for Direct Current solving.

Said method comprises at least a transient instant solving procedure producing a numerical simulation that uses a given set of sizes and biases for at least one transistor of said circuit to provide a set of local behavior parameters in at least one node of said circuit, at the current time.

According to the invention, said transient instant solving procedure comprises an incremental iteration of executing an evaluation, called analysis view under transient conditions, in a mode of "analysis view" of a dependency graph representing the functional structure of said circuit. Said transient analysis view graph evaluation comprises applying a set of Newton Raphson Constraints to a sequential evaluation of a set of data, called rule data, that comprises:
  on the first hand, dependencies between variables representing electrical properties of node(s) or physical properties of transistor(s) of said circuit, and
  on the other hand mathematical operators, called temporal operators, that rule said dependencies when the circuit is working under transient conditions, through executing an inversion of a transistor functional model so as to provide a set of local behavior parameters in node(s) of said circuit.

Furtherly, said method may comprise a transient analysis performing a numerical simulation to provide a time dependent behavior simulation of said circuit, and optionally a time dependent performance evaluation. Such a transient analysis comprises an incremental iteration of such a transient instant solving procedure for node(s) of said circuit, over a given time duration and for a given stimuli profile. Moreover, said method may comprise a circuit transient solver providing in an automated way a given set of sizes and biases for at least one transistor of said circuit, together with a time dependent performance evaluation for at least one node of said circuit over a given time duration and for a given stimuli profile. Such a circuit transient solver comprises executing such a transient analysis after a previous operation of executing a direct current solver. This direct current solver comprises an evaluation of the dependency graph, under direct current condition, firstly in a design view and secondly in an analysis view with applying a set of Newton Raphson Constraints, using DC operators.

Also, said method may provide a transient circuit optimizer over a given time duration and for a given stimuli profile, through using a set of requested performance parameters to provide in an automated way an optimized set of design parameters and sizes and biases parameters for at least one transistor of said circuit.

BACKGROUND

The semiconductor industry is continuously making improvements in the achievable density of very large-scale integrated (VLSI) circuits. In order to benefit of these available levels of integration, design methodologies and techniques continue to manage the increased complexity inherent in such large chips. One such emerging methodology is system-on-chip (SoC) design, wherein predesigned and preverified blocks, often called intellectual property blocks or "IPs" are combined on a single chip. A library of reusable IP blocks with various timing, area and power configuration is a key to success of SoC integration success, as the SoC integrator can apply the trade-offs that best match the needs of the target application.

Digital design is implemented using a well-defined top-down design methodology, implemented into various computerized methods for automation of implementing and integrating numerous digital IP blocks into a large scale integrated circuit.

However, analog/mixed-signal (AMS) traditionally tends to follow an ad hoc custom design process, with few or no possibilities of reusing existing IP blocks. Also, when analog and digital blocks coexist on the same substrate, the analog portion can be more time-consuming to develop even though it may represent a smaller percentage of the chip area.

As a matter of fact, nonlinear unitary devices are very complex to model when used in an analog context, as their behavior is directly and immediately impacted by their unitary dimensions, such as the width (W) or length (L) of the physical transistors.

Until recently, capitalization of knowledge in analog circuits has been mainly limited to libraries of netlists, which describe structure rather than behavior.

Knowledge capitalization has been introduced in some tools through hard-coding of sizing and biasing plans for operating point computation, such as in OASYS, described by Harjani et al. in "OASYS: A framework for analog circuit synthesis. IEEE Trans. Computer-Aided Design, 8(12): 1247-1266, December 1989". However, such capitalization stands mainly on the human designer know-how and is deemed both a fastidious and very long work, while insufficiently efficient for automation.

As computer-based SPICE-like simulators became available for predicting the behavior of a given sized unitary device, computerized optimizers were designed around 1980. Based on a given netlist, such an optimizer essentially run through successive simulations of the behavior of a circuit for different sets of dimensions. Convergence is achieved by a step-by-step variation of unitary dimensions, while evaluating cost or performance functions to reach an "optimized" solution. Such technology is used in the MAELSTROM software, described in Krasnicki et al.: "MAELSTROM: Efficient simulation-based synthesis for custom analog cells. Proc. Design Automation Conf., pages 945-950, June 1999>>.

Document U.S. Pat. No. 7,516,423 to De Smedt, entitled "Method and apparatus for designing electronic circuits using optimization", also proposes a design method based on formulating an optimization problem and using an evolutionary process to produce a solution. This document proposes to define an optimization problem comprising: design objectives, constraint rules, and constraint handling mechanisms. The proposed optimization process comprises: providing at least one set of candidate solutions; evaluating said objective for said set; and selecting at least one subset from said set based at least in part on said act of evaluating. This problem is proposed to be optimized using an "evolutionary" process to produce a solution. This evaluating process is proposed as an "evolutionary" optimization process.

United States Patent Application Publication No. 2003/0009729 to Rodney Phelps et al., published Jan. 18, 2002 and entitled "Method for Automatically Sizing and Biasing Circuits", and similarly "ASF: A Practical Simulation-Based Methodology for the Synthesis of Custom Analog Circuits", M. Krasnicki et al., Proceedings of the International Conference on Computer-Aided Design, pp. 350-357, November 2001, describe a framework used to size a circuit topology towards a given set of performance specifications. Performances are evaluated based on circuit simulations. Solutions from previous optimization sessions are stored in a database. Information stored in this database steers the optimization engine in finding a solution to the design problem in a reduced amount of time. The way previous or intermediate solutions are stored in this database does not guarantee, however, that this set of candidate solutions covers a relevant portion of the performance space. Hybrid optimization techniques are applied where advanced "simulated annealing" techniques are combined with "hill-climbing" techniques. The optimization algorithm itself is not able to construct knowledge of the search space based on its only experience.

However, as a difference with the digital context, design parameter ranges, especially for sizes, are very large and have a direct impact on analog behavior of every unitary device, even for a very small circuit. As an example, a circuit of five transistors, if evaluated for 10 000 steps of one dimension, will give over $10^{20}$ possible dimensions to be simulated, many of which are technically not realistic nor interesting, which makes optimizing larger scale circuits very difficult if not impossible.

Optimizing thus need to make human heuristic hypothesis, that may easily lead to missing many interesting solutions.

Direct Current Solver

Present inventors have built a conceptual design method that links the system level down to the technology level into a design abstraction model, and is implemented as an automated circuit design method. This design method is more precisely detailed in the phD thesis of M. R. Iskander, presented on Jul. 2 2008 in Paris, "Knowledge-aware synthesis for analog integrated circuit design and reuse", which is hereby included by reference.

As illustrated in FIG. 1, an analog circuit may be represented as a hierarchy of one or several modules levels, in which each level of hierarchy is only linked with its respective direct parent level and direct child level. Within this hierarchy, the lowest levels include "elementary devices", each being made of one or several transistors.

Throughout the hierarchy of a circuit, functional design parameters are used from the circuit level, and propagated through each level down to the transistor level.

At transistor level, the design method then implements a sizing and biasing method: with a given value fixed by the designer or computed from the parent level for some electrical and/or dimensional parameters of the transistor, remaining parameters are computed through memorized mathematical operators. As an example, an operator called OPVS($V_{eg}$, $V_B$), is noted: "Temp, $I_D$, L, $V_{eg}$, $V_D$, $V_G$, $V_B \Rightarrow (V_S, V_{th}, W)$";
uses parameters: temperature (Temp), drain current ($I_D$), length (L), overdrive gate voltage ($V_{eg}$), drain voltage ($V_D$), gate voltage ($V_G$) and bulk voltage ($V_B$); and
provides parameters: source voltage ($V_S$), threshold voltage ($V_{th}$), and width (W).

These operators are typically obtained through inversion of a functional model existing for this specific transistor in the concerned technology, such as inverting the BSIM3v3, BSIM4, PSP or EKV model equations. Successive iterations of such computing may then be brought into a convergence to provide a numerical solution for transistor level, typically using Newton Raphson resolution algorithm.

This circuit design method uses a dependency graph system for linking together the different variables of a module of any level to other variables of other modules as well as device parameters (e.g. dimensions and biasing voltages of the physical transistor) and design parameters (e.g. current and overdrive gate voltage and length in chosen points) for the designed circuit.

In FIG. 2 is illustrated an example of a CMOS circuit for a simple OTA amplifier which includes three elementary devices (encircled in dashed lines), namely: a current mirror CM with two transistors M3 and M4, a differential pair DP with two transistors M1 and M2, and one single transistor M5 that is seen as an elementary device in itself.

At transistor level, the dependency graph links together external imposed electrical parameters (e.g. current and overdrive gate voltage and length in chosen points) together with internal parameters (including dimensions and biasing voltages of the physical transistor). Such a graph is illustrated in FIG. 3 applied to the parameters of transistor M3.

In this graph system, variables are seen as circle nodes that are linked with another set of rectangle nodes called operators, forming a bipartite graph representation having two disjoints sets of nodes: circle nodes for variables and rectangle nodes for operators. The bipartite graph represent the structural dependencies between variables and operators. A variable, such as overdrive gate voltage $V_{eg}$ of transistor M3, is linked as an input parameter to the operator OPVGD (Veg). Five input arcs are incident to the operator OPVGD (Veg) and four output arcs come from the operator. The mathematical operator OPVGD(Veg) is represented by the rectangle node and is connected to the input and output arcs that are themselves connected to the related input and output variables.

Dependency graphs of more complex devices including several transistors are built similarly, such as the current mirror CM, as illustrated in FIG. 4. In this graph, it is assumed that transistor M4 is chosen with dimensional proportions identical to transistor M3, and the "x1" rectangle node means that a scale factor of "1" is chosen between M3 and M4 dimensions (here for width "W").

As illustrated in FIG. 5 for the simple OTA amplifier, a design view of a circuit may thus be built as a global dependency graph through a bottom-up approach across the hierarchy of this circuit, together with various constraints or technical choices (first input row) fixed by the designer.

This design method includes an input and memorization of different modules, including their dependency graphs and operators. Memorized graphs for known modules are coded or may be generated, and are then stored in a programming language, for example as a "generator" within the CAIRO+/CHAMS design environment. Such stored modules, be it elementary devices as well as intermediate or circuit level modules, may then be individually tested, evaluated and corrected, so as to be furtherly reused as "analog IP blocks".

For any kind of stored module, be an elementary device or a more complex circuit, its associated dependency graph may then be retrieved and automatically compiled and top-down browsed with respect of the defined hierarchy (similarly to FIG. 1), so as to start from initial designer choices and provide final transistor level data, such as dimensions (typically width W and length L) and electrical local data (e.g. terminal voltages such as $V_G$ or $V_S$ or $V_{G/D}$).

As illustrated in FIG. 6, this sizing and biasing operation is included as an automated design step between a vector V1 of external and functional parameters (i.e. circuit parameters) and a vector V2 of internal parameters (i.e. biases and sizes parameters). This step comprises a computer automation evaluating the Design View graph (of FIG. 5) of the circuit, to mathematically derive the sizes and biases parameters V2 from the design parameters V1. This step somehow enables to use equations that are structured according to the parameters that are actually meaningful to the designer.

This vector V2 is then fed to a simulator using a transistor model, to provide a vector V3 representing the local behavior of the transistor around its operating point (including small signals parameters such as Transconductance $g_m$, Output Conductance $g_{ds}$, etc.). This vector V3 is then used to evaluate the functional results (i.e. performances) in a set of performance data V4.

This design method thus enables to introduce such sizes and biases (vector V2) within an optimization loop L2 based on the evaluated performances together with cost function parameters fixed by the designer.

Furthly, this method also enables to introduce selection of design parameters V1 within an optimization loop L1. An important automation gap existing in the previous design tools is thus filled through use of the Design View graph evaluating, thus enabling the circuit designer to input directly his functional parameters V1 into the design tool, under a form greatly more significant and more intuitive for him. The design tool thus enables him obtain more value from his technical experience and know-how in much shorter design time.

Once implemented within a computerized design environment tool, currently as a CAIRO+/CHAMS library of generators, this method provides a library of reusable software components which may correspond to an IP block.

As illustrated in FIG. 7, such a circuit generator receives as input data the electrical and physical parameters of the manufacturing process, as well as specification values. It provides as output data a dimensioned netlist, a performance list, and the drawings of the related layout masks. Dependency graph of a new circuit which is constituted with several known analog IP blocks may also be automatically computed by retrieving dependency graphs of these blocks and combining them into a new global graph, thus building a new generator for the new circuit.

Limits of Direct Current Analysis

Currently, this design method enables only to use the static behavior of components in order to optimize the sizing and biasing. Only direct current behavior is taken into account: signals are only seen as small signals around a Direct Current Operating Point.

Thus, in many practical electronic circuits, such as in most of the prior art Direct Current Operating Point methods, a constant steady state resulting from DC excitations or having a very small variations around a DC operating point are the most commonly used simulation mode.

Optimizing and designing of analog circuits may thus give a less precise or relevant result, for example when it comes to large/quick signal circuits and/or with unstable or long duration variations.

When the designed system performance relies on instantaneous signal variations, simulation is usually implemented with impressing a reference signal as a static state by the energy sources. This reference signal is then used to provide a background for the time-varying signals.

In the case of small-signal Alternating Current operation, signals vary slightly in the vicinity of the bias.

Therefore, if small incremental signals are considered, the behavior of the nonlinear circuit depends not only on its topology and the character of the branches but also on the bias impressed. Thus, the design process for analog integrated circuits starts with the D.C. analysis and verification of the D.C. signals.

Similarly, systems operating with slow time-varying signals of a large dynamic range covering a wide range of nonlinear characteristics of the system elements, require a sequence of D.C. simulations with an excitation changing gradually. Such methods, called D.C. sweep or multipoint D.C. analysis, examine the dependence of responses on the excitations, assuming that the latter vary slowly enough to neglect reactive effects. Such an analysis is useful for analog and digital circuits with slow time-varying signals.

However, when the reactive effects of generally nonlinear components such as capacitors, inductors, diodes, MOS transistors, etc. are taken into account with simulation time, direct current solvers become insufficient, even in a multipoint sequence.

Therefore, there is a need for nonlinear analysis that could also provide a precise and relevant analysis and simulation of the behavior of an analog circuit which is operating under transient conditions, and possibly an automated optimization under such transient conditions.

An object of the present invention is to improve the performance, precision and applicability of the current tools, and especially to enable a more efficient, precise and relevant analysis, simulation and optimization for nonlinear transient configurations, within such a design assistance method.

SUMMARY

Accordingly, the present invention proposes to use a computer implemented method which provides a structured sequential transient analysis as recited in the present claims.

It also proposes a computer media recorded with a set of instructions designed for implementing such a method; or a computerized system programmed for executing a program implementing such a method.

The present invention proposes a new computerized method for implementing an automatized nonlinear transient analysis, using temporal operators such as proposed hereafter.

This new method comprises solving for nonlinear transient behavior in a structured sequential resolution approach (i.e. sequence of temporal operators), rather than simultaneous resolution of all nonlinear circuit equations.

The concept of temporal operators, i.e. which takes time into consideration, is newly introduced to solve for each transistor behavior at each time step. The behavior of the whole circuit at each time step is calculated by calling one temporal operator for each transistor enumerated in a sequence depending on the circuit topology. The sequence of temporal operators constitutes the temporal analysis view of the analog circuit.

In addition to the structured temporal analysis view, Newton-Raphson constraints are applied to the temporal analysis view and solved simultaneously to ensure Kirchhoff's Current Laws and Kirchhoff's Voltage Laws at relevant nodes only.

This method may be implemented within a software environment, possibly as a stand alone software or as an add-in component for an existing design tool such as the CAIRO+/CHAMS environment.

With this method, the invention enables the circuit designer with more precise and/or relevant result in optimizing and designing of analog circuits, for example when it comes to large/quick signal circuits and/or with unstable or long duration variations.

It becomes possible to take into account with simulation the time reactive effects of generally nonlinear components, such as capacitors, inductors, diodes, MOS transistors, etc.

The invention thus enables to improve the performance, precision and applicability of the current tools, and especially to enable a more efficient, precise and relevant analysis, simulation and optimization for nonlinear transient configurations, even for such heavily time dependent circuits, while keeping the significant and intuitive qualities of an analysis view such as described hereabove in relation with the CAIRO+/CHAMS environment.

Global Structure

The method according to the invention comprises a procedure, called "transient instant solving procedure", which includes iterations of evaluating an analysis view of the circuit through using temporal operators, i.e. operators that take time into consideration.

According to the invention, invention may comprise a process, called "transient analysis", which includes time step iterations of said "transient instant solving procedure" and uses a given profile of time related stimuli applied to the input ports of the circuit.

Furthermore, invention may also comprise a process, called "transient solver", which includes said "transient analysis" according to the invention and uses a direct current solver, possibly such as detailed in document Iskander-Thesis 2008.

The computerized method of the invention may thus provide an automated assistance to design an analog non linear circuit relatively to its behavior under transient conditions, i.e. by taking into account its behavior in conditions where electrical parameter change quickly, and possibly in a non linear manner.

In the present summary of the invention, numerical references are used for better clarity, that are related to the exemplary embodiment illustrated in the drawings, as detailed here after. However, these numerical reference do not mean that the scope of the claimed invention should be restricted to said embodiment.

Transient Instant Solving Procedure

According to the invention, such method comprises at least one operation of digital processing performing a procedure, called "transient instant solving procedure", producing a numerical simulation at the current time, that uses a given set of sizes and bias for at least one transistor of said circuit. This transient instant solving procedure then provides a set of local behavior parameters for at least one node of said circuit at the current time.

Local behavior parameters is here to be interpreted as pertaining to the value and evolution of electrical parameters that exists around or at the simulated node or transistor.

Furthermore, said transient instant solving procedure comprises a plurality of iterations unto a positive result from a convergence test, while a tracking variable (215) for TR solving is incremented. Each of these iterations comprises a step of executing an evaluation of an analysis view graph of the circuit, by taking into account the fact that the circuit is working under transient condition, this step being here called "transient analysis view graph evaluation".

Thus, said transient instant solving procedure performs a transient simulation at current time by using a "transient analysis view", i.e. "analysis view under transient conditions". This transient simulation at said current time may then be used as an initial condition for simulating a further time-step.

Said analysis view graph is a dependency graph system that links together the different variables as well as device parameters and design parameters for said circuit. Such analysis view graph may be created and defined as previously known, possibly such as detailed in document Iskander-Thesis 2008 or as defined by Farakh Javid, Ramy Iskander et al, "A Structured DC Analysis Methodology for Accurate Verification of Analog Circuits", (ISCAS'13).

However, differently from the known prior art, when evaluating the circuit under transient conditions, the invention proposes to use and evaluate such analysis view graph with temporal operators, that are different from the operators previously known for direct current solving.

According to the invention, said transient analysis view graph evaluation comprises the following steps:

executing a sequential evaluation of a set of data, called "rule data", said evaluation providing a set of local behavior parameters for at least one node of said circuit, where said rule data represents a set of rule that comprises on the first hand, dependencies (94) between variables representing electrical properties of one or several nodes or physical properties of one or several transistors of said circuit, and on the other hand, mathematical operators (920), called temporal operators, that rule said dependencies (94) when said one or several transistors are working under transient conditions, said temporal operators being obtained through executing an inversion of a functional model of a transistor (such functional model is known in the art, and is cited in the document Iskander-Thesis 2008); and applying a set of Newton Raphson Constraints to said sequential evaluation, such as in the manner detailed in document Iskander-Thesis 2008.

Transient Analysis

In a preferred embodiment of the invention, the method according to the invention furthermore realizes an operation, called "transient analysis", which performs a numerical simulation. This transient analysis uses, as an input, a given set of sizes and biases for at least one transistor of said circuit, and provides, as an output, a time dependent behavior simulation, and optionally a time dependent performance evaluation, for at least one node of said circuit, over a given time duration and for a given stimuli profile. This stimuli profile represents a plurality of external electrical stimuli to be applied to circuit input ports at different time steps. This profile thus represents the influence of a stimuli control on the node(s) the behavior of which is simulated by the transient analysis, and comprises for example data representing the evolution of one or several electrical parameter applied to the circuit or to one of its nodes.

In this embodiment, said transient analysis comprises a plurality of iterations, together with an incrementation of a time-step data and unto a positive result from an end-of-simulation test for said time duration, of the following steps:
executing said transient instant solving procedure with said set of sizes and biases so as to provide a set of local behavior parameters at a time instant for at least one node of said circuit in a transient state,
applying external electrical stimuli for next time instant to said circuit, according to said stimuli profile.

Transient Solver

In a furtherly preferred embodiment of the invention, said method realizes a transient solver for a circuit working under transient conditions. This solver uses a set of design parameters and provides in an automated way a given set of sizes and biases for at least one transistor of said circuit, together with a time dependant performance evaluation for at least one node of said circuit over a given time duration and for a given stimuli profile.

According to the invention, said circuit transient solver then comprises a step of running a direct current solver, then providing the results of said DC solver into a transient analysis as set forth here above.

In a more detailed manner, said circuit transient solver thus comprises the following steps:
DC solver: executing at least one operation of digital processing that performs a direct current solver for said circuit, starting with input data representing said set of requested design parameters for said circuit. Said direct current solver operation comprises the steps of:
executing a sequential evaluation (102), called evaluation of design view (95) under DC conditions, of a set of data, called rule data (94, 910), that represents a dependency graph of a functional structure of said circuit, where said rule data represents
on the first hand, dependencies (94) between variables representing electrical properties of one or several nodes or physical properties of one or several transistors of said circuit, and
on the other hand mathematical operators, called DC operators (910), that rule said dependencies when said one or several transistors are working under direct current conditions, said DC operators being obtained through executing an inversion of a transistor functional model to provide a set of sizes and biases (V2, 103) for at least one transistor of said circuit; and
executing an operation, called DC solving procedure (104), comprising a plurality of iterations (114, 115) (while incrementing a tracking variable (115) used for DC solving) unto a positive result from a convergence test (113), of executing, of an evaluation (110) under direct current conditions of a graph (96) representing an analysis view of said circuit, said evaluation (110) being made when, called "analysis view graph evaluation under DC conditions", said evaluation thus producing a numerical simulation that provides a set of local behavior parameters (V3, 105) for at least one node of said circuit, said analysis view graph DC evaluation (110) comprising the following steps:
executing a sequential evaluation (111) of said rule data, comprising said dependencies (94) ruled by said DC operators (910), and
applying (112) a set (97) of Newton Raphson Constraints to said sequential evaluation (111); and then
TR analysis: using said set of sizes and biases (V2, 103) and said local behavior parameters (V3, 105) as initial conditions as input for applying said transient analysis (20) to at least one transistor of said circuit, thus producing a time dependent behavior simulation (V3TR, 202) and a time dependent performance evaluation (301) for said set of sizes and biases parameters (V2, 103).

Transient Circuit Optimizer

Also, in furtherly embodiments, such a method may also realize a transient circuit optimizer over a given time duration and for a given stimuli profile, through using a set of requested performance parameters to provide in an automated way an optimized set of design parameters and/or sizes and biases parameters for at least one transistor of said circuit.

According to the invention, said method then comprises a plurality of iterations, unto a positive result from a performance optimization convergence test (302), of executing the following steps:
executing at least one operation of digital processing realizing for said circuit a transient solver (30) through using a set of design parameters (101) and/or set of sizes and biases (103) for at least one transistor of said circuit, so as to provide a time dependant performance evaluation (301) for at least one node of said circuit over a given time duration and for a given stimuli profile (together with a set of sizes and biases, in the case of starting with design parameters); and
using said time dependant performance evaluation (301) to loop back (L1, L2) toward said transient circuit solver (30), through an operation of digital processing realizing an adjustment (305) of said design parameters (V1) and/or sizes and biases parameters (V2).

This and other aspects and features of the present invention will now become apparent to those of ordinary skill in the art upon review of the following description of specific embodiments of the invention and the accompanying drawings.

BRIEF DESCRIPTION OF THE DRAWINGS

A detailed description of examples of implementation of the present invention is provided herein below with reference to the following drawings, in which:

FIG. 11a to FIG. 11d are schematic representations of different connection possibilities for a NMOS transistor when processed in the solver of FIG. 9;

FIG. 12a to FIG. 12d are schematic representations of different connection possibilities for a PMOS transistor when processed in the solver of FIG. 9;

FIG. 13, FIG. 14, FIG. 15 and FIG. 16 are block diagrams illustrating the process for executing different types of temporal operators for transistor level, when implemented in the Transient Analysis Procedure of transient solver from FIG. 9

FIG. 13: for the temporal operator for solving intensities OPI;

FIG. 14a and FIG. 14b: in two parts, for the temporal operator for solving gate voltage (OPVG);

FIG. 15a and FIG. 15b in two parts, for the temporal operator for solving source voltage (OPVS);

FIG. 16a FIG. 16b: in two parts, for the temporal operator for solving gate-drain voltage (OPVGD);

FIG. 17, FIG. 18, FIG. 19, FIG. 20, FIG. 21, FIG. 22 and FIG. 23 are graphics illustrating a comparison, for various electrical properties of the OTA circuit of FIG. 2, between their values when computed by standard simulation and when computed by the method according to the invention.

DETAILED DESCRIPTION

Figure 1:
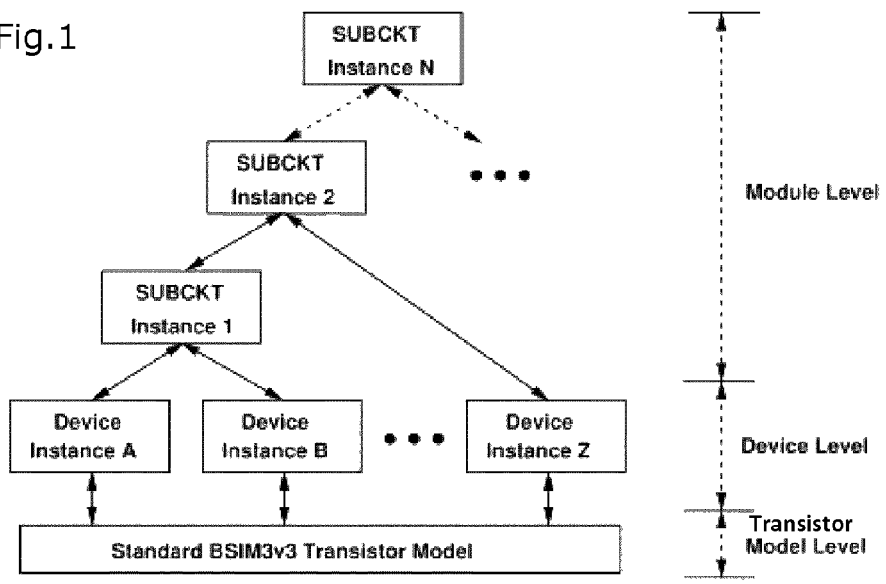
FIG. 1 is an example of a schematic hierarchical tree representation, as used for modeling an analog or mixed circuit in the process of designing or optimizing such a circuit, with the described method according either to the prior art or to the invention.

The methods and embodiments of invention encompass and use different known notations, concepts and tools. Most of them are cited or explained in the document "Iskander-Thesis 2008", which is to be referenced to for supporting or explaining the present invention.

Design View and Analysis View Graph

The nonlinear operator-based transient solver 30 comprises several blocks: the DC solver 10, the temporal operators 920 within their analysis view graph evaluating 221 and the transient simulator program 205.

The nonlinear operator-based DC solver 10 performs nonlinear DC analysis as described here above in reference to FIG. 1 to FIG. 8.

The results of this DC analysis are then used in the transient analysis 20 as initial conditions.

The temporal operators introduce time in operators.

The transient simulator program 205 computes initial conditions. Then, it advances simulation time in time steps 204. For each time step, it applies the stimuli to the circuit and then calls the nonlinear TR instant solver 201 to solve this time step using the temporal operators 920. Finally, the current state 202 is considered as initial conditions for the next time step 204.

An example of pseudo code for the transient simulator program is listed and commented in the enclosed Annex 1.

Figure 8:
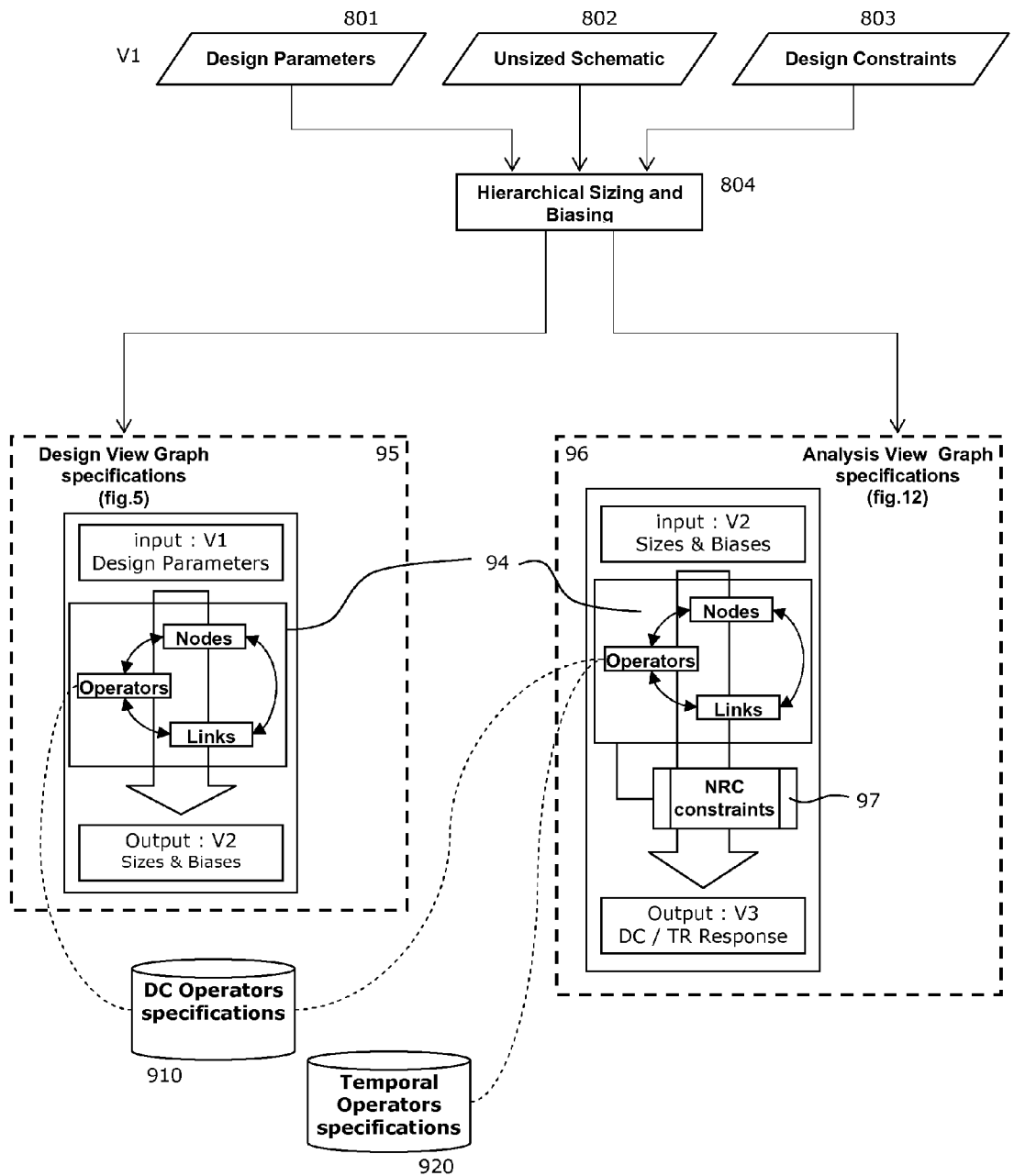
FIG. 8 is a schematic diagram illustrating the data flow for generating the Design View graph and Analysis View graph, and their interferences with each other.
Figure 9:
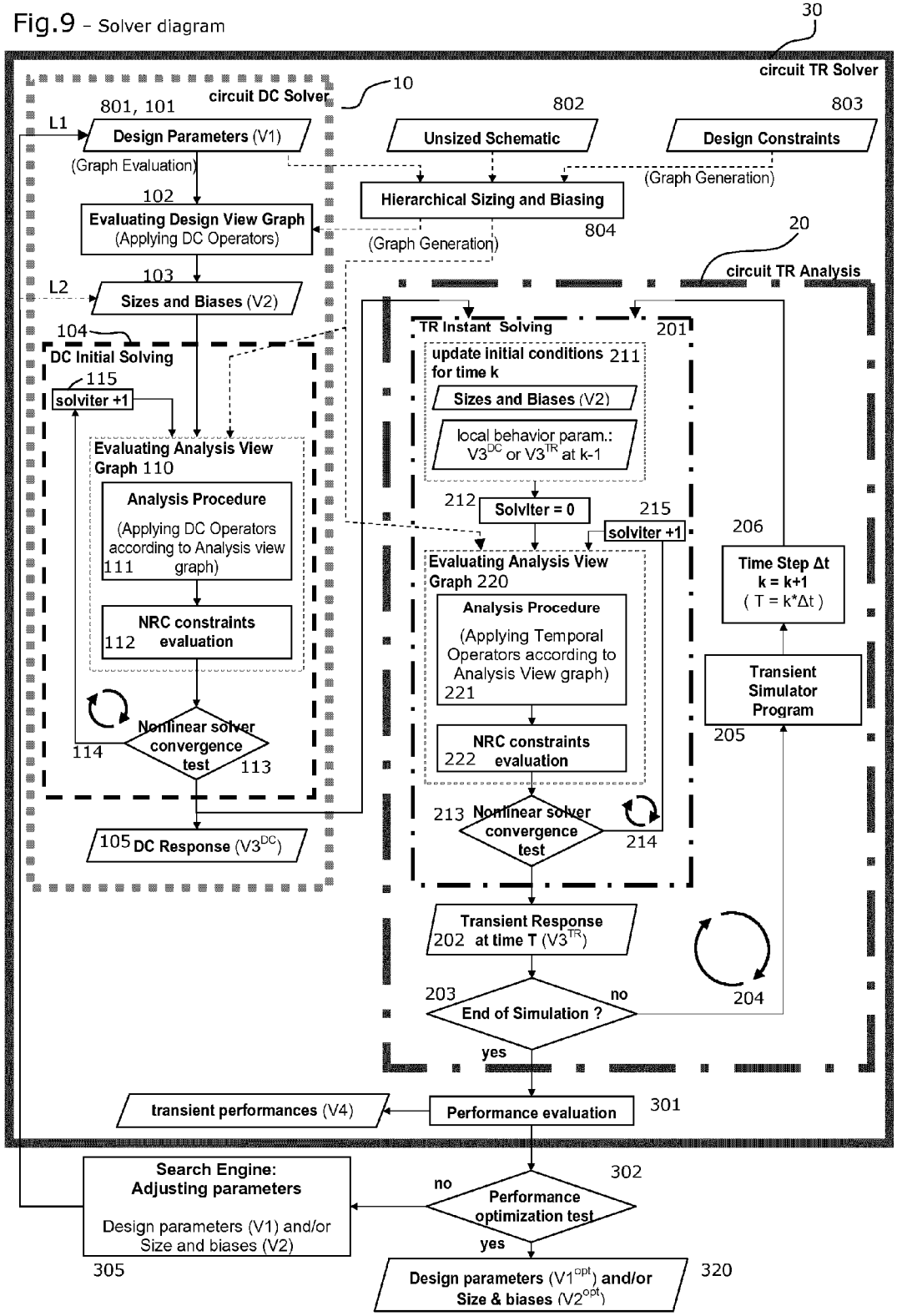
FIG. 9 is a block diagram illustrating the process of a transient design tool according to an exemplary embodiment of the invention.
Figure 10:
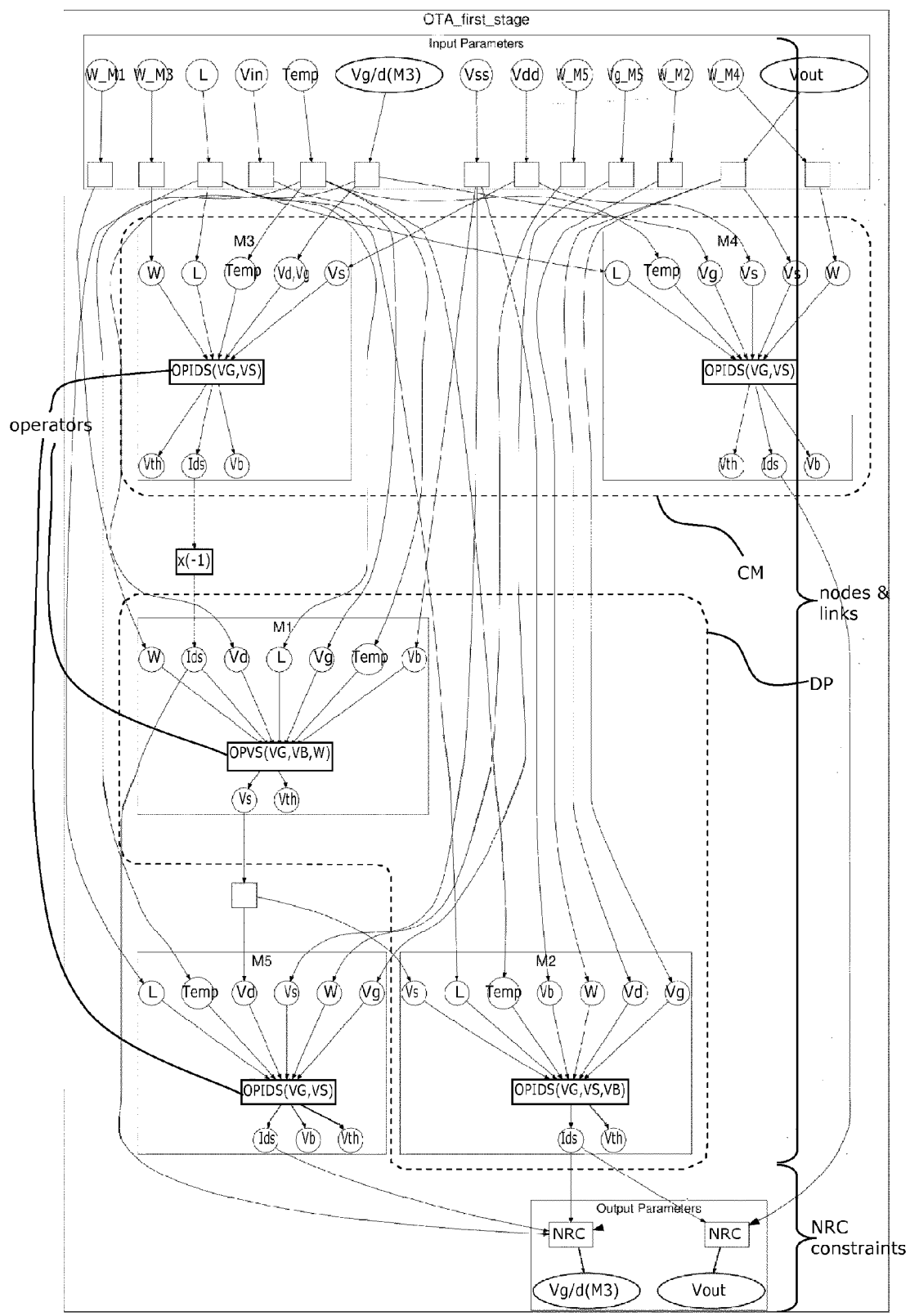
FIG. 10 is a schematic representation of the dependency graph in Analysis View of the OTA circuit of FIG. 2.

As illustrated in FIG. 8 and top of FIG. 9, design parameters 801 (V1), 101 and design constraints 803 are supplied along with the unsized netlist 802 to the hierarchical 804 sizing and biasing block, and used for generating a dependency graph for the circuit both in design view and in analysis view.

This dependency graph, when used in design mode as a design view graph 95, will be evaluated by starting from design and/or external parameters (V1) such as biasing current or branch current $I_{B,i}$, to issue sizes and biases parameters of one or several transistors (V2) such as a transistor width W, a transistor length L, and an unknown circuit external bias voltage $V_{Bias}$.

When used in analysis mode as an analysis view graph 96, this dependency graph will be evaluated by starting from the same sizes and biases parameters (V2) of one or several transistors (such as W, L, and $V_{ext}$) to issue local behavior parameters (V3), such as small signals (e.g. Transconductance $g_m$ or equivalent capacitance $C_{gs}$), or internal intensity $i_{int}$, or internal voltage $V_{int}$. Evaluating the analysis view graph 96 can be viewed as two parts: the analysis procedure (111 and 221 in FIG. 9) of the dependency graph 94, and the set of Newton-Raphson constraints 97 (112 and 222 in FIG. 9).

This analysis view graph 96 is used:
by the nonlinear DC solver 10, 104, with the DC operators specifications 910; and
by the nonlinear Transient solver 20, 201, with the Temporal operators specifications 920.

Such architecture of FIG. 8 may thus be used in the two following situations:
When a DC analysis 110 is performed, the DC solver 10, 104 computes the DC response of the circuit using DC operators 910;
Furtherly, when a transient analysis 220 is performed, the transient solver 30, 20 computes the transient response 202 at time T using temporal operators 920. It then passes the transient response to the transient simulator program 205 that will consider 211 it as initial conditions for the next time step 204. The transient simulator program then advances 206 simulation time to T+ΔT (i.e. k+1) and sets it inside temporal operators. The solving procedure 201 is then called to solve for time T+ΔT and so on. Note that the time is T=k*ΔT, where ΔT is the TimeStep size.

Architecture of the Design Tool

As illustrated in FIG. 9 a transient design tool according to an exemplary embodiment of the invention implement a nonlinear operator-based transient solver 30, i.e. the "TR solver" frame in thick continuous lines on the figure.

Figure 6:
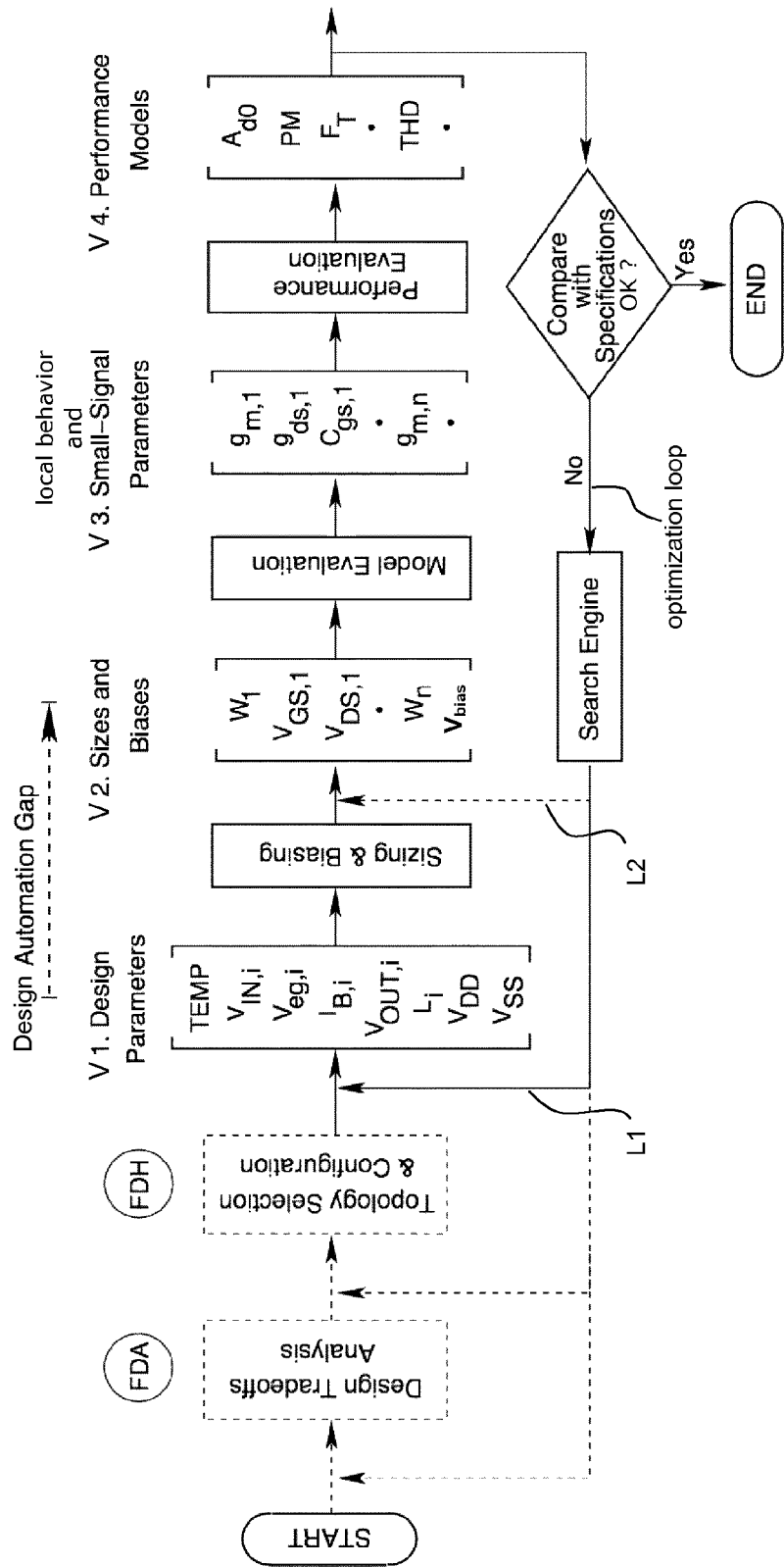
FIG. 6 is a schematic illustration of variables successively processed in the DC solver of the described method according either to the prior art or to the invention.
Figure 7:
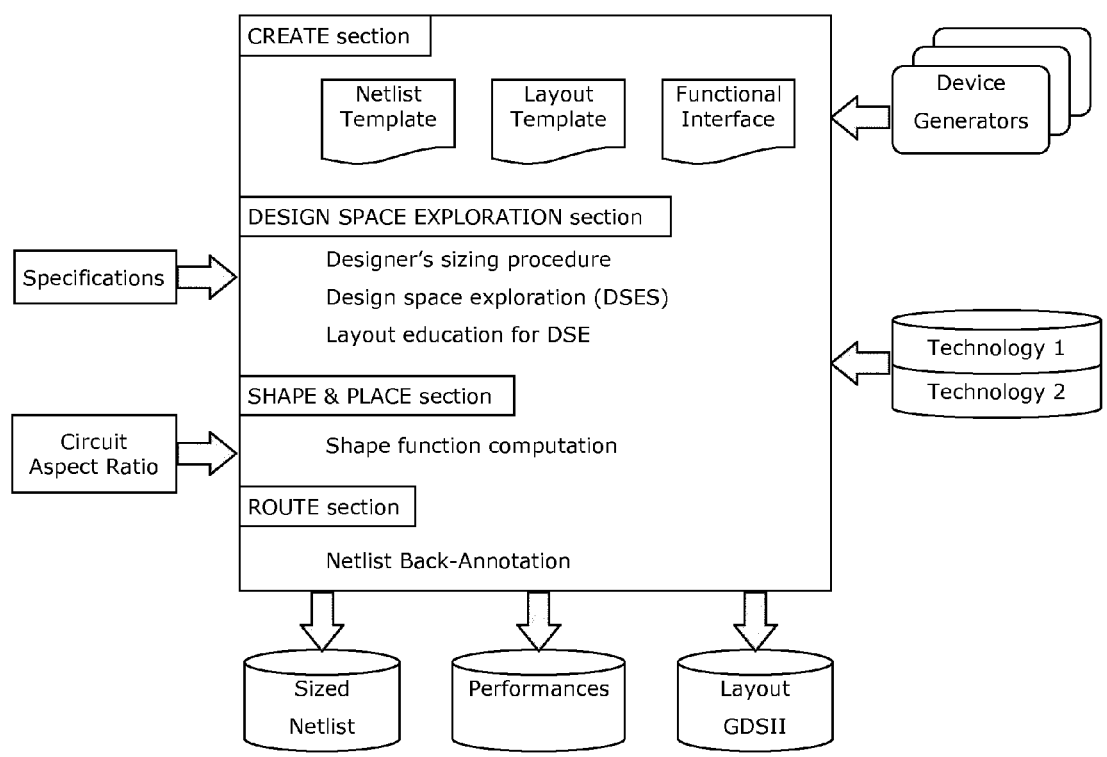
FIG. 7 is a schematic illustration of the data flows and process for a software generator module as programmed in CAIRO+/CHAMS for designing a device or module-level analog circuit, with the described method according either to the prior art or to the invention.

This embodiment still partially follows the global architecture illustrated in FIG. 6. Within this architecture, the invention made it possible to obtain an automated relevant and precise simulation for obtaining local behavior parameters V3 along a full significant time duration, even under highly transient conditions.

As non linear transient conditions are a specifically drastic and difficult part of the of the design problem for analog or mixed circuit, the invention thus make it possible to implement the automated design tool in a whole new range of circuits behaviors, which was previously not accessible to it.

Valorization of experience and know-how of the circuit designer obtained through Design View automation is thus available also for this whole new range of circuits behaviors.

The transient solver 30 includes a nonlinear operator-based D.C. solver 10, the frame in dotted thick lines on the figure, which typically may be the CAIRO+/CHAMS implemented previous design method from the present inventors, as described here above in reference to FIG. 1 to FIG. 8.

In other embodiments, another kind of DC solver may also be used, whole or partially, or it may even be omitted for working on an already pre-designed circuit, such as for optimizing an existing circuit.

In this DC solver 10, as illustrated in FIG. 9 and FIG. 6, design parameter (or requested parameters) 101 (V1) are used through evaluation 102 of the design view graph of the circuit for obtaining a set of sizes and biases parameters data 103 (V2), using DC operators specifications 910 within this Design View 95, such as disclosed in thesis "Iskander 2008".

These sizes and biases parameters data 103 (V2) are then computed through an initial DC solving operation 104 (medium dashed lines), for obtaining a set of DC response data 105 (V3) comprising values for local behavior parameters within the circuit. This initial DC solving operation 104 uses a non linear solving method, with a convergence back loop 114 around an evaluation 110 of the Analysis View 96 graph, thus including a set 97 of Newton Raphson constraints, computed with the same DC operators specifications 910.

The sizes and biases parameters data 103 (V2) producing this DC response data 105 (V3), called "initial" DC response, are then passed to a Transient Analysis operation 20 (thick mixed lines), which conveys a time dependent simulation, along a multi iteration 204 of instantaneous steps for time T. In each of these time steps, based on a same time-independent set of sizes and biases parameters 103 (V2), instantaneous local behavior parameters 202 (V3$^{TR}$: V3 in transient version) are provided by a transient instant solving operation 201 (medium mixed lines). In transient analysis 20, such local behavior parameters V3$^{TR}$ typically includes certain small signal parameters (within V3 of FIG. 6) that are usually neglected or seen as constant under Direct Current conditions, such as equivalent capacitance $C_{gs}$.

This transient instant solving operation 201 uses a non linear solving method, with a convergence back loop 214 around an evaluation 220 of the same Analysis View graph 96, thus including a set 97 of Newton Raphson constraints, computed with a different set of specifications 920 for the operators of the same analysis view circuit graph, which operators may thus be called "temporal operators".

The multiple transient response data 202 (V3$^{TR}$) covering a certain time duration are assessed (such as by comparing them with the requested performance specifications) for giving a performance evaluation under transient conditions 301 (V4 in transient version). Such assessment or evaluation may be made, for example, either at each iteration step 204 or after the whole TR analysis 20 operation.

These transient performance data 301, obtained for a given sizes and biases parameters (V2), are then used in an optimization test 302 and back loop 305 for producing a new adjusted value for the sizes and biases parameters (V2$^{OPT}$) or design parameters (V1$^{OPT}$). A new process of DC initial solving 104 followed with a new TR analysis 20 may then be made, and so on until obtaining a satisfactory or optimized value for sizes and biases parameters (V2$^{OPT}$) or design parameters (V1$^{OPT}$) 320.

Recited in a more extensive manner, such a TR solver 30 embodiment uses input data representing a set of design parameters (V1) 101 for a circuit to execute an initial DC solver operation 104 for obtaining a possible set of sizes and biases parameters (V2) together with the set of local behavior parameters (V3$^{DC}$) that will be produced through such sizes and biases parameters.

According to the invention, this TR solver method 30 furtherly comprises the steps of using output data (V2 and V3) of said direct current solver 10 as input data for a digital processing realizing a time-dependent evaluation, through an operation of transient analysis 20 for at least one transistor of said circuit over a given time duration and for a given stimuli profile. This TR solver method 30 thus produces a time dependent behavior simulation (V3TR) and a time dependent performance evaluation 301 for said set of sizes and biases parameters (V2) 103 for the whole span of said time duration.

DC Solver:

This direct current solver 10 operation comprises the steps of:

executing a sequential evaluation 102, called evaluation of design view 95 when under DC conditions, of a set of data, called rule data 95, 910, that represents a dependency graph of the functional structure of said circuit, to provide sizes and biases (V2) 103 of at least one transistor of said circuit, where said rule data represents:

on the first hand, dependencies 94 between variables representing electrical properties of one or several nodes or physical properties of one or several transistors of said circuit, and on the other hand mathematical operators, called DC operators 910, that rule said dependencies when said one or several transistors are working under direct current conditions, said DC operators being obtained through executing an inversion of a transistor functional model to provide a set of sizes and biases (V2) 103 for at least one transistor of said circuit; and executing an operation, called DC solving procedure 104, comprising a plurality of iterations 114 (while incrementing a tracking variable (115) used for DC solving) unto a positive result from a convergence test 113, of executing, of an evaluation 110 under direct current conditions of a graph 96 representing an analysis view of said circuit, said evaluation 110 being made when, called "analysis view graph evaluation under DC conditions", said evaluation thus producing a numerical simulation that provides a set of local behavior parameters (V3), 105 for at least one node of said circuit, said analysis view graph DC evaluation 110 comprising the following steps:

executing a sequential evaluation 111 of said rule data, comprising said dependencies 94 ruled by said DC operators 910, and applying 112 a set 97 of Newton Raphson Constraints to said sequential evaluation 111;

Transient Simulation/Analysis:

Furthermore, this transient analysis 20 comprises a plurality of iterations 204, 206, of a transient instant solving procedure 201 providing local behavior parameters 202 in at least one node of said circuit in a transient state at a time instant T, along an incremented and/or adjusted time-step index data k and unto a positive result from an end-of-simulation test 203.

Still furtherly, this transient solving procedure 201 comprises a plurality of iterations 214 of executing an evaluation 220 (when under transient conditions) of a graph 96 representing an analysis view of said circuit, said evaluation being here called "transient analysis view graph evaluation" or "analysis view under transient conditions". These iterations are executed while incrementing a tracking variable (215), used for TR solving, unto a positive result from a convergence test 213, thus producing a numerical simulation to provide small signals parameters (V3TR) 202 in at least one node of said circuit at the current time-step index k.

Said transient analysis view graph evaluation 220 comprises the following steps:
  executing a sequential evaluation 221, of a set of data, called rule data, said evaluation providing a set of local behavior parameters for at least one node of said circuit. In a more detailed manner, this sequential evaluation 221 comprises
    on the first hand, dependencies 94 between variables representing electrical properties of one or several nodes or physical properties of one or several transistors of said circuit, and
    on the other hand mathematical operators, called temporal operators 920, that rule said dependencies 94 when the circuit is working under transient conditions, said temporal operators being obtained through executing an inversion of a transistor functional model to provide a set of small signals parameters in at least one node of said circuit; and
  evaluating 222 a set 97 of Newton Raphson Constraints.

Search Engine:

Optionally, such transient performance data V4 produced by circuit TR solver 30 may be used to automatically loop back toward said all or part of circuit DC solver 10, through an operation of digital processing (305) realizing a search engine within a given range for all or part of data inputted into said circuit DC solver 10.

A loop called "upstream" back loop L1 may be implemented, through adjusting 305 design parameters V1, and recurring the DC solver operation starting with Design View evaluation step 102. A positive result of a performance optimization test 302 thus produces an automated optimization providing an optimized set of design parameters (V1$^{OPT}$) 320.

Another more "midstream" back loop L2 may also be implemented, through adjusting 305 sizes and biases parameters V2, and recurring the DC solver operation only starting through DC solving operation 104. A positive result of a performance optimization test 302 thus produces an automated optimization providing an optimized set of size and bias parameters (V2$^{OPT}$) 320.

Temporal Operators

Connection Configurations

The content of various operators may depend on the type of connection existing between the currently processed transistor's terminals, which are illustrated in FIG. 11 and FIG. 12, where "D" is Drain terminal, "G" is Gain terminal, "S" is Source terminal, and "B" is Bulk terminal:
  case labeled NBND: The 4 terminals: D, G, S, B are independent, as illustrated in FIG. 11a for NMOS and in FIG. 12a for the PMOS;
  case labeled BND: The Source is connected to the Bulk, there are 3 independent terminals: D, G, S/B, as illustrated in FIG. 11b for NMOS and in FIG. 12b for the PMOS;
  case labeled NBD: The Drain is connected to the Gate, there are 3 independent terminals: D/G, S, B, as illustrated in FIG. 11c for NMOS and in FIG. 12c for the PMOS;
  case labeled BD: The Drain is connected to the Gate and the Source is connected to the Bulk, there are 2 independent terminals: D/G, S/B, as illustrated in FIG. 11d for NMOS and in FIG. 12d for the PMOS.

FIG. 13, FIG. 14, FIG. 15 and FIG. 16 are block diagrams illustrating the process for executing different types of temporal operators for transistor level, when implemented in the Transient Analysis Procedure 221 of transient solver 30 from FIG. 9

Figure 13:
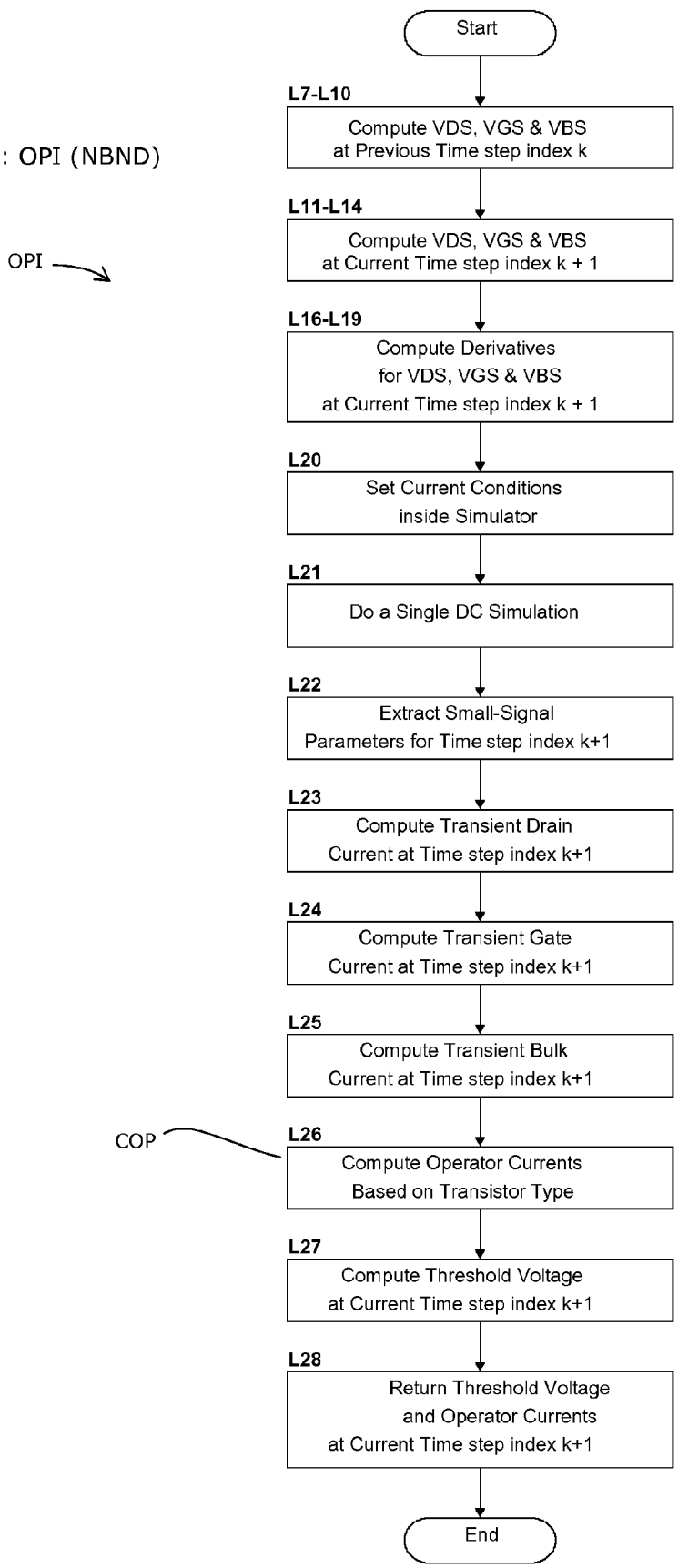
Figure 23:
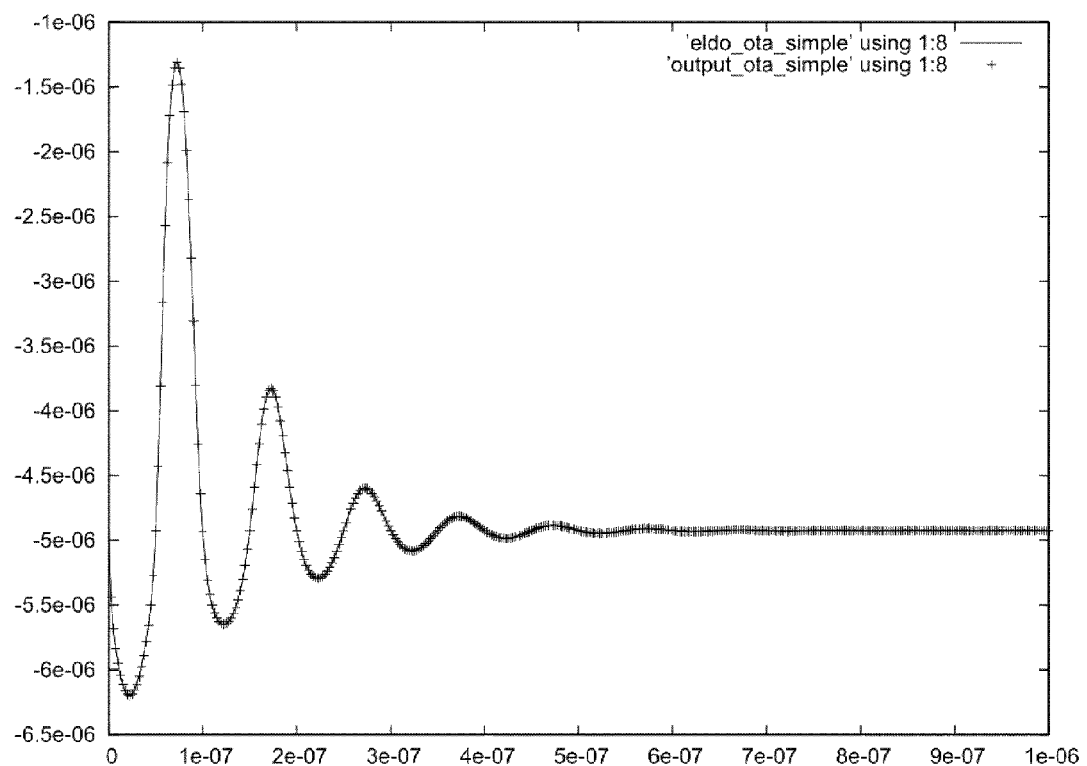

FIG. 13: for the temporal operator for solving intensities OPI, in configuration NBND;

FIG. 14a and FIG. 14b: in two parts, for the temporal operator for solving gate voltage (OPVG), in configuration NBND;

FIG. 15a and FIG. 15b in two parts, for the temporal operator for solving source voltage (OPVS), in configuration NBND;

FIG. 16a FIG. 16b: in two parts, for the temporal operator for solving gate-drain voltage (OPVGD), in configuration NBD;

Processes for other configurations are detailed in the Annex hereafter, and are not specifically illustrated in the figures.

Operator Currents

Within this method are used a set of variables representing equivalent currents properties called "operator currents", here noted "$i_{op,D}$", "$i_{op,G}$", "$i_{op,S}$" and "$i_{op,B}$" for the respective terminals Drain (D), Gate (G), Source (S), Bulk (B) of the transistor.

These four operator terminal currents are computed from the 3 MOS currents "$i_D$" (flowing into the Drain), "$i_G$" (into the Gate) and "$i_B$" (flowing out of the Bulk), in a different way for each of the four configurations NBND, NBD, BND, BD, as follows:
  for an NMOS transistor:
    case NBND:
      iD_op=iD
      iB_op=−iB
      iG_op=iG
      iS_op=−iD−iG+iB
    case NBD:
      iD_op=iD+iG
      iB_op=−iB
      iG_op=iG
      iS_op=−iD−iG+iB
    case BND:
      iD_op=iD
      iB_op=−iB
      iG_op=iG
      iS_op=−iD−iG
    case BD:
      iD_op=iD+iG
      iB_op=−iB
      iG_op=iG
      iS_op=−iD−iG
  for an PMOS transistor:
    case NBND:
      iD_op=iD
      iB_op=−iB
      iG_op=iG
      iS_op=−iD−iG+iB
    case NBD:
      iD_op=iD+iG
      iB_op=−iB
      iG_op=iG
      iS_op=−iD−iG+iB
    case BND:
      iD_op=ID
      iB_op=−iB
      iG_op=iG
      iS_op=−iD−iG
    case BD:
      iD_op=iD+iG
      iB_op=−iB
      iG_op=iG
      iS_op=−iD−iG This computing is done here by a "Compute Operator Currents" (COP) function, which may be implemented as described and commented in Annex 3.

Current Temporal Operator: OPI

When applied at transistor level within evaluating of a circuit graph 94, temporal intensity operator OPI provides for said transistor at the current time-step index (k+1) a set of data comprising on the first hand a threshold voltage value and on the second hand a set of four operator currents values corresponding to a determined arithmetical combination (through the COP function) of the currents flowing into the terminals.

Temporal operator OPI computes the operators current flowing through the 4 terminals of the MOS transistor: Drain (D), Gate (G), Source (S), Bulk (B). This operator is described as function of:
time: T
temperature: Temp
transistor's sizes: width (W) and length (L)
terminal voltages: $V_D$, $V_G$, $V_S$, $V_B$ Each of the 4 terminal currents is considered positive if the current is flowing into the terminal.

In this OPI operator, the three MOS model currents $i_D$, $i_G$ and $i_B$ are computed in steps L23-L25. Then, depending again on the internal connections of the transistor's terminals, the resulting operator terminal currents $i_{op,D}$, $i_{op,B}$, $i_{op,G}$, $i_{op,S}$ flowing into the independent terminals are computed by function COP in L26 for the four configurations NBND, BND, NBD, BD as a function of the three MOS model currents $i_D$, $i_G$ and $i_B$.

Execution of this temporal operator OPI is illustrated in FIG. 13, where references correspond to the line numbers of the related pseudo code example listed and commented in Annex 4 steps (with references referring to the NBND configuration).

Execution of operator OPI comprises the following steps:
computing (L7-L14) terminals voltages for Drain-Source (VDS), Gain-Source (VGS) and Bulk-Source (VBS) at the previous (k) and current (k+1) time-step index, and computing (L16-L19) derivative values of said terminal voltages for the current time-step index (k+1),
(L20-L22) executing a direct current simulation based on the terminals voltages values at the current time-step index (k+1) for extracting small signals for the current time-step index (k+1), and
computing (L23-L25) transient currents from said extracted small-signals,
computing (L26, COP) operator currents according to the transistor type and connection, and
computing (L27) threshold voltage at the current time step index (k+1).

Gate Voltage Temporal Operator: OPVG

When applied at transistor level within evaluating of a circuit graph 94, temporal Gate Voltage operator OPVG provides for said transistor at the current time-step index (k+1) a data comprising the Gate Terminal voltage $V_G$ of the MOS transistor, as function of:
time: T
temperature: Temp
transistor's sizes: width (W) and length (L)
input current at drain terminal: $i_{reqop,D}^{k+1}$
the 3 other terminal voltages: $V_D$, $V_S$, $V_B$ There are 2 versions of the OPVG operator, depending on the internal terminal connections of the transistor, shown in FIG. 11 for the NMOS transistor and in FIG. 12 for the PMOS transistor.

Configuration "NBND": The 4 terminals: D, G, S, B are independent, as shown in FIG. 11a for the NMOS and in FIG. 12a for the PMOS.

Configuration "BND": The Source is connected to the Bulk, there are 3 independent terminals: D, G, S/B, as shown in FIG. 11b for the NMOS and in FIG. 12b for the PMOS.

Execution of this Gate Voltage temporal operator OPVG is illustrated in FIG. 14, where references correspond to the line numbers of the related pseudo code example listed and commented in Annex 5.

Execution of operator OPVG comprises the following steps (with references referring to the NBND configuration):
resetting (L19-L20) of transient Gate Current and Bulk transient Current at current time-step index (k+1),
executing a plurality of iterations while incrementing a variable, called operator index (opiter), unto a positive result from a convergence test (L46-L49) of Gate Voltage, Drain Current, Gate Current and Bulk Current, of executing the following substeps:
computing (L22-L29) terminals voltages for Drain-Source (VDS), Gain-Source (VGS) and Bulk-Source (VBS) at the current time-step index (k+1), and computing derivative values of said terminal voltages for said current time-step index,
executing (L30-L32) a direct current simulation based on the terminals conditions at the current time-step index (k+1) for extracting small signals for said current time-step,
using said extracted small signals to compute (L35-L37) terminals transient currents at operator index (opiter) step for the current time-step index (k+1),
according to a requested instantaneous Drain Current, using extracted small signals to compute (L38) DC Drain Current at operator index (opiter) step for the current time-step index (k+1),
(L40-L41) according to a Desired DC Drain Current, applying a numerical solving to a differential equation (3.1) for that Drain current in order to compute a Gate-Source voltage at current time-step index (k+1) and subsequently said Gate Voltage at operator index (opiter) step;
computing (L50, COP) Operator Currents at current time-step index (k+1) according to the transistor type;
computing (L51) Threshold Voltage at current time-step index (k+1).

Source Voltage Temporal Operator: OPVS

When applied at transistor level within evaluating of a circuit graph 94, temporal Source Voltage operator OPVS provides for said transistor at the current time-step index (k+1) a data comprising the Source terminal voltage $V_S$ of the MOS transistor, as function of:
time: T
temperature: Temp
transistor's sizes: width (W) and length (L)
input current at drain terminal: $i_{reqop,D}^{k+1}$
the 3 other terminal voltages: $V_D$, $V_G$, $V_B$ There are 2 versions of the OPVS operator depending on its internal terminal connections, shown in FIG. 11 for the NMOS transistor and in FIG. 12 for the PMOS transistor:

Configuration "NBND": The 4 terminals: D, G, S, B are independent as shown in FIG. 11a for the NMOS and in FIG. 12a) for the PMOS.

Configuration "BND": The Source is connected to the Bulk, there are 3 independent terminals: D, G, S/B, as shown in FIG. 11b for the NMOS and in FIG. 12b for the PMOS.

Execution of operator OPVS comprises the following steps (with references referring to the NBND configuration):
  resetting (L19-L20) of transient Gate Current and Bulk transient Current at current time-step index (k+1),
  executing a plurality of iterations while incrementing a variable, called operator index (opiter), unto a positive result from a convergence test (L46-L49) of Source Voltage, Drain Current, Gate Current and Bulk Current, of executing the following substeps:
    computing (L22-L29) terminals voltages for Drain-Source (VDS), Gain-Source (VGS) and Bulk-Source (VBS) at the current time-step index (k+1), and computing derivative values of said terminal voltages for said current time-step index,
    executing (L30-L32) a direct current simulation based on the terminals conditions at the current time-step index (k+1) for extracting small signals for said current time-step,
    using said extracted small signals to compute (L35-L37) terminals transient currents at operator index (opiter) step for the current time-step index (k+1),
    according to a requested instantaneous Drain Current, using extracted small signals to compute (L38) DC Drain Current at operator index (opiter) step for the current time-step index (k+1),
    (L40-L41) according to a requested desired DC Drain Current, applying a numerical solving to a differential equation (3.1) for that Drain current in order to compute a Gate-Source voltage at current time-step index (k+1) and subsequently said Source Voltage at index (opiter) step;
    computing (L50, COP) Operator Currents at current time-step index (k+1) according to the transistor type;
    computing (L51) Threshold Voltage at current time-step index (k+1).
  Execution of this Source Voltage temporal operator OPVS is illustrated in FIG. 15, where references correspond to the line numbers of the related pseudo code example listed and commented in Annex 6.
  Execution of operator OPVS is similar to operator OPVG, while Gate Voltage is replaced with Source Voltage.

Gate/Drain Voltage Temporal Operator: OPVGD

When applied at transistor level within evaluating of a circuit graph 94, temporal Gate/Drain Voltage operator OPVGD provides for said transistor at the current time-step index (k+1) a data comprising the Gate Terminal voltage $V_G = V_D$ of the MOS transistor, as function of:
  time: T
  temperature: Temp
  transistor's sizes: width (W) and length (L)
  input current at drain terminal: $i_{reqop,D}^{k+1}$
  the 2 other terminal voltages: $V_S$ and $V_B$ There are 2 versions of the OPVGD operator depending on its internal terminal connections, as shown in FIG. 11 for the NMOS transistor and in FIG. 12 for the PMOS transistor:
  Configuration "NBD": the 3 terminals: D/G, S, B are independent, as shown in FIG. 11c for the NMOS and in FIG. 12c for the PMOS.
  Configuration "BD": the Source is connected to the Bulk, there are 2 independent terminals: D/G, S/B, as shown in FIG. 11d for the NMOS and in FIG. 12d for the PMOS.

Execution of this Gate/Drain Voltage temporal operator OPVGD is illustrated in FIG. 16, where references correspond to the line numbers of the related pseudo code example listed and commented in Annex 7.

Execution of operator OPVG comprises the following steps (with references referring to the NBD configuration):
  resetting (L21-L22) of transient Gate Current and Bulk transient Current at current time-step index (k+1),
  executing a plurality of iterations while incrementing a variable, called operator index (opiter), unto a positive result from a convergence test (L53-L56) of Gate Voltage, Drain Current, Gate Current and Bulk Current, of executing the following substeps:
    computing (L32-L35) terminals voltages for Drain-Source (VDS), Gain-Source (VGS) and Bulk-Source (VBS) at the current time-step index (k+1), and computing derivative values of said terminal voltages for said current time-step index,
    executing (L36-L38) a direct current simulation based on the terminals conditions at the current time-step index (k+1) for extracting small signals for said current time-step,
    using said extracted small signals to compute (L41, L43-L44) terminals transient currents at operator index (opiter) step for the current time-step index (k+1),
    computing (L42) actual requested Drain current from requested operator Drain current and Gate current;
    according to a requested instantaneous Drain Current, using extracted small signals to compute (L45) DC Drain Current at operator index (opiter) step for the current time-step index (k+1),
    (L46-L48) according to a desired DC Drain Current, applying a numerical solving to a differential equation (3.1) for that Drain current in order to compute a Gate-Source voltage at current time-step index (k+1) and subsequently said Gate Voltage at index (opiter) step;
    computing (L57, COP) Operator Currents at current time-step index (k+1) according to the transistor type;
    computing (L58) Threshold Voltage at current time-step index (k+1).

Solving for Gate Source Voltage

Solving for $V_{GS}$ is used in operator OPVG (in L40), in operator OPVS (in L40), and in operator OPVGD (in L47). This solving operation may be done through using a Newton-Raphson algorithm, as the current $I_D$ is monotonic with $V_{GS}$.

Computing the new Gate-Source voltage $V_{GS}$ in these operators uses the following equations:

$$\Delta V_{GS}^k = -\frac{I_D^k - I_{D,desired}}{\frac{dI_D^k(V_{GS}^k)}{dV_{GS}^k}} \quad \text{(equation 3.1)}$$

$$V_{GS}^{k+1} = V_{GS}^k + \Delta V_{GS}^k \quad \text{(equation 3.2)}$$

with the value of new transient Drain Current being chosen for $I_{D,desired}$.

To ensure convergence, $\Delta V_{GS}^k$ is limited by using the "step_limiting_scheme" as follows:

$$\text{step\_limiting\_scheme}(\Delta x_k) = \frac{1}{k_l} \cdot \text{sgn}(\Delta x_k) * \log(1 + k_l \cdot |\Delta x_k|) \quad (6.3)$$

where $k_l$ is a variable decreasing with iterations till reaching a maximum:

$$k_l = \max(\text{CLLB}, \text{CLUB} - \text{iteration})$$

where CLLB and CLUB are defined by the nature of devices used.

$$\frac{dI_D^k(V_{GS}^k)}{dV_{GS}^k}$$

is predicted at iteration 0 using Backward Euler formulation, and is corrected for other iterations using trapezoidal differentiation formula.

Validation of the Method

Figure 2A:
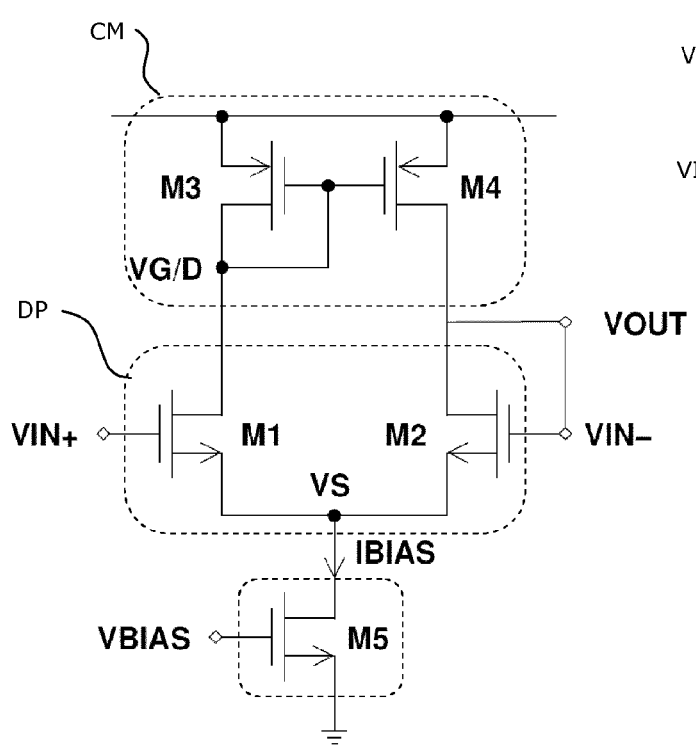
FIG. 2 is a schematic representation of a CMOS circuit constituting a simple OTA amplifier illustrating the described method according either to the prior art or to the invention.
Figure 2B:
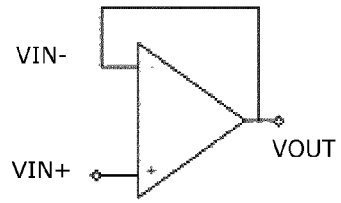
Figure 3:
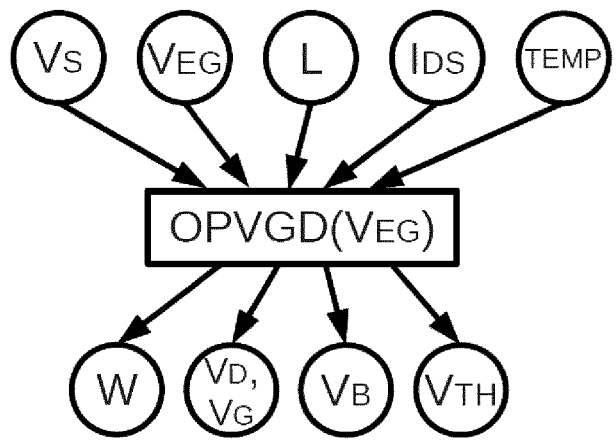
FIG. 3, FIG. 4 are graph representations of the dependency graph for respectively: the transistor M3 and the current mirror CM of the circuit from FIG. 2.
Figure 4:
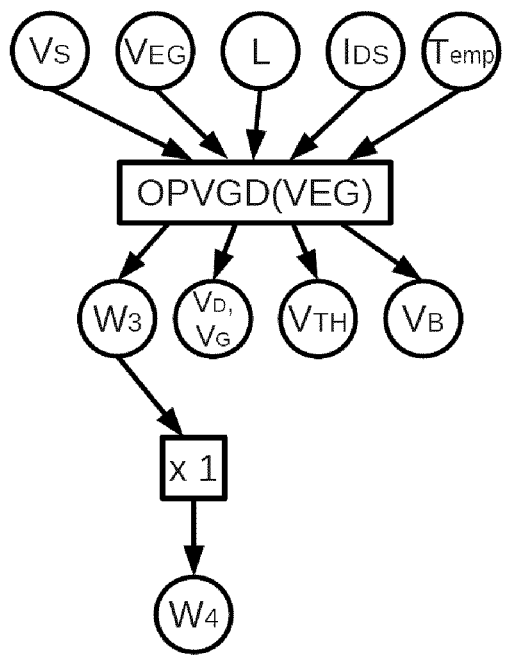
Figure 5:
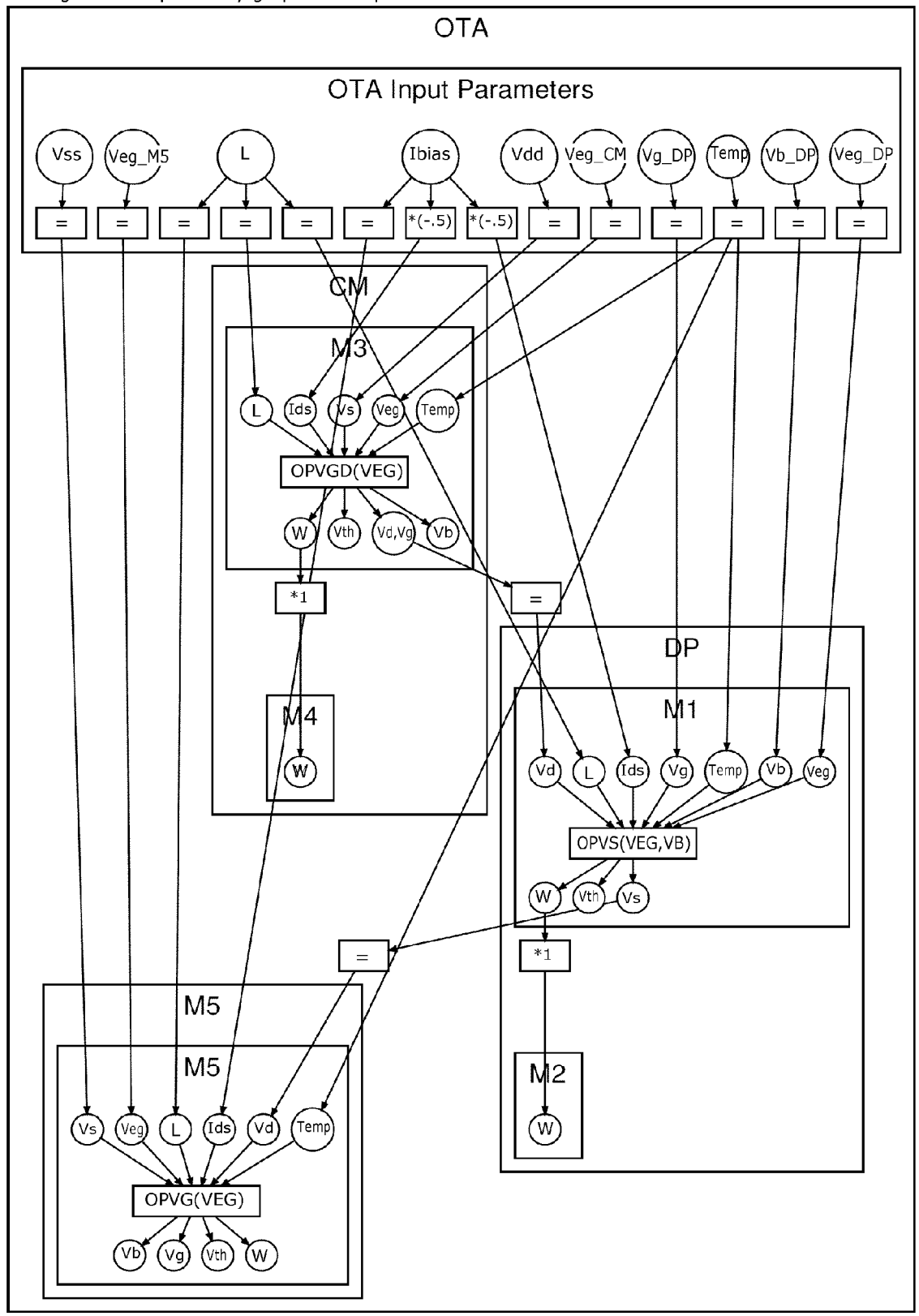
FIG. 5 is a representation of the Design View dependency graph of the circuit from FIG. 2.

The described method has been implemented in CAIRO+/CHAMS environment, and executed with the simple OTA Amplifier illustrated in FIG. 2.

Graphics of FIG. 17 to FIG. 23 show time variations of several electrical properties (voltages and currents), as computed through the present temporal operators and compared with a traditional numerical spice simulation.

Concurrence of both curves, in each of FIG. 17 to FIG. 23, shows that the present temporal operators may be used with a fairly satisfactory precision.

Other Applications

While the currently preferred embodiment pertains to a comprehensive circuit transient solver tools, different parts of the invention, such as the transient Analysis view graph evaluation 220, or the TR instant solving 201 or the Circuit TR analysis 20 here described, may also be implemented in various other embodiments; for example for building validation or simulation tools or other kinds of transient relevant transistor or device/circuit computing or optimizing tools.

Although various embodiments have been illustrated, this was for the purpose of describing, but not limiting, the invention. Various modifications will become apparent to those skilled in the art and are within the scope of this invention.

ANNEX

Annex 1: Transient Simulator Program
Pseudo-code for the transient simulator program (illustrated in block diagram of FIG. 9 as reference 205):
1: Set simulation parameters in the analysis view
2: Instantiate DC solver
3: Declare degrees of freedom to solver
4: Set TimeStep in each temporal operator
5: Set initial conditions for all nodes
6: Set time step index k=0 in each temporal operator
7: Solve for time step index k=0
8: For each time step index k=1 to n
9: Set T=k*TimeStep
10: Compute stimuli=Fstimuli(T)
11: Apply stimuli to the circuit
12: Set time-step index k (for time T) inside operators
13: Solve for time step index k
14: Set node voltages as initial conditions for time step index k+1
15: End For
The above program may be commented as follows:
Line 1: The simulator program sets simulation parameters such as widths, lengths, input/output voltages, etc.
Line 2: A nonlinear operator-based DC solver is instantiated.
Line 3: The required degrees of freedom are then declared to the solver.
Line 4: The designer chooses a time step size to advance time. This is step is set inside each temporal operator to be used for computations internally.
Line 5: Initial conditions for all circuit node voltages are set
Line 6-7: The solver is asked to solve the circuit at time step index k=0
Line 8: A time sweep is performed from time step index k=1 to k=n
Line 9: Compute current time T for time step index k
Line 10-11: At each time value, the stimuli is computed and applied to the circuit input terminal
Line 12: The current time step index k is documented inside operators for potential use internally
Line 13: The solver solves for time step index k
Line 14: the node voltages computed in time step index k are set as initial conditions for time step index k+1

Annex 2: TR Instant Solving or DC Solving
Example of a more detailed embodiment for the solving operation, which typically may be either the DC Initial Solving 104 or the TR Instant Solving procedure 201.
Here, we present the unified formulation for the analysis view.
Let $x=(x_1, x_2, \ldots, x_n)$ be the vector of added degrees of freedom for NRCs. We would like to solve n nonlinear equality constraints with n unknowns. We call $F(x)$ the vector of Newton-Raphson constraints:

$$F(x) = \begin{bmatrix} F_{KCL}(x) \\ F_{offset}(x) \\ F_{feedback}(x) \end{bmatrix} = 0$$

The designer states the constraints in $F(x)$ to describe the circuit behavior. Then, he assigns one degree of freedom for each constraint. Finally, the system of nonlinear equality constraints is solved using the algorithm depicted in the following pseudo code.

In Line 4, the analysis procedure is the procedure that evaluates the analysis view graph.
In Line 5, the Newton-Raphson constraints procedure is the procedure that evaluates Newton-Raphson constraints using biasing parameters from the analysis view graph.
In line 16, a both-sides-wise limiting step is applied assuming that the delta change $\Delta x_k$ is steep on both sides and its form is unknown, we define the step_limiting_scheme as follows:

$$\text{step\_limiting\_scheme}(\Delta x_k) = \frac{1}{k_l} \cdot \text{sgn}(\Delta x_k) * \log(1 + k_l \cdot |\Delta x_k|)$$

where $k_l$ is variable decreasing with iterations till reaching a maximum:

$$k_l = \max(CLLB, CLUB - \text{iteration})$$

where CLLB and CLUB are defined by the nature of devices used.

In spice simulators, the Jacobian matrix $J(x)$ is of order n×n, where n is the total number of nodes in the circuit. Since our approach considers only relevant nodes, the order of the Jacobian matrix is considerably reduced.

Pseudo-code for the solving procedure (with references referring to the TR Instant Solving procedure 201 in FIG. 9):

Operator-Based Nonlinear DC Solver Algorithm

```
1:  Verify #constraints = #input parameters in vector x_k
2:  Let SolverIter = 0
3:  Loop
4:      Evaluate Analysis Procedure for the input parameter vector x_k
5:      Evaluate Newton-Raphson Constraints procedure for the input
        parameter vector x_k
6:      Get F_KCL(x_k), F_offset(x_k) and F_feedback(x_k)
7:      Set F(x_k) = [F_KCL(x_k) F_offset(x_k) F_feedback(x_k)]^T
8:      For each input parameter x_k^i in x_k
9:          Set the input parameter x_k^i equals to x_k^i – h_i, h_i is a stepsize
10:         Evaluate the Analysis Procedure for x_k^i – h_i
11:         Evaluate the Newton-Raphson constraints procedure for
            x_k^i – h_i,
            i.e. F_KCL(..., x_k^i – h_i, ...), F_offset(..., x_k^i – h_i, ...) and
            F_feedback(..., x_k^i – h_i, ...)
12:         Compute the corresponding entries in the Jacobian J(x_k)
13:         Restore the input parameter x_k^i modified in step (9)
14:     End For
15:     Solve J(x_k) · Δx_k = –F(x_k) to get Δx_k using LU Factorization
16:     Apply both-sides-wise step limiting scheme to get Δx_{k,limit} =
        step_limiting_scheme(Δx_k)
17:     Get next estimate x_{k+1} = x_k + Δx_{k,limit}
18:     Increment simulation iteration SolverIter
19:     If maximum iterations reached, restore initial x_k and go to step
        (24)
20:     Test convergence | x_{k+1} – x_k | ≤ ∈_{reltol} · max(| x_{k+1} |, | x_k |) +
        ∈_{abstol,v}
21:     If not converged, set x_k = x_{k+1}
22: While not converged
23: Evaluate analysis procedure with latest input parameter vector x_{k+1}
24: End
```

Line 1: Verify that the number of Newton-Raphson constraints are equal to the number of degrees of freedom $x_k$ set in the solver by the designer. (cf.211)
Line 2: Set Solver iteration counter (solviter)=0 (cf.212)
Line 3: Begin solving loop
Line 4: Evaluate analysis procedure for the input parameter vector $x_k$ (cf.221)
Line 5: Evaluate Newton-Raphson Constraints procedure for the input parameter vector $x_k$ (cf.222)
Line 6: Get each Newton-Raphson constraint
Line 7: Form Newton Raphson constraint vector $F(x_k)$
Line 8: For each input parameter $x_k^i$ in $x_k$, proceed as follows
Line 9: Change the parameter $x_k^i$ by a stepsize $h_i$
Line 10: Evaluate the analysis procedure for $x_k^i$ (cf.221)
Line 11: Evaluate Newton-Raphson constraints procedure for $x_k^i$ (cf.222)
Line 12: Compute the jacobian entries corresponding to each Newton-Raphson constraint in $F(x_k)$
Line 13: Restore the input parameter $x_k^i$ modified in Line 9
Line 14: if not all parameters processed, goto Line 8
Line 15: Solve for the delta $\Delta x_k$ using LU decomposition
Line 16: Apply a step limity scheme on $\Delta x_k$ to get the new $\Delta X_{k,limit}$
Line 17: Get new estimate $x_{k+1}$ by adding $\Delta X_{k,limit}$ to $X_k$
Line 18: Increment solver iteration counter (solviter)
Line 19: if maximum iteration count reached, restore initial $x_k$ and go to the end in line 24.
Line 20: Perform convergence test (cf.213)
Line 21: if not converged, set $x_k=x_{k+1}$ for the next iteration
Line 22: Repeat lines 3-21 while not converged
Line 23: Evaluate analysis procedure with the latest input parameter set $x_{k+1}$
Line 24: end.

Annex 3: Function: Compute Operator Currents COP

Pseudo code of the COP function that computes the 4 operator terminal currents $i_{op,D}$, $i_{op,B}$, $i_{op,G}$, $i_{op,S}$ flowing into the 4 transistor terminals D, B, G, S, assuming that the 3 MOS currents ($i_D$ flowing into the Drain, $i_G$ into the Gate and $i_B$ flowing out of the Bulk) are known, for each of the four configurations NBND, NBD, BND, BD (code used or either NMOS or PMOS transistors):

```
1:   function      ComputeOperatorCurrents( )
2:   Inputs        Type, i_D, i_G, i_b
3:   Outputs       i_op,D, i_op,G, i_op,S, i_op,B
4:   Implements
5:       switch(Type)
6:           case NBND:
7:               i_op,D = i_D
8:               i_op,B = –i_B
9:               i_op,G = i_G
10:              i_op,S = –i_D – i_G + i_B
11:          case NBD:
12:              i_op,D = i_D + i_G
13:              i_op,B = –i_B
14:              i_op,G = i_G
15:              i_op,S = –i_D – i_G + i_B
16:          case BND:
17:              i_op,D = i_D
18:              i_op,B = –i_B
19:              i_op,G = i_G
20:              i_op,S = –i_D + i_G
21:          case BD:
22:              i_op,D = i_D + i_G
23:              i_op,B = i_B
24:              i_op,G = i_G
25:              i_op,S = –i_D – i_G
26:  end function
```

Annex 4: Operator OPI Program
The operator OPI is referenced in FIG. 13 with reference to the line numbers of the following pseudo code.
In Case of Configurations NBND and NBD
Pseudo code of the time-dependent OPI operator that computes threshold voltage $V_{th}^{k+1}$ and the time varying currents $i_{op,D}^{k+1}$, $i_{op,B}^{k+1}$, $i_{op,G}^{k+1}$, $i_{op,S}^{k+1}$ flowing into the 4 transistor's terminals assuming that the temperature, the transistor's sizes (width and length) as well as the 4 terminal voltages $V_D^{k+1}$, $V_G^{k+1}$, $V_S^{k+1}$, $V_B^{k+1}$ at current time step index k+1 and $V_D^k$, $V_G^k$, $V_S^k$, $V_B^k$ at previous time step index k are known, when the Source and the Bulk terminals are unconnected:

```
1:   Operator   OPI
2:   Inputs     Type, TimeStep, k
3:              Temp, W, L, V_D^{k+1}, V_G^{k+1}, V_S^{k+1}, V_B^{k+1},
4:              V_D^k, V_G^k, V_S^k, V_B^k,
5:   Outputs    i_op,D^{k+1}, i_op,G^{k+1}, i_op,S^{k+1}, i_op,B^{k+1}, V_th^{k+1}
6:   Implements
7:       /* Compute source referenced voltages at previous time k */
8:       Let V_DS^k = V_D^k – V_S^k
9:       Let V_GS^k = V_G^k – V_S^k
10:      Let V_BS^k = V_B^k – V_S^k
11:      /* Compute source referenced voltages at current time k+1 */
12:      Let V_DS^{k+1} = V_D^{k+1} – V_S^{k+1}
```

-continued

13:  Let $V_{GS}^{k+1} = V_G^{k+1} - V_S^{k+1}$
14:  Let $V_{BS}^{k+1} = V_B^{k+1} - V_S^{k+1}$
16:  /* Compute derivatives at current time k+1 using Backward Euler Formula */

17:  Let $\dfrac{dV_{DS}^{k+1}}{dt} = \dfrac{V_{DS}^{k+1} - V_{DS}^k}{\text{TimeStep}}$ 18:  Let $\dfrac{dV_{GS}^{k+1}}{dt} = \dfrac{V_{GS}^{k+1} - V_{GS}^k}{\text{TimeStep}}$ 19:  Let $\dfrac{dV_{BS}^{k+1}}{dt} = \dfrac{V_{BS}^{k+1} - V_{BS}^k}{\text{TimeStep}}$ 20:  Set Temp, W, L, $V_{DS}^{k+1}$, $V_{GS}^{k+1}$, $V_{BS}^{k+1}$ in simulator
21:  Do a single DC simulation
22:  Extract $I_D^{k+1}$, $I_B^{k+1}$, $C_{DG}^{k+1}$, $C_{DD}^{k+1}$, $C_{DB}^{k+1}$,
     $C_{GG}^{k+1}$, $C_{GD}^{k+1}$, $C_{GB}^{k+1}$, $C_{BG}^{k+1}$, $C_{BD}^{k+1}$, $C_{BB}^{k+1}$
23:  Compute transient drain terminal current $i_D^{k+1}$ using $$i_D^{k+1} = I_D^{k+1} - C_{DG}^{k+1} \cdot \frac{dV_{GS}^{k+1}}{dt} + C_{DD}^{k+1} \cdot \frac{dV_{DS}^{k+1}}{dt} - C_{DB}^{k+1} \cdot \frac{dV_{BS}^{k+1}}{dt}$$

24:  Compute transient gate terminal current $i_G^{k+1}$ using $$i_G^{k+1} = C_{GG}^{k+1} \cdot \frac{dV_{GS}^{k+1}}{dt} - C_{GD}^{k+1} \cdot \frac{dV_{DS}^{k+1}}{dt} - C_{GB}^{k+1} \cdot \frac{dV_{BS}^{k+1}}{dt}$$

25:  Compute transient bulk terminal $i_B^{k+1}$ using $$i_B^{k+1} = I_B^{k+1} - C_{BG}^{k+1} \cdot \frac{dV_{GS}^{k+1}}{dt} - C_{BD}^{k+1} \cdot \frac{dV_{DS}^{k+1}}{dt} + C_{BB}^{k+1} \cdot \frac{dV_{BS}^{k+1}}{dt}$$

26:  Call $[i_{op,D}^{k+1}, i_{op,G}^{k+1}, i_{op,S}^{k+1}, i_{op,B}^{k+1}]$ = ComputeOperatorCurrents(Type, $i_D^{k+1}$, $i_G^{k+1}$, $i_B^{k+1}$)
27:  Get $V_{th}^{k+1}$ from simulator
28:  Return $[i_{op,D}^{k+1}, i_{op,G}^{k+1}, i_{op,S}^{k+1}, i_{op,B}^{k+1}, V_{th}^{k+1}]$
29:  end operator Line 7 to 10: the source referenced voltages at previous time step index (k) are computed from the 4 terminals' voltages.

Line 11 to 14: the source referenced voltages at time step index (k+1) are computed from the 4 terminals' voltages.

Line 16 to 19: the source referenced voltages' time-derivatives at time step index (k+1) are computed using Backward-Euler formulation.

Line 20 to 21, a DC resolution of the MOS transistor is performed (either through a built-in model or by a call to a DC simulator).

Line 22, the updated drain and bulk DC currents as well as the MOS capacitances are extracted from the DC resolution.

Line 23, the time varying drain terminal current $i_D^{k+1}$ is updated, based on the updated DC value of the current and the MOS capacitances.

Line 24, the time varying gate terminal current $i_G^{k+1}$ is updated, based on the updated MOS capacitances.

Line 25, the time varying bulk terminal current $i_B^{k+1}$ is updated, based on the updated DC value of the current and the MOS capacitances.

Line 26, the terminals' input $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$, and $i_B^{k+1}$ currents using the COP function presented hereabove.

Line 27, the updated value of the threshold voltage $V_{th}^{k+1}$ is extracted from the DC resolution.

Line 29, the 4 terminals' currents and the threshold voltage at time step index k+1 are returned.

In case of configurations BND and BD

Pseudo code of the time-dependent OPI operator that computes threshold voltage $V_{th}^{k+1}$ and the time-varying currents $i_{op,D}^{k+1}$, $i_{op,B}^{k+1}$, $i_{op,G}^{k+1}$, $i_{op,S}^{k+1}$ flowing into the 4 transistor's terminals assuming that the temperature, the transistor's sizes (width and length) as well as the 4 terminal voltages $V_D^{k+1}$, $V_G^{k+1}$, $V_S^{k+1}$, $V_B^{k+1}$ at current time step index k+1 and $V_D^k$, $V_G^k$, $V_S^k$, $V_B^k$ at previous time step index k are known, when the Source and the Bulk terminals are equal:

1:  Operator  OPI
2:  Inputs    Type, TimeStep, k
3:            Temp, W, L, $V_D^{k+1}$, $V_G^{k+1}$, $V_S^{k+1}$
4:            $V_D^k$, $V_G^k$, $V_S^k$
5:  Outputs   $i_{op,D}^{k+1}$, $i_{op,G}^{k+1}$, $i_{op,S}^{k+1}$, $i_{op,B}^{k+1}$, $V_{th}^{k+1}$
6:  Implements
7:    /* Bulk-Source connected transistor */
8:    Let $V_B^k = V_S^k$ 9: Let $V_B^{k+1} = V_S^{k+1}$
10: /* Compute source referenced voltages at previous time k */
11: Let $V_{DS}^k = V_D^k - V_S^k$
12: Let $V_{GS}^k = V_G^k - V_S^k$
13: Let $V_{BS}^k = 0.0$
14: /* Compute source referenced voltages at current time k+1 */
15: Let $V_{DS}^{k+1} = V_D^{k+1} - V_S^{k+1}$
16: Let $V_{GS}^{k+1} = V_G^{k+1} - V_S^{k+1}$
17: Let $V_{BS}^{k+1} = 0.0$
18: /* Compute derivatives at current time k+1 using Backward Euler Formula */

19: Let $\dfrac{dV_{DS}^{k+1}}{dt} = \dfrac{V_{DS}^{k+1} - V_{DS}^k}{\text{TimeStep}}$ 20: Let $\dfrac{dV_{GS}^{k+1}}{dt} = \dfrac{V_{GS}^{k+1} - V_{GS}^k}{\text{TimeStep}}$ 21: Let $\dfrac{dV_{BS}^{k+1}}{dt} = 0.0$ 22: Set Temp, W, L, $V_{DS}^{k+1}$, $V_{GS}^{k+1}$, $V_{BS}^{k+1}$ in simulator
23: Do a single DC simulation
24: Extract $I_D^{k+1}$, $I_B^{k+1}$, $C_{DG}^{k+1}$, $C_{DD}^{k+1}$, $C_{DB}^{k+1}$, $C_{GG}^{k+1}$, $C_{GD}^{k+1}$, $C_{GB}^{k+1}$, $C_{BG}^{k+1}$, $C_{BD}^{k+1}$, $C_{BB}^{k+1}$
25: Compute transient drain terminal current $i_D^{k+1}$ using $$i_D^{k+1} = I_D^{k+1} - C_{DG}^{k+1} \cdot \dfrac{dV_{GS}^{k+1}}{dt} + C_{DD}^{k+1} \cdot \dfrac{dV_{DS}^{k+1}}{dt} - C_{DB}^{k+1} \cdot \dfrac{dV_{BS}^{k+1}}{dt}$$

26: Compute transient gate terminal current $i_G^{k+1}$ using $$i_G^{k+1} = C_{GG}^{k+1} \cdot \dfrac{dV_{GS}^{k+1}}{dt} - C_{GD}^{k+1} \cdot \dfrac{dV_{DS}^{k+1}}{dt} - C_{GB}^{k+1} \cdot \dfrac{dV_{BS}^{k+1}}{dt}$$

27: Compute transient bulk terminal $i_B^{k+1}$ using $$i_B^{k+1} = I_B^{k+1} - C_{BG}^{k+1} \cdot \dfrac{dV_{GS}^{k+1}}{dt} - C_{BD}^{k+1} \cdot \dfrac{dV_{DS}^{k+1}}{dt} + C_{BB}^{k+1} \cdot \dfrac{dV_{BS}^{k+1}}{dt}$$

28: Call $[i_{op,D}^{k+1}, i_{op,G}^{k+1}, i_{op,S}^{k+1}, i_{op,B}^{k+1}]$ = ComputeOperatorCurrents(Type, $i_D^{k+1}$, $i_G^{k+1}$, $i_B^{k+1}$)
29: Get $V_{th}^{k+1}$ from simulator
30: Return $[i_{op,D}^{k+1}, i_{op,G}^{k+1}, i_{op,S}^{k+1}, i_{op,B}^{k+1}, V_{th}^{k+1}]$
31: end operator Line 7 to 9: the Bulk voltage is set equal to the Source voltage Line 10 to 13: the source referenced voltages at previous time step index (k) are computed Line 14 to 17: the source referenced voltages at time step index (k+1) are computed Line 18 to 21: the source referenced voltages' time-derivatives at time step index (k+1) are updated using Backward-Euler formulation.

Line 22 to 23, a DC resolution of the MOS transistor is performed (either through a built-in model or by a call to a DC simulator).

Line 24, the updated drain and bulk DC currents as well as the MOS capacitances are extracted from the DC resolution.

Line 25, the time varying drain terminal current $i_D^{k+1}$ is updated, based on the updated DC value of the current and the MOS capacitances.

Line 26, the time varying gate terminal current $i_G^{k+1}$ is updated, based on the updated MOS capacitances.

Line 27, the time varying bulk terminal current $i_B^{k+1}$ is updated, based on the updated DC value of the current and the MOS capacitances.

Line 28, the terminals' input currents $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function presented hereabove Line 29, the updated value of the threshold voltage $V_{th}^{k+1}$ is extracted from the DC resolution.

Line 31, the terminals' currents and the threshold voltage at time step index k+1 are returned.

Annex 5: Operator OPVG

The operator OPVG is referenced in FIG. 14 with reference to the line numbers of the following pseudo code.

In Case of Configuration NBND

Pseudo code of the time-dependent OPVG operator that computes the time-varying Gate Terminal voltage $V_G^{k+1}$ and threshold voltage $V_{th}^{k+1}$ and the time-varying currents $i_{op,D}^{k+1}$, $i_{op,B}^{k+1}$, $i_{op,G}^{k+1}$, $i_{op,S}^{k+1}$ flowing into the 4 transistor's terminals at current time step index k+1, assuming that the temperature, the transistor's sizes (width and length), the 3 terminal voltages $V_D^{k+1}$, $V_S^{k+1}$, $V_B^{k+1}$ at current time step index k+1 and $V_D^k$, $V_S^k$, $V_B^k$ and $V_G^k$ at previous time step index k as well as the requested current $i_{reqop,D}^{k+1}$ at time step index k+1 are known, when the Source and the Bulk terminals are unconnected, with the same code applying for the NMOS and PMOS transistors:

```
1:  Operator    OPVG
2:  Inputs      Type, SolverIter, TimeStep, k
3:              Temp, W, L, V_D^{k+1}, V_S^{k+1}, V_B^{k+1}
4:              V_D^k, V_G^k, V_S^k, V_B^k, i_{reqop,D}^{k+1}
5:  Outputs     V_G^{k+1}, i_{op,D}^{k+1}, i_{op,G}^{k+1}, i_{op,S}^{k+1}, i_{op,B}^{k+1}, V_{th}^{k+1}
6:  Implements
7:      /* Check transistor type */
8:      If Type is bulk/source connected or diode connected
9:          error_message("Cannot handle this transistor type");
10:         Return NULL ;
11:     If SolverIter == 0 then
12:         /* Initialize gate voltage at time k+1 */
13:         Let V_G^{k+1} + V_G^k
14:     /* Compute source referenced voltages at previous time k */
15:     Let V_{DS}^k = V_D^k - V_S^k
16:     Let V_{GS}^k = V_G^k - V_S^k
17:     Let V_{BS}^k = V_B^k - V_S^k
18:     Let opiter = 0
19:     Let i_G^{k+1} = 0
20:     Let i_B^{k+1} = 0
21:     Do
22:         /* Compute source referenced voltages at current time k+1 */
23:         Let V_{DS}^{k+1} = V_D^{k+1} - V_S^{k+1}
24:         Let V_{GS}^{k+1} = V_G^{k+1} - V_S^{k+1}
25:         Let V_{BS}^{k+1} = V_B^{k+1} - V_S^{k+1}
26:         /* Compute time derivatives at current time k+1 using Backward Euler Formula */
```

27:
$$\text{Let } \frac{dV_{DS}^{k+1}}{dt} = \frac{V_{DS}^{k+1} - V_{DS}^k}{\text{TimeStep}}$$

28:
$$\text{Let } \frac{dV_{GS}^{k+1}}{dt} = \frac{V_{GS}^{k+1} - V_{GS}^k}{\text{TimeStep}}$$

29:
$$\text{Let } \frac{dV_{BS}^{k+1}}{dt} = \frac{V_{BS}^{k+1} - V_{BS}^k}{\text{TimeStep}}$$

```
30:         Set Temp, W, L, V_{DS}^{k+1}, V_{GS}^{k+1}, V_{BS}^{k+1} in simulator
31:         Do a single DC simulation
32:         Extract I_D^{k+1}, I_B^{k+1}, C_{DG}^{k+1}, C_{DD}^{k+1}, C_{DB}^{k+1},
                    C_{GG}^{k+1}, C_{GD}^{k+1}, C_{GB}^{k+1}, C_{BG}^{k+1}, C_{BD}^{k+1}, C_{BB}^{k+1}
33:         Let i_{G,prev}^{k+1} = i_G^{k+1}
34:         Let i_{B,prev}^{k+1} = i_B^{k+1}
35:         Compute transient drain terminal current i_D^{k+1} using
```

$$i_D^{k+1} = I_D^{k+1} - C_{DG}^{k+1} \cdot \frac{dV_{GS}^{k+1}}{dt} + C_{DD}^{k+1} \cdot \frac{dV_{DS}^{k+1}}{dt} - C_{DB}^{k+1} \cdot \frac{dV_{BS}^{k+1}}{dt}$$

```
36:         Compute transient gate terminal current i_G^{k+1} using
```

$$i_G^{k+1} = C_{GG}^{k+1} \cdot \frac{dV_{GS}^{k+1}}{dt} - C_{GD}^{k+1} \cdot \frac{dV_{DS}^{k+1}}{dt} - C_{GB}^{k+1} \cdot \frac{dV_{BS}^{k+1}}{dt}$$

```
37:         Compute transient bulk terminal i_B^{k+1} using
```

$$i_B^{k+1} = I_B^{k+1} - C_{BG}^{k+1} \cdot \frac{dV_{GS}^{k+1}}{dt} - C_{BD}^{k+1} \cdot \frac{dV_{DS}^{k+1}}{dt} + C_{BB}^{k+1} \cdot \frac{dV_{BS}^{k+1}}{dt}$$

```
38:         Compute new DC component I_{D,new} from i_{reqop,D}^{k+1} using
```

$$I_{D,new} = i_{reqop,D}^{k+1} + C_{DG}^{k+1} \cdot \frac{dV_{GS}^{k+1}}{dt} - C_{DD}^{k+1} \cdot \frac{dV_{DS}^{k+1}}{dt} + C_{DB}^{k+1} \cdot \frac{dV_{BS}^{k+1}}{dt}$$

```
39:         Let V_{G,prev}^{k+1} = V_S^{k+1} + V_{GS}^{k+1}
40:         Solve for V_{GS}^{k+1} using I_{D,desired} = I_{D,new} in equation 3.1.
41:         Let V_G^{k+1} = V_S^{k+1} + V_{GS}^{k+1}
42:         Increment opiter
43:         If opiter >= MAX_ITERATIONS then
44:             error_message("Maximum iterations reached.");
45:             Return NULL;
46:     Loop Until | V_G^{k+1} - V_{G,prev}^{k+1} | ≤ ε_{rel,v} · max(| V_G^{k+1} |, | V_{G,prev}^{k+1} |) + ε_{abs,v}
47:         and | i_D^{k+1} - i_{reqop,D}^{k+1} | ≤ ε_{rel,i} · max(| i_D^{k+1} |, | i_{reqop,D}^{k+1} |) + ε_{abs,i}
48:         and | i_G^{k+1} - i_{G,prev}^{k+1} | ≤ ε_{rel,i} · max(| i_G^{k+1} |, | i_{G,prev}^{k+1} |) + ε_{abs,i}
49:         and | i_B^{k+1} - i_{B,prev}^{k+1} | ≤ ε_{rel,i} · max(| i_B^{k+1} |, | i_{B,prev}^{k+1} |) + ε_{abs,i}
50:     Call [i_{op,D}^{k+1}, i_{op,G}^{k+1}, i_{op,S}^{k+1}, i_{op,B}^{k+1}] = ComputeOperatorCurrents(Type, i_D^{k+1}, i_G^{k+1}, i_B^{k+1})
51:     Get V_{th}^{k+1} from simulator
```

| | |
|---|---|
| 52: | Return [$V_G^{k+1}$, $i_{op,D}^{k+1}$, $i_{op,G}^{k+1}$, $i_{op,S}^{k+1}$, $i_{op,B}^{k+1}$, $V_{th}^{k+1}$] |
| 53: | end operator |

Line 7 to 10, the configuration NBND of the transistor is checked

Line 11 to 17, when the solver is first called to solve for current time step index (k+1), VG is initialized with previous value of time step index k and the source referenced voltages at previous time step index (k) are computed from the 4 terminals' voltages.

Line 18 to 20, opiter, $i_G^{k+1}$ and $i_B^{k+1}$ are set to 0

Line 21, The loop to solve $V_G^{k+1}$ at time step index (k+1) is executed.

Line 22 to 25: the source referenced voltages at time step index (k+1) are computed from the 4 terminals' voltages.

Line 26 to 29: the source referenced voltages' time-derivatives at time step index (k+1) are computed using Backward-Euler formulation.

Line 30 to 31, a DC resolution of the MOS transistor is performed (either through a built-in model or by a call to a DC simulator).

Line 32, the updated drain and bulk DC currents as well as the MOS capacitances are extracted from the DC resolution.

Line 33 to 34, current values of gate and bulk current are stored.

Line 35, the time varying drain terminal current $i_D^{k+1}$ updated, based on the updated DC value of the current and the MOS capacitances.

Line 36, the time varying gate terminal current $i_G^{k+1}$ is updated, based on the updated MOS capacitances.

Line 37, the time varying bulk terminal current $i_B^{k+1}$ is updated, based on the updated DC value of the current and the MOS capacitances.

Line 38, the new DC component of the drain current ID,new is guessed from the $i_{reqop,D}^{k+1}$ required drain current at time step index k+1 and the MOS capacitances.

Line 39, Current value for $V_G^{k+1}$ at time step index k+1 is computed and stored.

Line 40, New value for $V_{GS}^{k+1}$ is estimated from the desired DC value of the drain current ID,new Line 41, New value for $V_G^{k+1}$ is estimated at time step index k+1

Line 42 opiter is incremented to count number of iterations performed.

Line 43 to 45, a test is performed on the opiter's maximum value to stop the loop.

Line 46 to 49, a convergence criteria is evaluated to stop the loop

Line 50, the terminals' input currents $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function Line 51, the updated value of the threshold voltage $V_{th}^{k+1}$ is extracted from the DC resolution.

Line 52, $V_G^{k+1}$ voltage as well as the 4 terminals' currents and the threshold voltage at time step index k+1 are returned.

In Case of Configuration BND

Pseudo code of the time-dependent OPVG operator that computes the time-varying Gate Terminal voltage $V_G^{k+1}$ and threshold voltage $V_{th}^{k+1}$ and the time-varying currents $i_{op,D}^{k+1}$, $i_{op,B}^{k+1}$, $i_{op,G}^{k+1}$, $i_{op,S}^{k+1}$ flowing into the 4 transistor's terminals at current time step index k+1, assuming that the temperature, the transistor's sizes (width and length), the 2 terminal voltages $V_D^{k+1}$, $V_S^{k+1}$ at current time step index k+1 and $V_D^k$, $V_S^k$ and $V_G^k$ at previous time step index k as well as the requested current $k_{reqop,D}^{k+1}$ at time step index k+1 are known, when the Source and the Bulk terminals are equal, with the same code applying for the NMOS and PMOS transistors:

```
1:  Operator   OPVG
2:  Inputs     Type, SolverIter, TimeStep, k
3:             Temp, W, L, V_D^{k+1}, V_S^{k+1}
4:             V_D^k, V_G^k, V_S^k, i_{reqop,D}^{k+1}
5:  Outputs    V_{GS}^{k+1}, i_{op,D}^{k+1}, i_{op,G}^{k+1}, i_{op,S}^{k+1}, i_{op,B}^{k+1}, V_{th}^{k+1}
6:  Implements
7:     /* Check transistor type */
8:     If Type is bulk/source disconnected or diode connected then
9:        error_message("Cannot handle this transistor type");
10:       Return NULL ;
11:    If SolverIter == 0 then
12:       /* Initialize gate voltage at time k+1 */
13:       Let V_G^{k+1} + V_G^k
14:       /* Compute source referenced voltages at previous time k */
15:       Let V_{DS}^k = V_D^k - V_S^k
16:       Let V_{GS}^k = V_G^k - V_S^k
17:       Let V_{BS}^k = 0.0
18:    /* Transistor Bulk-Source Connected */
19:    Let V_B^{k+1} = V_S^{k+1}
20:    Let opiter = 0
21:    Let i_G^{k+1} = 0
22:    Let i_B^{k+1} = 0
23:    Do
24:       /* Compute source referenced voltages at current time k+1 */
25:       Let V_{DS}^{k+1} = V_D^{k+1} - V_S^{k+1}
26:       Let V_{GS}^{k+1} = V_G^{k+1} - V_S^{k+1}
27:       Let V_{BS}^{k+1} = 0.0
28:       /* Compute time derivatives at current time k+1 using Backward Euler Formula */
```

-continued

29: Let $\dfrac{dV_{DS}^{k+1}}{dt} = \dfrac{V_{DS}^{k+1} - V_{DS}^{k}}{\text{TimeStep}}$ 30: Let $\dfrac{dV_{GS}^{k+1}}{dt} = \dfrac{V_{GS}^{k+1} - V_{GS}^{k}}{\text{TimeStep}}$ 31: Let $\dfrac{dV_{BS}^{k+1}}{dt} = 0.0$ 32: Set Temp, W, L, $V_{DS}^{k+1}$, $V_{GS}^{k+1}$, $V_{BS}^{k+1}$ in simulator
33: Do a single DC simulation
34: Extract $I_D^{k+1}$, $I_B^{k+1}$, $C_{DG}^{k+1}$, $C_{DD}^{k+1}$, $C_{DB}^{k+1}$,
    $C_{GG}^{k+1}$, $C_{GD}^{k+1}$, $C_{GB}^{k+1}$, $C_{BG}^{k+1}$, $C_{BD}^{k+1}$, $C_{BB}^{k+1}$
35: Let $i_{G,prev}^{k+1} = i_G^{k+1}$
36: Let $i_{B,prev}^{k+1} = i_B^{k+1}$
37: Compute transient drain terminal current $i_D^{k+1}$ using $$i_D^{k+1} = I_D^{k+1} - C_{DG}^{k+1} \cdot \dfrac{dV_{GS}^{k+1}}{dt} + C_{DD}^{k+1} \cdot \dfrac{dV_{DS}^{k+1}}{dt} - C_{DB}^{k+1} \cdot \dfrac{dV_{BS}^{k+1}}{dt}$$

38: Compute transient gate terminal current $i_G^{k+1}$ using $$i_G^{k+1} = C_{GG}^{k+1} \cdot \dfrac{dV_{GS}^{k+1}}{dt} - C_{GD}^{k+1} \cdot \dfrac{dV_{DS}^{k+1}}{dt} - C_{GB}^{k+1} \cdot \dfrac{dV_{BS}^{k+1}}{dt}$$

39: Compute transient bulk terminal $i_B^{k+1}$ using $$i_B^{k+1} = I_B^{k+1} - C_{BG}^{k+1} \cdot \dfrac{dV_{GS}^{k+1}}{dt} - C_{BD}^{k+1} \cdot \dfrac{dV_{DS}^{k+1}}{dt} + C_{BB}^{k+1} \cdot \dfrac{dV_{BS}^{k+1}}{dt}$$

40: Compute new DC component $I_{D,new}$ from $i_{reqop,D}^{k+1}$ using $$I_{D,new} = i_{reqop,D}^{k+1} + C_{DG}^{k+1} \cdot \dfrac{dV_{GS}^{k+1}}{dt} - C_{DD}^{k+1} \cdot \dfrac{dV_{DS}^{k+1}}{dt} + C_{DB}^{k+1} \cdot \dfrac{dV_{BS}^{k+1}}{dt}$$

41: Let $V_{G,prev}^{k+1} = V_S^{k+1} + V_{GS}^{k+1}$
42: Solve for $V_{GS}^{k+1}$ using $I_{D,desired} = I_{D,new}$ in equation 3.1
43: Let $V_G^{k+1} = V_S^{k+1} + V_{GS}^{k+1}$
44: Increment opiter
45: If opiter >= MAX_ITERATIONS then
46:     error_message("Maximum iterations reached.");
47:     Return NULL;
48: Loop Until $| V_G^{k+1} - V_{G,prev}^{k+1} | \le \epsilon_{rel,v} \cdot \max(| V_G^{k+1} |, | V_{G,prev}^{k+1} |) + \epsilon_{abs,v}$
49:     and $| i_D^{k+1} - i_{reqop,D}^{k+1} | \le \epsilon_{rel,i} \cdot \max(| i_D^{k+1} |, | i_{reqop,D}^{k+1} |) + \epsilon_{abs,i}$
50:     and $| i_G^{k+1} - i_{G,prev}^{k+1} | \le \epsilon_{rel,i} \cdot \max(| i_G^{k+1} |, | i_{G,prev}^{k+1} |) + \epsilon_{abs,i}$
51:     and $| i_B^{k+1} - i_{B,prev}^{k+1} | \le \epsilon_{rel,i} \cdot \max(| i_B^{k+1} |, | i_{B,prev}^{k+1} |) + \epsilon_{abs,i}$
52: Call $[i_{op,D}^{k+1}, i_{op,G}^{k+1}, i_{op,S}^{k+1}, i_{op,B}^{k+1}]$ = ComputeOperatorCurrents(Type, $i_D^{k+1}$, $i_G^{k+1}$, $i_B^{k+1}$)
53: Get $V_{th}^{k+1}$ from simulator
54: Return $[V_G^{k+1}, i_{op,D}^{k+1}, i_{op,G}^{k+1}, i_{op,S}^{k+1}, i_{op,B}^{k+1}, V_{th}^{k+1}]$
55: end operator Line 7 to 10, the configuration BND of the transistor is checked Line 11 to 17, when the solver is first called to solve for current time step index k+1 $V_G^{k+1}$ is initialized with previous value of time step index (k), and the source referenced voltages at previous time step index (k) are computed from the 4 terminals' voltages.

Line 18 to 19, The bulk voltage is made equal to the source voltage.

Line 20 to 22, opiter, $i_G^{k+1}$ and $i_B^{k+1}$ are set to 0

Line 23, The loop to solve $V_G^{k+1}$ at time step index k+1 is executed.

Line 24 to 27: the source referenced voltages at time step index (k+1) are computed from the 4 terminals' voltages.

Line 28 to 31: the source referenced voltages' time-derivatives at time step index (k+1) are computed using Backward-Euler formulation.

Line 32 to 33, a DC resolution of the MOS transistor is performed (either through a built-in model or by a call to a DC simulator).

Line 34, the updated drain and bulk DC currents as well as the MOS capacitances are extracted from the DC resolution.

Line 35 to 36, current values of gate and bulk current are stored.

Line 37, the time varying drain terminal current $i_D^{k+1}$ is updated, based on the updated DC value of the current and the MOS capacitances.

Line 38, the time varying gate terminal current $i_G^{k+1}$ is updated, based on the updated MOS capacitances.

Line 39, the time varying bulk terminal current $i_B^{k+1}$ is updated, based on the updated DC value of the current and the MOS capacitances.

Line 40, the new DC component of the drain current ID,new is guessed from the $i_{reqop,D}^{k+1}$ required drain current at time step index k+1 and the MOS capacitances.

Line 41, Current value for $V_G^{k+1}$ at time step index k+1 is computed and stored.

Line 42, New value for $V_{GS}^{k+1}$ is estimated from the desired DC value of the drain current ID,new Line 43, New value for $V_G^{k+1}$ is estimated at time step index k+1

Line 44 opiter is incremented to count number of iterations performed.

Line 45 to 47, a test is performed on the opiter's maximum value to stop the loop.

Line 48 to 51, a convergence criteria is evaluated to stop the loop

Line 52, the terminals' input currents $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function.

Line 53, the updated value of the threshold voltage $V_{th}^{k+1}$ is extracted from the DC resolution.

Line 54, $V_G^{k+1}$ voltage as well as the 4 terminals' currents and the threshold voltage at time step index k+1 are returned.

Annex 6: Operator OPVS

The operator OPVS is referenced in FIG. 15 with reference to the line numbers of the following pseudo code.

In Case of Configuration NBND

Pseudo code of the time-dependent OPVS operator that computes the time-varying Source Terminal voltage $V_S^{k+1}$ and threshold voltage $V_{th}^{k+1}$ and the time-varying currents $i_{op,D}^{k+1}$, $i_{op,B}^{k+1}$, $i_{op,G}^{k+1}$, $i_{op,S}^{k+1}$ flowing into the 4 transistor's terminals at current time step index k+1, assuming that the temperature, the transistor's sizes (width and length), the 3 terminal voltages $V_D^{k+1}$, $V_G^{k+1}$, $V_B^{k+1}$ at current time step index k+1 and $V_D^k$, $V_G^k$, $V_B^k$ and $V_S^k$ at previous time step index k as well as the requested current $i_{reqop,D}^{k+1}$ at time step index k+1 are known, when the Source and the Bulk terminals are in unconnected configuration (NBND), with the same code applying for the NMOS and PMOS transistors:

```
1:   Operator   OPVS
2:   Inputs     Type, SolverIter, TimeStep, k
3:              Temp, W, L, V_D^{k+1}, V_G^{k+1}, V_B^{k+1}
4:              V_D^k, V_G^k, V_S^k, V_B^k, i_{reqop,D}^{k+1}
5:   Outputs    V_S^{k+1}, i_{op,D}^{k+1}, i_{op,G}^{k+1}, i_{op,S}^{k+1}, i_{op,B}^{k+1}, V_{th}^{k+1}
6:   Implements
7:       /* Check transistor type */
8:       If Type is bulk/source connected or diode connected then
9:           error_message("Cannot handle this transistor type");
10:          Return NULL ;
11:      If SolverIter == 0 then
12:          /* Initialize source voltage at time k+1 */
13:          Let V_S^{k+1} + V_S^k
14:      /* Compute source referenced voltages at previous time k */
15:      Let V_{DS}^k = V_D^k - V_S^k
16:      Let V_{GS}^k = V_G^k - V_S^k
17:      Let V_{BS}^k = V_B^k - V_S^k
18:      Let opiter = 0
19:      Let i_G^{k+1} = 0
20:      Let i_B^{k+1} = 0
21:      Do
22:          /* Compute source referenced voltages at current time k+1 */
23:          Let V_{DS}^{k+1} = V_D^{k+1} - V_S^{k+1}
24:          Let V_{GS}^{k+1} = V_G^{k+1} - V_S^{k+1}
25:          Let V_{BS}^{k+1} = V_B^{k+1} - V_S^{k+1}
26:          /* Compute time-derivatives at current time k+1 using Backward Euler Formula */
```

27:
$$\text{Let } \frac{dV_{DS}^{k+1}}{dt} = \frac{V_{DS}^{k+1} - V_{DS}^k}{\text{TimeStep}}$$

28:
$$\text{Let } \frac{dV_{GS}^{k+1}}{dt} = \frac{V_{GS}^{k+1} - V_{GS}^k}{\text{TimeStep}}$$

29:
$$\text{Let } \frac{dV_{BS}^{k+1}}{dt} = \frac{V_{BS}^{k+1} - V_{BS}^k}{\text{TimeStep}}$$

```
30:      Set Temp, W, L, V_{DS}^{k+1}, V_{GS}^{k+1}, V_{BS}^{k+1} in simulator
31:      Do a single DC simulation
32:      Extract I_D^{k+1}, I_B^{k+1}, C_{DG}^{k+1}, C_{DD}^{k+1}, C_{DB}^{k+1},
                 C_{GG}^{k+1}, C_{GD}^{k+1}, C_{GB}^{k+1}, C_{BG}^{k+1}, C_{BD}^{k+1}, C_{BB}^{k+1}
33:      Let i_{G,prev}^{k+1} = i_G^{k+1}
34:      Let i_{B,prev}^{k+1} = i_B^{k+1}
35:      Compute transient drain terminal current i_D^{k+1} using
```

$$i_D^{k+1} = I_D^{k+1} - C_{DG}^{k+1} \cdot \frac{dV_{GS}^{k+1}}{dt} + C_{DD}^{k+1} \cdot \frac{dV_{DS}^{k+1}}{dt} - C_{DB}^{k+1} \cdot \frac{dV_{BS}^{k+1}}{dt}$$

36: Compute transient gate terminal current $i_G^{k+1}$ using $$i_G^{k+1} = C_{GG}^{k+1} \cdot \frac{dV_{GS}^{k+1}}{dt} - C_{GD}^{k+1} \cdot \frac{dV_{DS}^{k+1}}{dt} - C_{GB}^{k+1} \cdot \frac{dV_{BS}^{k+1}}{dt}$$

-continued

37: Compute transient bulk terminal $i_B^{k+1}$ using $$i_B^{k+1} = I_B^{k+1} - C_{BG}^{k+1} \cdot \frac{dV_{GS}^{k+1}}{dt} - C_{BD}^{k+1} \cdot \frac{dV_{DS}^{k+1}}{dt} + C_{BB}^{k+1} \cdot \frac{dV_{BS}^{k+1}}{dt}$$

38: Compute new DC component $I_{D,new}$ from $i_{reqop,D}^{k+1}$ using $$I_{D,new} = i_{reqop,D}^{k+1} + C_{DG}^{k+1} \cdot \frac{dV_{GS}^{k+1}}{dt} - C_{DD}^{k+1} \cdot \frac{dV_{DS}^{k+1}}{dt} + C_{DB}^{k+1} \cdot \frac{dV_{BS}^{k+1}}{dt}$$

39:     Let $V_{S,prev}^{k+1} = V_G^{k+1} - V_{GS}^{k+1}$
40:     Solve for $V_{GS}^{k+1}$ using $I_{D,desired} = I_{D,new}$ in equation 3.1.
41:     Let $V_S^{k+1} = V_G^{k+1} - V_{GS}^{k+1}$
42:     Increment opiter
43:     If opiter >= MAX_ITERATIONS then
44:         error_message("Maximum iterations reached.");
45:         Return NULL;
46: Loop Until $|V_S^{k+1} - V_{S,prev}^{k+1}| \leq \epsilon_{rel,v} \cdot \max(|V_S^{k+1}|, |V_{S,prev}^{k+1}|) + \epsilon_{abs,v}$
47:     and $|i_D^{k+1} - i_{reqop,D}^{k+1}| \leq \epsilon_{rel,i} \cdot \max(|i_D^{k+1}|, |i_{reqop,D}^{k+1}|) + \epsilon_{abs,i}$
48:     and $|i_G^{k+1} - i_{G,prev}^{k+1}| \leq \epsilon_{rel,i} \cdot \max(|i_G^{k+1}|, |i_{G,prev}^{k+1}|) + \epsilon_{abs,i}$
49:     and $|i_B^{k+1} - i_{B,prev}^{k+1}| \leq \epsilon_{rel,i} \cdot \max(|i_B^{k+1}|, |i_{B,prev}^{k+1}|) + \epsilon_{abs,i}$
50: Call $[i_{op,D}^{k+1}, i_{op,G}^{k+1}, i_{op,S}^{k+1}, i_{op,B}^{k+1}]$ = ComputeOperatorCurrents(Type, $i_D^{k+1}, i_G^{k+1}, i_B^{k+1}$)
51: Get $V_{th}^{k+1}$ from simulator
52: Return $[V_S^{k+1}, i_{op,D}^{k+1}, i_{op,G}^{k+1}, i_{op,S}^{k+1}, i_{op,B}^{k+1}, V_{th}^{k+1}]$
53: end operator Line 7 to 10, the configuration NBND of the transistor is checked Line 11 to 17, when the solver is first called to solve for current time step index k+1, $V_S^{k+1}$ is initialized with previous value of time step index (k) and the source referenced voltages at previous time step index (k) are computed from the 4 terminals' voltages.

Line 18 to 20, opiter, $i_G^{k+1}$ and $i_B^{k+1}$ are set to 0

Line 21, The loop to solve $V_S^{k+1}$ at time step index k+1 is executed.

Line 22 to 25: the source referenced voltages at time step index (k+1) are computed from the 4 terminals' voltages.

Line 26 to 29: the source referenced voltages' time-derivatives at time step index (k+1) are computed using Backward-Euler formulation.

Line 30 to 31, a DC resolution of the MOS transistor is performed (either through a built-in model or by a call to a DC simulator).

Line 32, the updated drain and bulk DC currents as well as the MOS capacitances are extracted from the DC simulator resolution.

Line 33 to 34, current values of gate and bulk current are stored.

Line 35, the time varying drain terminal current $i_D^{k+1}$ is updated, based on the updated DC value of the current and the MOS capacitances.

Line 36, the time varying gate terminal current $i_G^{k+1}$ is updated, based on the updated MOS capacitances.

Line 37, the time varying bulk terminal current $i_B^{k+1}$ is updated, based on the updated DC value of the current and the MOS capacitances.

Line 38, the new DC component of the drain current ID,new is guessed from the $i_{reqop,D}^{k+1}$ required drain current at time step index k+1 and the MOS capacitances.

Line 39, Current value for $V_S^{k+1}$ at time step index k+1 is computed and stored.

Line 40, New value for $V_{GS}^{k+1}$ is estimated from the desired DC value of the drain current ID,new Line 41, New value for $V_S^{k+1}$ is estimated at time step index k+1

Line 42 opiter is incremented to count number of iterations performed.

Line 43 to 45, a test is performed on the opiter's maximum value to stop the loop.

Line 46 to 49, a convergence criteria is evaluated to stop the loop

Line 50, the terminals' input currents $i_{op,D}^{k+1}$, $i_{op,G}^{k+1}$, $i_{op,S}^{k+1}$, $i_{op,B}^{k+1}$ are computed from the $i_D^{k+1}, i_G^{k+1}$ and $i_B^{k+1}$ currents using the COP function.

Line 51, the updated value of the threshold voltage $V_{th}^{k+1}$ is extracted from the DC simulator resolution.

Line 52, $V_S^{k+1}$ voltage as well as the 4 terminals' currents and the threshold voltage at time step index k+1 are returned.

In Case of Configuration BND

Pseudo code of the time-dependent OPVS operator that computes the time-varying Source Terminal voltage $V_S^{k+1}$ and threshold voltage $V_{th}^{k+1}$ and the time-varying currents $i_{op,D}^{k+1}, i_{op,B}^{k+1}, i_{op,G}^{k+1}, i_{op,S}^{k+1}$ flowing into the 4 transistor's terminals at current time step index k+1, assuming that the temperature, the transistor's sizes (width and length), the 2 terminal voltages $V_D^{k+1}, V_G^{k+1}$ at current time step index k+1 and $V_D^k, V_G^k$ and $V_S^k$ at previous time step index k as well as the requested current $i_{reqop,D}^{k+1}$ at current time step index k+1 are known, when the Source and the Bulk terminals are equal, with the same code applying for the NMOS and PMOS transistors:

1: Operator     OPVS
2: Inputs       Type, SolverIter, TimeStep, k
3:                 Temp, W, L, $V_D^{k+1}, V_G^{k+1}$
4:                 $V_D^k, V_G^k, V_S^k, i_{reqop,D}^{k+1}$
5: Outputs     $V_S^{k+1}, i_{op,D}^{k+1}, i_{op,G}^{k+1}, i_{op,S}^{k+1}, i_{op,B}^{k+1}, V_{th}^{k+1}$ -continued

```
 6:   Implements
 7:      /* Check transistor type */
 8:      If Type is bulk/source disconnected or diode connected then
 9:         error_message("Cannot handle this transistor type");
10:         Return NULL ;
11:      If SolverIter == 0 then
12:         /* Initialize gate voltage at time k+1 */
13:         Let $V_S^{k+1} + V_S^k$
14:      /* Compute differential voltages at previous time k */
15:      Let $V_{DS}^k = V_D^k - V_S^k$
16:      Let $V_{GS}^k = V_G^k - V_S^k$
17:      Let $V_{BS}^k = 0.0$
18:      /* Transistor Bulk-Source Connected */
19:      Let $V_B^{k+1} = V_S^{k+1}$
20:      Let opiter = 0
21:      Let $i_G^{k+1} = 0$
22:      Let $i_B^{k+1} = 0$
23:      Do
24:         /* Compute differential voltages at current time k+1 */
25:         Let $V_{DS}^{k+1} = V_D^{k+1} - V_S^{k+1}$
26:         Let $V_{GS}^{k+1} = V_G^{k+1} - V_S^{k+1}$
27:         Let $V_{BS}^{k+1} = 0.0$
28:         /* Compute time derivatives at current time k+1 using Backward Euler Formula */

29:         Let $\dfrac{dV_{DS}^{k+1}}{dt} = \dfrac{V_{DS}^{k+1} - V_{DS}^k}{\text{TimeStep}}$ 30:         Let $\dfrac{dV_{GS}^{k+1}}{dt} = \dfrac{V_{GS}^{k+1} - V_{GS}^k}{\text{TimeStep}}$ 31:         Let $\dfrac{dV_{BS}^{k+1}}{dt} = 0.0$ 32:         Set Temp, W, L, $V_{DS}^{k+1}$, $V_{GS}^{k+1}$, $V_{BS}^{k+1}$ in simulator
33:         Do a single DC simulation
34:         Extract $I_D^{k+1}$, $I_B^{k+1}$, $C_{DG}^{k+1}$, $C_{DD}^{k+1}$, $C_{DB}^{k+1}$,
                    $C_{GG}^{k+1}$, $C_{GD}^{k+1}$, $C_{GB}^{k+1}$, $C_{BG}^{k+1}$, $C_{BD}^{k+1}$, $C_{BB}^{k+1}$
35:         Let $i_{G,prev}^{k+1} = i_G^{k+1}$
36:         Let $i_{B,prev}^{k+1} = i_B^{k+1}$
37:         Compute transient drain terminal current $i_D^{k+1}$ using $i_D^{k+1} = I_D^{k+1} - C_{DG}^{k+1} \cdot \dfrac{dV_{GS}^{k+1}}{dt} + C_{DD}^{k+1} \cdot \dfrac{dV_{DS}^{k+1}}{dt} - C_{DB}^{k+1} \cdot \dfrac{dV_{BS}^{k+1}}{dt}$ 38:         Compute transient gate terminal current $i_G^{k+1}$ using $i_G^{k+1} = C_{GG}^{k+1} \cdot \dfrac{dV_{GS}^{k+1}}{dt} - C_{GD}^{k+1} \cdot \dfrac{dV_{DS}^{k+1}}{dt} - C_{GB}^{k+1} \cdot \dfrac{dV_{BS}^{k+1}}{dt}$ 39:         Compute transient bulk terminal $i_B^{k+1}$ using $i_B^{k+1} = I_B^{k+1} - C_{BG}^{k+1} \cdot \dfrac{dV_{GS}^{k+1}}{dt} - C_{BD}^{k+1} \cdot \dfrac{dV_{DS}^{k+1}}{dt} + C_{BB}^{k+1} \cdot \dfrac{dV_{BS}^{k+1}}{dt}$ 40:         Compute new DC component $I_{D,new}$ from $i_{reqop,D}^{k+1}$ using $I_{D,new} = i_{reqop,D}^{k+1} + C_{DG}^{k+1} \cdot \dfrac{dV_{GS}^{k+1}}{dt} - C_{DD}^{k+1} \cdot \dfrac{dV_{DS}^{k+1}}{dt} + C_{DB}^{k+1} \cdot \dfrac{dV_{BS}^{k+1}}{dt}$ 41:         Let $V_{S,prev}^{k+1} = V_G^{k+1} + V_{GS}^{k+1}$
42:         Solve for $V_{GS}^{k+1}$ using $I_{D,desired} = I_{D,new}$ in equation 3.1
43:         Let $V_S^{k+1} = V_G^{k+1} - V_{GS}^{k+1}$
44:         Increment opiter
45:         If opiter >= MAX_ITERATIONS then
46:            error_message("Maximum iterations reached.");
47:            Return NULL;
48:      Loop Until $|V_S^{k+1} - V_{S,prev}^{k+1}| \le \epsilon_{rel,v} \cdot \max(|V_S^{k+1}|, |V_{S,prev}^{k+1}|) + \epsilon_{abs,v}$
49:         and $|i_D^{k+1} - i_{reqop,D}^{k+1}| \le \epsilon_{rel,i} \cdot \max(|i_D^{k+1}|, |i_{reqop,D}^{k+1}|) + \epsilon_{abs,i}$
50:         and $|i_G^{k+1} - i_{G,prev}^{k+1}| \le \epsilon_{rel,i} \cdot \max(|i_G^{k+1}|, |i_{G,prev}^{k+1}|) + \epsilon_{abs,i}$
51:         and $|i_B^{k+1} - i_{B,prev}^{k+1}| \le \epsilon_{rel,i} \cdot \max(|i_B^{k+1}|, |i_{B,prev}^{k+1}|) + \epsilon_{abs,i}$
52:      Call $[i_{op,D}^{k+1}, i_{op,G}^{k+1}, i_{op,S}^{k+1}, i_{op,B}^{k+1}]$ = ComputeOperatorCurrents(Type, $i_D^{k+1}$, $i_G^{k+1}$, $i_B^{k+1}$)
53:      Get $V_{th}^{k+1}$ from simulator
```

| 54: | Return [$V_S^{k+1}$, $i_{op,D}^{k+1}$, $i_{op,G}^{k+1}$, $i_{op,S}^{k+1}$, $i_{op,B}^{k+1}$, $V_{th}^{k+1}$] |
| --- | --- |
| 55: | end operator |

Line 7 to 10, the configuration BND of the transistor is checked

Line 11 to 17, when the solver is first called to solve for current time step index k+1, $V_S^{k+1}$ is initialized with previous value of time step index (k) and the source referenced voltages at previous time step index (k) are computed from the 4 terminals' voltages.

Line 18 to 19, The bulk voltage is made equal to the source voltage.

Line 20 to 22, opiter, $i_G^{k+1}$ and $i_B^{k+1}$ are set to 0

Line 23, The loop to solve $V_S^{k+1}$ at time step index k+1 is executed.

Line 24 to 27: the source referenced voltages at time step index (k+1) are computed from the 4 terminals' voltages.

Line 28 to 31: the source referenced voltages' time-derivatives at time step index (k+1) are computed using Backward-Euler formulation.

Line 32 to 33, a DC resolution of the MOS transistor is performed (either through a built-in model or by a call to a DC simulator).

Line 34, the updated drain and bulk DC currents as well as the MOS capacitances are extracted from the DC simulator resolution.

Line 35 to 36, current values of gate and bulk current are stored.

Line 37, the time varying drain terminal current $i_D^{k+1}$ is updated, based on the updated DC value of the current and the MOS capacitances.

Line 38, the time varying gate terminal current $i_G^{k+1}$ is updated, based on the updated MOS capacitances.

Line 39, the time varying bulk terminal current $i_B^{k+1}$ is updated, based on the updated DC value of the current and the MOS capacitances.

Line 40, the new DC component of the drain current ID,new is guessed from the $i_{reqop,D}^{k+1}$ required drain current at time step index k+1 and the MOS capacitances.

Line 41, Current value for $V_S^{k+1}$ at time step index k+1 is computed and stored.

Line 42, New value for $V_{GS}^{k+1}$ is estimated from the desired DC value of the drain current ID,new Line 43, New value for $V_S^{k+1}$ is estimated at time step index k+1

Line 44 opiter is incremented to count number of iterations performed.

Line 45 to 47, a test is performed on the opiter's maximum value to stop the loop.

Line 48 to 51, a convergence criteria is evaluated to stop the loop

Line 52, the terminals' input currents $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function.

Line 53, the updated value of the threshold voltage $V_{th}^{k+1}$ is extracted from the DC simulator resolution.

Line 54, $V_S^{k+1}$ voltage as well as the 4 terminals' currents and the threshold voltage at time step index k+1 are returned.

Annex 7: Operator OPVGD

The operator OPVGD is referenced in FIG. 16 with reference to the line numbers of the following pseudo code.

In Case of Configuration NBD

Pseudo code of the time-dependent OPVGD operator that computes the time-varying Gate and Drain Terminal voltages $V_G^{k+1}=V_D^{k+1}$ and threshold voltage $V_{th}^{k+1}$ and the time-varying currents $i_{op,D}^{k+1}$, $i_{op,B}^{k+1}$, $i_{op,G}^{k+1}$, $i_{op,S}^{k+1}$ flowing into the 4 transistor's terminals at current time step index k+1, assuming that the temperature, the transistor's sizes (width and length), the 2 terminal voltages $V_S^{k+1}$, $V_B^{k+1}$ at current time step index k+1 and $V_S^k$, $V_B^k$ and $V_G^k$ at previous time step index k as well as the requested current $i_{reqop,D}^{k+1}$ at time step index k+1 are known, when the Source and the Bulk terminals are in unconnected configuration (NBD), with the same code applying for the NMOS and PMOS transistors:

| 1: | Operator | OPVGD |
| --- | --- | --- |
| 2: | Inputs | Type, SolverIter, TimeStep, k |
| 3: | | Temp, W, L, $V_S^{k+1}$, $V_B^{k+1}$, $V_S^k$, $V_B^k$, $V_G^k$, $i_{reqop,D}^{k+1}$ |
| 4: | Outputs | $V_G^{k+1}$, $V_D^{k+1}$, $i_{op,D}^{k+1}$, $i_{op,G}^{k+1}$, $i_{op,S}^{k+1}$, $i_{op,B}^{k+1}$, $V_{th}^{k+1}$ |
| 5: | Implements | |
| 6: | /* Check transistor type */ | |
| 7: | If Type is bulk-source connected or is not diode connected then | |
| 8: |   error_message("Cannot handle this transistor type"); | |
| 9: |   Return NULL ; | |
| 10: | /* Check initial conditions */ | |
| 11: | If $V_G^k \neq V_D^k$ then | |
| 12: |   error_message("Incorrect initial conditions"); | |
| 13: |   Return NULL; | |
| 14: | If SolverIter == 0 then | |
| 15: |   /* Initialize gate/drain voltage at time k+1 */ | |
| 16: |   Let $V_G^{k+1} = V_D^{k+1} = V_G^k$ | |
| 17: |   /* Compute source referenced voltages at previous time k */ | |
| 18: |   Let $V_{DS}^k = V_{GS}^k = V_G^k - V_S^k$ | |
| 19: |   Let $V_{BS}^k = V_B^k - V_S^k$ | |
| 20: | Let opiter = 0 | |
| 21: | Let $i_G^{k+1} = 0$ | |
| 22: | Let $i_B^{k+1} = 0$ | |
| 23: | Do | |
| 24: |   /* Compute source referenced voltages at current time k+1 */ | |
| 25: |   Let $V_{DS}^{k+1} = V_D^{k+1} - V_S^{k+1}$ | |
| 26: |   Let $V_{GS}^{k+1} = V_G^{k+1} - V_S^{k+1}$ | |
| 27: |   Let $V_{BS}^{k+1} = V_B^{k+1} - V_S^{k+1}$ |

```
28:     /* Verify initial conditions */
29:     If V_DS^{k+1} ≠ V_GS^{k+1} then
30:         error_message("Incorrect electrical conditions");
31:         Return NULL;
32:     /* Compute time-derivatives at current time k+1 using Backward Euler Formula */
```

33:
$$\text{Let } \frac{dV_{DS}^{k+1}}{dt} = \frac{V_{DS}^{k+1} - V_{DS}^{k}}{\text{TimeStep}}$$

34:
$$\text{Let } \frac{dV_{GS}^{k+1}}{dt} = \frac{V_{GS}^{k+1} - V_{GS}^{k}}{\text{TimeStep}}$$

35:
$$\text{Let } \frac{dV_{BS}^{k+1}}{dt} = \frac{V_{BS}^{k+1} - V_{BS}^{k}}{\text{TimeStep}}$$

```
36:     Set Temp, W, L, V_DS^{k+1}, V_GS^{k+1}, V_BS^{k+1} in simulator
37:     Do a single DC simulation
38:     Extract I_D^{k+1}, I_B^{k+1}, C_DG^{k+1}, C_DD^{k+1}, C_DB^{k+1},
            C_GG^{k+1}, C_GD^{k+1}, C_GB^{k+1}, C_BG^{k+1}, C_BD^{k+1}, C_BB^{k+1}
39:     Let i_{G,prev}^{k+1} = i_G^{k+1}
40:     Let i_{B,prev}^{k+1} = i_B^{k+1}
41:     Compute transient gate terminal current i_G^{k+1} using
```

$$i_G^{k+1} = C_{GG}^{k+1} \cdot \frac{dV_{GS}^{k+1}}{dt} - C_{GD}^{k+1} \cdot \frac{dV_{DS}^{k+1}}{dt} - C_{GB}^{k+1} \cdot \frac{dV_{BS}^{k+1}}{dt}$$

```
42:     Compute requested transient transistor drain terminal current i_{reqtr,D}^{k+1} using
            i_{reqtr,D}^{k+1} = i_{reqop,D}^{k+1} - i_G^{k+1}
43:     Compute transient drain terminal current i_D^{k+1} using
```

$$i_D^{k+1} = I_D^{k+1} - C_{DG}^{k+1} \cdot \frac{dV_{GS}^{k+1}}{dt} + C_{DD}^{k+1} \cdot \frac{dV_{DS}^{k+1}}{dt} - C_{DB}^{k+1} \cdot \frac{dV_{BS}^{k+1}}{dt}$$

```
44:     Compute transient bulk terminal i_B^{k+1} using
```

$$i_B^{k+1} = I_B^{k+1} - C_{BG}^{k+1} \cdot \frac{dV_{GS}^{k+1}}{dt} - C_{BD}^{k+1} \cdot \frac{dV_{DS}^{k+1}}{dt} + C_{BB}^{k+1} \cdot \frac{dV_{BS}^{k+1}}{dt}$$

```
45:     Compute new DC component I_{D,new} from i_{reqtr,D}^{k+1} using
```

$$I_{D,new} = i_{reqtr,D}^{k+1} + C_{DG}^{k+1} \cdot \frac{dV_{GS}^{k+1}}{dt} - C_{DD}^{k+1} \cdot \frac{dV_{DS}^{k+1}}{dt} + C_{DB}^{k+1} \cdot \frac{dV_{BS}^{k+1}}{dt}$$

```
46:     Let V_{D,prev}^{k+1} = V_{G,prev}^{k+1} = V_S^{k+1} + V_{GS}^{k+1}
47:     Solve for V_GS^{k+1} using I_{D,desired} = I_{D,new} in equation 3.1.
48:     Let V_D^{k+1} = V_GS^{k+1} = V_S^{k+1} + V_{GS}^{k+1}
49:     Increment opiter
50:     If opiter >= MAX_ITERATIONS then
51:         error_message("Maximum iterations reached.");
52:         Return NULL;
53:     Loop Until | V_G^{k+1} - V_{G,prev}^{k+1} | ≤ ε_{rel,v} · max(| V_G^{k+1} |, | V_{G,prev}^{k+1} |) + ε_{abs,v}
54:         and | i_D^{k+1} - i_{reqtr,D}^{k+1} | ≤ ε_{rel,i} · max(| i_D^{k+1} |, | i_{reqtr,D}^{k+1} |) + ε_{abs,i}
55:         and | i_G^{k+1} - i_{G,prev}^{k+1} | ≤ ε_{rel,i} · max(| i_G^{k+1} |, | i_{G,prev}^{k+1} |) + ε_{abs,i}
56:         and | i_B^{k+1} - i_{B,prev}^{k+1} | ≤ ε_{rel,i} · max(| i_B^{k+1} |, | i_{B,prev}^{k+1} |) + ε_{abs,i}
57:     Call [i_{op,D}^{k+1}, i_{op,G}^{k+1}, i_{op,S}^{k+1}, i_{op,B}^{k+1}] = ComputeOperatorCurrents(Type, i_D^{k+1}, i_G^{k+1}, i_B^{k+1})
58:     Get V_th^{k+1} from simulator
59:     Return [V_G^{k+1}, V_D^{k+1}, i_{op,D}^{k+1}, i_{op,G}^{k+1}, i_{op,S}^{k+1}, i_{op,B}^{k+1}, V_th^{k+1}]
60: end operator
```

Line 6 to 9, the configuration NBD of the transistor is checked.

Line 10 to 13, check if the initial conditions for the diode connected transistor or correct.

Line 14 to 19, when the solver is first called to solve for current time step index k+1, $V_G^{k+1}$ and $V_D^{k+1}$ are initialized with previous value of time step index k and the source referenced voltages at previous time step index (k) are computed from the 4 terminals' voltages.

Line 20 to 22, opiter $i_G^{k+1}$ and $i_B^{k+1}$ are set to 0

Line 23, The loop to solve $V_G^{k+1}$ and $V_D^{k+1}$ at time step index k+1 is executed.

Line 24 to 27: the source referenced voltages at time step index (k+1) are computed from the 4 terminals' voltages.

Line 28 to 31: check if is not equal to $V_{DS}^{k+1}$, in this case return an error.

Line 32 to 35: the source referenced voltages' time-derivatives at time step index (k+1) are computed using Backward-Euler formulation.

Line 36 to 37, a DC resolution of the MOS transistor is performed (either through a built-in model or by a call to a DC simulator).

Line 38, the updated drain and bulk DC currents as well as the MOS capacitances are extracted from the DC resolution.

Line 39 to 40, current values of gate and bulk current are stored.

Line 41, the time varying gate terminal current $i_G^{k+1}$ is updated, based on the updated MOS capacitances.

Line 42, the actual required time varying transient drain terminal current $i_{reqtr,D}^{k+1}$ of the transistor is computed.

Line 43, the time varying drain terminal $i_D^{k+1}$ is updated, based on the updated DC value of the current and the MOS capacitances.

Line 44, the time varying bulk terminal current $i_B^{k+1}$ is updated, based on the updated DC value of the current and the MOS capacitances.

Line 45, the new DC component of the drain current $I_{D,new}$ is guessed from the $i_{reqtr,D}^{k+1}$ actual required drain current at time step index k+1 and the MOS capacitances.

Line 46, Current value for $V_G^{k+1}$ and $V_D^{k+1}$ at time step index k+1 are computed and stored.

Line 47, New value for $V_{GS}^{k+1}$ is estimated from the desired DC value of the drain current $I_{D,new}$ (see equation 3.1)

Line 48, New value for $V_G^{k+1}$ and $V_D^{k+1}$ are estimated at time step index k+1

Line 49 opiter is incremented to count number of iterations performed.

Line 50 to 52, a test is performed on the opiter's maximum value to stop the loop.

Line 53 to 56, a convergence criteria is evaluated to stop the loop

Line 57, the terminals' input currents $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function.

Line 58, the updated value of the threshold voltage $V_{th}^{k+1}$ is extracted from the DC resolution.

Line 59, $V_G^{k+1}$ and $V_D^{k+1}$ voltages as well as the 4 terminals' currents and the threshold voltage at time step index k+1 are returned.

In Case of Configuration BD

The pseudo code of the time-dependent OPVGD operator that computes the time-varying Gate/Drain Terminal voltage $V_G^{k+1}=V_D^{k+1}$, the threshold voltage $V_{th}^{k+1}$ at current time step index k+1 and the time-varying currents $i_{op,D}^{k+1}$, $i_{op,G}^{k+1}$, $i_{op,S}^{k+1}$ flowing into the 4 transistor's terminals at current time step index k+1, assuming that the temperature, the transistor's sizes (width and length), the terminal voltage $V_S^{k+1}$ at current time step index k+1, $V_S^k$ and $V_G^k$ at previous time step index k as well as the requested current $i_{reqop,D}^{k+1}$ at time step index k+1 are known, when the Source and the Bulk terminals are in connected configuration (BD), with the same code applying for the NMOS and PMOS transistors:

```
 1:  Operator  OPVGD
 2:  Inputs    Type, SolverIter, TimeStep, k, Temp, W, L, V_S^{k+1}, V_S^k, V_G^k, i_{reqop,D}^{k+1}
 3:  Outputs   V_G^{k+1}, V_D^{k+1}, i_{op,D}^{k+1}, i_{op,G}^{k+1}, i_{op,S}^{k+1}, i_{op,B}^{k+1}, V_{th}^{k+1}
 4:  Implements
 5:    /* Check transistor type */
 6:    If Type is bulk/source disconnected or is not diode connected then
 7:       error_message("Cannot handle this transistor type");
 8:       Return NULL ;
 9:    /* Check initial conditions */
10:    If V_G^k ≠ V_D^k then
11:       error_message("Incorrect initial conditions");
12:       Return NULL;
13:    If SolverIter == 0 then
14:       /* Initialize gate / drain voltage at time k+1 */
15:       Let V_G^{k+1} = V_D^{k+1} = V_G^k
16:    /* Compute source referenced voltages at previous time k */
17:    Let V_DS^k = V_GS^k = V_G^k − V_S^k
18:    Let V_BS^k = 0.0
19:    /* Transistor Bulk-Source Connected */
20:    Let V_B^{k+1} = V_S^{k+1}
21:    Let opiter = 0
22:    Let i_G^{k+1} = 0
23:    Let i_B^{k+1} = 0
24:    Do
25:       /* Compute source referenced voltages at current time k+1 */
26:       Let V_DS^{k+1} = V_D^{k+1} − V_S^{k+1}
27:       Let V_GS^{k+1} = V_G^{k+1} − V_S^{k+1}
28:       Let V_BS^{k+1} = 0.0
29:       /* Verify initial conditions */
30:       If V_DS^{k+1} ≠ V_GS^{k+1} then
31:          error_message("Incorrect electrical conditions");
32:          Return NULL;
33:       /* Compute time-derivatives at current time k+1 using Backward Euler Formula */
```

34: $\quad\text{Let } \dfrac{dV_{DS}^{k+1}}{dt} = \dfrac{V_{DS}^{k+1} - V_{DS}^k}{\text{TimeStep}}$ 35: $\quad\text{Let } \dfrac{dV_{GS}^{k+1}}{dt} = \dfrac{V_{GS}^{k+1} - V_{GS}^k}{\text{TimeStep}}$ 36: $\quad\text{Let } \dfrac{dV_{BS}^{k+1}}{dt} = 0.0$

```
37:    Set Temp, W, L, V_DS^{k+1}, V_GS^{k+1}, V_BS^{k+1} in simulator
38:    Do a single DC simulation
```

-continued

39: Extract $I_D^{k+1}, I_B^{k+1}, C_{DG}^{k+1}, C_{DD}^{k+1}, C_{DB}^{k+1},$
    $C_{GG}^{k+1}, C_{GD}^{k+1}, C_{GB}^{k+1}, C_{BG}^{k+1}, C_{BD}^{k+1}, C_{BB}^{k+1}$
40: Let $i_{G,prev}^{k+1} = i_G^{k+1}$
41: Let $i_{B,prev}^{k+1} = i_B^{k+1}$
42: Compute transient gate terminal current $i_G^{k+1}$ using $$i_G^{k+1} = C_{GG}^{k+1} \cdot \frac{dV_{GS}^{k+1}}{dt} - C_{GD}^{k+1} \cdot \frac{dV_{DS}^{k+1}}{dt} - C_{GB}^{k+1} \cdot \frac{dV_{BS}^{k+1}}{dt}$$

43: Compute requested transient transistor drain terminal current $i_{reqtr,D}^{k+1}$ using
    $i_{reqtr,D}^{k+1} = i_{reqop,D}^{k+1} - i_G^{k+1}$
44: Compute transient drain terminal current $i_D^{k+1}$ using $$i_D^{k+1} = I_D^{k+1} - C_{DG}^{k+1} \cdot \frac{dV_{GS}^{k+1}}{dt} + C_{DD}^{k+1} \cdot \frac{dV_{DS}^{k+1}}{dt} - C_{DB}^{k+1} \cdot \frac{dV_{BS}^{k+1}}{dt}$$

45: Compute transient bulk terminal $i_B^{k+1}$ using $$i_B^{k+1} = I_B^{k+1} - C_{BG}^{k+1} \cdot \frac{dV_{GS}^{k+1}}{dt} - C_{BD}^{k+1} \cdot \frac{dV_{DS}^{k+1}}{dt} + C_{BB}^{k+1} \cdot \frac{dV_{BS}^{k+1}}{dt}$$

46: Compute new DC component $I_{D,new}$ from $i_{reqtr,D}^{k+1}$ using $$I_{D,new} = i_{reqtr,D}^{k+1} + C_{DG}^{k+1} \cdot \frac{dV_{GS}^{k+1}}{dt} - C_{DD}^{k+1} \cdot \frac{dV_{DS}^{k+1}}{dt} + C_{DB}^{k+1} \cdot \frac{dV_{BS}^{k+1}}{dt}$$

47: Let $V_{D,prev}^{k+1} = V_{G,prev}^{k+1} = V_S^{k+1} + V_{GS}^{k+1}$
48: Solve for $V_{GS}^{k+1}$ using $I_{D,desired} = I_{D,new}$ in equation 3.1.
49: Let $V_D^{k+1} = V_{GS}^{k+1} = V_S^{k+1} + V_{GS}^{k+1}$
50: Increment opiter
51: If opiter >= MAX_ITERATIONS then
52:     error_message("Maximum iterations reached.");
53:     Return NULL;
54: Loop Until $| V_G^{k+1} - V_{G,prev}^{k+1} | \leq \epsilon_{rel,v} \cdot \max(| V_G^{k+1} |, | V_{G,prev}^{k+1} |) + \epsilon_{abs,v}$
55:     and $| i_D^{k+1} - i_{reqtr,D}^{k+1} | \leq \epsilon_{rel,i} \cdot \max(| i_D^{k+1} |, | i_{reqtr,D}^{k+1} |) + \epsilon_{abs,i}$
56:     and $| i_G^{k+1} - i_{G,prev}^{k+1} | \leq \epsilon_{rel,i} \cdot \max(| i_G^{k+1} |, | i_{G,prev}^{k} |) + \epsilon_{abs,i}$
57:     and $| i_B^{k+1} - i_{B,prev}^{k+1} | \leq \epsilon_{rel,i} \cdot \max(| i_B^{k+1} |, | i_{B,prev}^{k+1} |) + \epsilon_{abs,i}$
58: Call $[i_{op,D}^{k+1}, i_{op,G}^{k+1}, i_{op,S}^{k+1}, i_{op,B}^{k+1}] = $ ComputeOperatorCurrents(Type, $i_D^{k+1}, i_G^{k+1}, i_B^{k+1}$)
59: Get $V_{th}^{k+1}$ from simulator
60: Return $[V_G^{k+1}, V_D^{k+1}, i_{op,D}^{k+1}, i_{op,G}^{k+1}, i_{op,S}^{k+1}, i_{op,B}^{k+1}, V_{th}^{k+1}]$
61: end operator Line 5 to 8, the configuration BD of the transistor is checked.

Line 9 to 12, check if the initial conditions for the diode connected transistor are correct.

Line 13 to 18, when the solver is first called to solve for current time step index k+1, $V_G^{k+1}$ and $V_D^{k+1}$ are initialized with previous value of time step index k and the source referenced voltages at previous time step index (k) are computed from the 4 terminals' voltages.

Line 19 to 20, set bulk voltage equal to source voltage at time step index k+1.

Line 21 to 23, opiter, $i_G^{k+1}$ and $i_B^{k+1}$ are set to 0

Line 24, The loop to solve and at time step index k+1 is executed.

Line 25 to 28: the source referenced voltages at time step index (k+1) are computed from the 4 terminals' voltages.

Line 29 to 32: check if $V_{GS}^{k+1}$ is not equal to $V_{DS}^{k+1}$, in this case return an error.

Line 33 to 36: the source referenced voltages' time-derivatives at time step index (k+1) are computed using Backward-Euler formulation.

Line 37 to 38, a DC resolution of the MOS transistor is performed (either through a built-in model or by a call to a DC simulator).

Line 39, the updated drain and bulk DC currents as well as the MOS capacitances are extracted from the DC resolution.

Line 40 to 41, current values of gate and bulk current are stored.

Line 42, the time varying gate terminal $i_G^{k+1}$ is updated, based on the updated MOS capacitances.

Line 43, the actual required time varying transient drain terminal current $i_{reqtr,D}^{k+1}$ of the transistor is computed.

Line 44, the time varying drain terminal current $i_D^{k+1}$ is updated, based on the updated DC value of the current and the MOS capacitances.

Line 45, the time varying bulk terminal current $i_B^{k+1}$ is updated, based on the updated DC value of the current and the MOS capacitances.

Line 46, the new DC component of the drain current $I_{D,new}$ is guessed from the $i_{reqtr,D}^{k+1}$ actual required drain current at time step index k+1 and the MOS capacitances.

Line 47, Current value for $V_G^{k+1}$ and $V_D^{k+1}$ at time step index k+1 are computed and stored.

Line 48, New value for $V_{GS}^{k+1}$ is estimated from the desired DC value of the drain current $I_{D,new}$ (see equation 3.1)

Line 49, New value and D are estimated at time step index k+1

Line 50 opiter is incremented to count number of iterations performed.

Line 51 to 53, a test is performed on the opiter's maximum value to stop the loop.

Line 54 to 57, a convergence criteria is evaluated to stop the loop

Line 58, the terminals' input $i_{op,D}^{k+1}$, $i_{op,G}^{k+1}$, $i_{op,S}^{k+1}$, $i_{op,B}^{k+1}$ are computed from the $i_D^{k+1}$, $i_G^{k+1}$ and $i_B^{k+1}$ currents using the COP function Line 59, the updated value of the threshold voltage $V_{th}^{k+1}$ is extracted from the DC resolution.

Line 60, $V_G^{k+1}$ and $V_D^{k+1}$ voltages as well as the 4 terminals' currents and the threshold voltage at time step index k+1 are returned.

The invention claimed is:

1. A method for providing automated assistance for designing an analog non-linear circuit which is intended to work under transient conditions, the method comprising:
    simulating a performance behavior of the circuit by performing at least one operation of digital processing, called "transient instant solving procedure," which performs a numerical simulation using a given set of sizes and biases for at least one transistor of the circuit, so as to provide a set of local behavior parameters for at least one node of the circuit at the current time,
    said transient instant solving procedure comprising a plurality of iterations, unto a positive result from a convergence test, of executing an evaluation, when under transient conditions, of a graph representing an analysis view of the circuit, called "transient analysis view graph evaluation," said transient analysis view graph evaluation comprising the following steps:
    executing a sequential evaluation of a set of data, called "rule data", said evaluation providing a set of local behavior parameters for at least one node of the circuit, where said rule data represents a set of rules that comprise:
        dependencies between variables representing electrical properties of one or several nodes or physical properties of one or several transistors of the circuit; and
        mathematical operators, called temporal operators, that rule said dependencies when said one or several transistors are working under transient conditions, said temporal operators being obtained through executing an inversion of a functional model of a transistor;
    applying a set of Newton Raphson Constraints to said sequential evaluation; and
    applying the results from the simulation of the performance behavior of the circuit to the design of the circuit.

2. The method according to claim 1, wherein said method realizes a process, called "transient analysis", which performs a numerical simulation that uses as an input a given set of sizes and biases for at least one transistor of said circuit and provides as an output a time dependent behavior simulation, and optionally a time dependant performance evaluation, for at least one node of said circuit over a given time duration and for a given stimuli profile that represents a plurality of external electrical stimuli to be applied to said circuit at different time steps,
    said transient analysis comprising a plurality of iterations, with an incrementation of a time-step data and unto a positive result from an end-of-simulation test for said time duration, of the following steps:
    executing said transient instant solving procedure with said set of sizes and biases so as to provide a set of local behavior parameters at a time instant for at least one node of said circuit in a transient state,
    applying an external electrical stimuli for next time instant to said circuit, according to said stimuli profile.

3. The method according to claim 2, wherein said method realizes a circuit transient solver through using a set of design parameters so as to provide in an automated way a given set of sizes and biases for at least one transistor of said circuit together with a time dependant performance evaluation for at least one node of said circuit over a given time duration and for a given stimuli profile, said circuit transient solver comprising the following steps:
    executing at least one operation of digital processing that performs a direct current solver for said circuit, starting with input data representing said set of requested design parameters for said circuit, said direct current solver operation comprising the steps of:
    executing a sequential evaluation, called evaluation of design view under DC conditions, of a set of data, called rule data, that represents a dependency graph of a functional structure of said circuit, where said rule data represents
    on the first hand, dependencies between variables representing electrical properties of one or several nodes or physical properties of one or several transistors of said circuit, and
    on the other hand mathematical operators, called DC operators, that rule said dependencies when said one or several transistors are working under direct current conditions, said DC operators being obtained through executing an inversion of a transistor functional model to provide a set of sizes and biases for at least one transistor of said circuit; and
    executing an operation, called DC solving procedure, comprising a plurality of iterations unto a positive result from a convergence test, of executing, of an evaluation under direct current conditions of a graph representing an analysis view of said circuit, said evaluation being made when, called "analysis view graph evaluation under DC conditions", said evaluation thus producing a numerical simulation that provides a set of local behavior parameters for at least one node of said circuit, said analysis view graph DC evaluation comprising the following steps:
    executing a sequential evaluation of said rule data, comprising said dependencies ruled by said DC operators, and
    applying a set of Newton Raphson Constraints to said sequential evaluation;
    using said set of sizes and biases and said local behavior parameters as initial conditions as input for applying said transient analysis to at least one transistor of said circuit, thus producing a time dependent behavior simulation and a time dependent performance evaluation for said set of sizes and biases parameters.

4. The method according to claim 3, wherein said method realizes a transient circuit optimizer over a given time duration and for a given stimuli profile, through using a set of requested performance parameters to provide in an automated way an optimized set of design parameters and/or sizes and biases parameters for at least one transistor of said circuit,
    said method comprising a plurality of iterations, unto a positive result from a performance optimization convergence test, of executing the following steps:
    executing at least one operation of digital processing realizing for said circuit a transient solver through using a set of design parameters and/or set of sizes and biases or at least one transistor of said circuit, so as to provide a time dependant performance evaluation for at least one node of said circuit over a given time duration and for a given stimuli profile; and using said time dependant performance evaluation to loop back toward said transient circuit solver, through an operation of digital processing realizing an adjustment of said design parameters and/or sizes and biases parameters.

5. The method according to claim 1, wherein the step of evaluating the dependency graph comprises computing an operator, called Intensity temporal operator, for returning computed voltages and Operator Currents at a new time step, called current time-step index, for at least one transistor, through executing the following steps:

computing terminals voltages for Drain-Source, Gain-Source and Bulk-Source at the previous time-step index and current time-step index time-step, and computing derivative values of said terminal voltages for the current time-step index;

executing a direct current simulation based on the terminals voltages values at the previous time-step index for extracting small signals for the current time-step index;

computing transient currents from said extracted small-signals, computing operator currents according to the transistor type and connection; and computing threshold voltage at the current time-step index.

6. The method according to claim 1, wherein the step of evaluating the dependency graph comprises computing an operator, called Gate Voltage temporal operator, for returning computed Gate Voltage, Operator Currents and Threshold Voltage at a new time step, called current time-step index, for at least one transistor, through executing the following steps:

resetting of transient Gate Current and Bulk transient Current at current time-step index;

executing a plurality of iterations with an incrementation of a variable, called operator index, unto a positive result from a convergence test of Gate Voltage, Drain Current, Gate Current and Bulk Current, of executing the following substeps:

computing terminals voltages for Drain-Source, Gain-Source and Bulk-Source at the current time-step, and computing derivative values of said terminal voltages for said current time-step index;

executing a direct current simulation based on the terminals conditions at the current time-step index for extracting small signals for said current time-step;

using said extracted small signals to compute terminals transient currents at operator index step for the current time-step index;

according to a requested instantaneous Drain Current, using extracted small signals to compute DC Drain Current at operator index step for the current time-step index;

according to a desired DC Drain Current, applying a numerical solving to a differential equation for Drain current at current time-step index in order to compute a Gate-Source voltage and subsequently said Gate Voltage at operator index step;

computing Operator Currents at current time-step index according to the transistor type; and computing Threshold Voltage at current time-step index.

7. The method according to claim 1, wherein the step of evaluating the dependency graph comprises computing an operator, called Source Voltage temporal operator, for returning a computed Source Voltage, Operator Currents and Threshold Voltage at a new time step, called current time-step index, for at least one transistor, through executing the following steps:

resetting of transient Gate Current and Bulk transient Current at current time-step index;

executing a plurality of iterations with an incrementation of a variable, called operator index, unto a positive result from a convergence test of Source Voltage, Drain Current, Gate Current and Bulk Current, of executing the following substeps:

computing terminals voltages for Drain-Source, Gain-Source and Bulk-Source at the current time-step index, and computing derivative values of said terminal voltages for said current time-step;

executing a direct current simulation based on the terminals conditions at the current time-step index for extracting small signals for said current time-step;

using said extracted small signals to compute terminals transient currents at operator index step for the current time-step index;

according to a requested instantaneous Drain Current, using extracted small signals to compute DC Drain Current at operator index step for the current time-step;

according to a requested desired DC Drain Current, applying a numerical solving to a differential equation for Drain current at current time-step index in order to compute a Gate-Source voltage and subsequently said Source Voltage at index step;

computing Operator Currents at current time-step index according to the transistor type;

computing Threshold Voltage at current time-step index.

8. The method according to claim 1, wherein the step of evaluating the dependency graph comprises computing an operator, called Gate/Drain Voltage temporal operator, for returning computed Gate/Drain Voltage, Operator Currents and Threshold Voltage at a new time step, called current time-step index, for at least one transistor, through executing the following steps:

resetting of transient Gate Current and Bulk transient Current at current time-step index;

executing a plurality of iterations with an incrementation of a variable, called operator index, unto a positive result from a convergence test of Gate Voltage, Drain Current, Gate Current and Bulk Current, of executing the following substeps:

computing terminals voltages for Drain-Source, Gain-Source and Bulk-Source at the current time-step index, and computing derivative values of said terminal voltages for said current time-step;

executing a direct current simulation based on the terminals conditions at the current time-step index for extracting small signals for said current time-step, using said extracted small signals compute terminals transient currents at operator index step for the current time-step index;

computing actual requested Drain current from requested operator Drain current and Gate current;

according to a requested instantaneous Drain Current, using extracted small signals to compute DC Drain Current at operator index step for the current time-step index;

according to a desired DC Drain Current, applying a numerical solving to a differential equation for Drain current at current time-step index in order to compute a Gate-Source voltage and subsequently said Gate Voltage at index step;

computing Operator Currents at current time-step index according to the transistor type; and computing Threshold Voltage at current time-step index.

9. The method according to claim 1, wherein the computed transistor is of MOS technology.

10. A non-transitory computer readable storage medium recorded with a set of instructions designed for implementing a method according to claim 1 when executed on a computer.

11. A system programmed for executing a program implementing a method according to claim 1.

* * * * *